US012610684B2

(12) United States Patent
Kishino et al.

(10) Patent No.: US 12,610,684 B2
(45) Date of Patent: Apr. 21, 2026

(54) ORGANIC ELECTROLUMINESCENCE ELEMENT, ELECTRONIC APPARATUS, AND PRODUCTION METHOD FOR ORGANIC ELECTROLUMINESCENCE ELEMENT

(71) Applicant: IDEMITSU KOSAN CO., LTD., Tokyo (JP)

(72) Inventors: Kengo Kishino, Tokyo (JP); Satomi Tasaki, Tokyo (JP); Kazuki Nishimura, Tokyo (JP); Yoshiaki Takahashi, Tokyo (JP)

(73) Assignee: IDEMITSU KOSAN CO., LTD., Tokyo (JP)

(*) Notice: Subject to any disclaimer, the term of this patent is extended or adjusted under 35 U.S.C. 154(b) by 384 days.

(21) Appl. No.: 18/281,298

(22) PCT Filed: Mar. 9, 2022

(86) PCT No.: PCT/JP2022/010266
§ 371 (c)(1),
(2) Date: Sep. 10, 2023

(87) PCT Pub. No.: WO2022/191234
PCT Pub. Date: Sep. 15, 2022

(65) Prior Publication Data
US 2024/0244856 A1 Jul. 18, 2024

(30) Foreign Application Priority Data

Mar. 11, 2021 (JP) ................................ 2021-038971
Mar. 11, 2021 (JP) ................................ 2021-039399

(51) Int. Cl.
*H10K 50/11* (2023.01)
*C09K 11/06* (2006.01)
(Continued)

(52) U.S. Cl.
CPC .............. *H10K 50/11* (2023.02); *C09K 11/06* (2013.01); *H10K 50/00* (2023.02); *H10K 85/342* (2023.02);
(Continued)

(58) Field of Classification Search
CPC .... H10K 50/11; H10K 85/633; H10K 85/658; H10K 85/342; H10K 85/6574;
(Continued)

(56) References Cited

U.S. PATENT DOCUMENTS

2011/0108810 A1 5/2011 Kishino
2012/0119197 A1* 5/2012 Nishimura ........... H05B 33/145 257/E51.026
(Continued)

FOREIGN PATENT DOCUMENTS

JP 2009-016478 A 1/2009
JP 2011-103189 A 5/2011
(Continued)

OTHER PUBLICATIONS

PCT International Report on Patentability, dated Sep. 12, 2023, issued in connection with International Patent Application No. PCT/JP2022/010266.
(Continued)

*Primary Examiner* — Robert J Michaud
(74) *Attorney, Agent, or Firm* — Foley & Lardner LLP

(57) ABSTRACT

An organic EL device includes an anode, a cathode, and an emitting layer disposed between the anode and the cathode, in which the emitting layer includes a first emitting layer and a second emitting layer, the first emitting layer contains a first host material and a first luminescent compound, the second emitting layer contains a second host material and a second luminescent compound, the first host material and
(Continued)

the second host material are mutually different, the first luminescent compound and the second luminescent compound are mutually the same or different, a triplet energy of the first host material $T_1(H1)$ and a triplet energy of the second host material $T_1(H2)$ satisfy a relationship of Numerical Formula 1, and a diffusion coefficient $D_1$ of the triplet energy of the first host material $T_1(H1)$ calculated according to a diffusion equation is $3.0\times10^{-9}$ ($cm^2/s$) or more, $$T_1(H1) > T_1(H2). \quad \text{(Numerical Formula 1)}$$

27 Claims, 11 Drawing Sheets

(51) Int. Cl.

| | |
|---|---|
| ***H10K 50/00*** | (2023.01) |
| ***H10K 85/30*** | (2023.01) |
| ***H10K 85/60*** | (2023.01) |
| *H10K 101/00* | (2023.01) |
| *H10K 101/10* | (2023.01) |
| *H10K 101/30* | (2023.01) |

(52) U.S. Cl.
CPC ......... *H10K 85/626* (2023.02); *H10K 85/633* (2023.02); *H10K 85/6574* (2023.02); *H10K 85/658* (2023.02); *C09K 2211/185* (2013.01); *H10K 2101/10* (2023.02); *H10K 2101/30* (2023.02); *H10K 2101/90* (2023.02)

(58) Field of Classification Search
CPC ............... H10K 50/00; H10K 2101/90; H10K 2101/10; H10K 2101/30; C09K 11/06; C09K 2211/185
See application file for complete search history.

(56) References Cited

U.S. PATENT DOCUMENTS

| | | | | |
|---|---|---|---|---|
| 2013/0092913 | A1 | 4/2013 | Nishimura et al. | |
| 2014/0027751 | A1 | 1/2014 | Furukawa et al. | |
| 2014/0042469 | A1 | 2/2014 | Seo et al. | |
| 2014/0103321 | A1 | 4/2014 | Furukawa et al. | |
| 2015/0280158 | A1 * | 10/2015 | Ogiwara .............. | H10K 50/131 257/40 |
| 2015/0303391 | A1 | 10/2015 | Nishimura et al. | |
| 2016/0013435 | A1 | 1/2016 | Seo et al. | |
| 2017/0141339 | A1 | 5/2017 | Seo et al. | |
| 2017/0200920 | A1 | 7/2017 | Nishimura et al. | |
| 2019/0140204 | A1 | 5/2019 | Seo et al. | |
| 2019/0280209 | A1 | 9/2019 | Fujita | |
| 2020/0194685 | A1 | 6/2020 | Kim et al. | |
| 2020/0280011 | A1 | 9/2020 | Seo et al. | |
| 2021/0288278 | A1 | 9/2021 | Seo et al. | |
| 2023/0088213 | A1 | 3/2023 | Tasaki et al. | |
| 2023/0413595 | A1 | 12/2023 | Seo et al. | |
| 2024/0365578 | A1 | 10/2024 | Seo et al. | |

FOREIGN PATENT DOCUMENTS

| | | | |
|---|---|---|---|
| JP | 2019-161218 | A | 9/2019 |
| KR | 2020-0011527 | A | 2/2020 |
| KR | 1020200073602 | A | 6/2020 |
| KR | 1020210008552 | A | 1/2021 |
| WO | WO-2011/155508 | A1 | 12/2011 |
| WO | WO-2012/137640 | A1 | 10/2012 |
| WO | WO-2012/153603 | A1 | 11/2012 |
| WO | WO-2014/087913 | A1 | 6/2014 |
| WO | WO-2021/049651 | A1 | 3/2021 |

OTHER PUBLICATIONS

International Searching Authority, "International Search Report," issued in connection with International Patent Application No. PCT/JP2022/010266, dated May 24, 2022.
International Searching Authority, "Written Opinion," issued in connection with International Patent Application No. PCT/JP2022/010266, dated May 24, 2022.
Office Action issued in corresponding Korean Patent Application No. 10-2023-7034606 dated Oct. 13, 2025.

* cited by examiner

[Table 1]

[Table 2]

ORGANIC ELECTROLUMINESCENCE ELEMENT, ELECTRONIC APPARATUS, AND PRODUCTION METHOD FOR ORGANIC ELECTROLUMINESCENCE ELEMENT

CROSS-REFERENCE TO RELATED APPLICATIONS

The present application claims priority under 35 U.S.C. § 371 to International Patent Application No. PCT/JP2022/010266, filed Mar. 9, 2022, which claims priority to and the benefit of Japanese Patent Application Nos. 2021-038971 and 2021-039399, filed on Mar. 11, 2021. The contents of these applications are hereby incorporated by reference in their entireties.

TECHNICAL FIELD

The present invention relates to an organic electroluminescence device, an electronic device and a method of producing an organic electroluminescence device.

BACKGROUND ART

An organic electroluminescence device (hereinafter, occasionally referred to as "organic EL device") has found its application in a full-color display for mobile phones, televisions, and the like. When voltage is applied to an organic EL device, holes are injected from an anode and electrons are injected from a cathode into an emitting layer. The injected holes and electrons are recombined in the emitting layer to form excitons. Specifically, according to the electron spin statistics theory, singlet excitons and triplet excitons are generated at a ratio of 25%:75%.

For instance, in Patent Literatures 1 to 3, various studies have been made on layering a plurality of emitting layers in order to enhance performance of the organic EL device. In addition, Patent Literature 1 describes a phenomenon in which a singlet exciton is generated from two triplet excitons (hereinafter, occasionally referred to as a Triplet-Triplet Fusion (TTF) phenomenon). An organic emitting device described in Patent Literature 1 includes an anode, a cathode, and a layer formed of an organic compound and sandwiched between the anode and the cathode, in which the layer formed of the organic compound includes a first emitting region formed of a first material and a second emitting region formed of the first material and a second material, and an energy gap of the second material is larger than an energy gap of the first material, and a lowest triplet energy of the second material is smaller than a lowest triplet energy of the first material.

The performance of the organic EL device is evaluable in terms of, for instance, luminance, emission wavelength, chromaticity, luminous efficiency, drive voltage, and lifetime.

CITATION LIST

Patent Literature(s)

| | |
|---|---|
| Patent Literature 1 | JP 2009-16478 A |
| Patent Literature 2 | JP 2011-103189 A |
| Patent Literature 3 | US Patent Application Publication No. 2019/280209 |

SUMMARY OF THE INVENTION

Problem(s) to be Solved by the Invention

Further improvement in performance is desired in organic EL devices in which a plurality of emitting layers are layered.

An object of the invention is to provide an organic electroluminescence device with improved performance. Another object of the invention is to provide an organic electroluminescence device with improved luminous efficiency, an electronic device including the organic electroluminescence device, and a method of producing the organic electroluminescence device.

Means for Solving the Problem(s)

According to an aspect of the invention, there is provided an organic electroluminescence device including: an anode; a cathode; and an emitting layer disposed between the anode and the cathode, in which the emitting layer includes a first emitting layer and a second emitting layer, the first emitting layer contains a first host material and a first luminescent compound, the second emitting layer contains a second host material and a second luminescent compound, the first host material and the second host material are mutually different, the first luminescent compound and the second luminescent compound are mutually the same or different, the triplet energy of the first host material $T_1(H1)$ and the triplet energy of the second host material $T_1(H2)$ satisfy a relationship of a numerical formula (Numerical Formula 1) below, and a diffusion coefficient $D_1$ of the triplet energy of the first host material $T_1(H1)$ calculated according to a diffusion equation is $3.0\times10^{-9}$ ($cm^2/s$) or more.

$$T_1(H1) > T_1(H2) \quad \text{(Numerical Formula 1)}$$

According to another aspect of the invention, there is provided an organic electroluminescence device including: an anode; a cathode; and an emitting layer disposed between the anode and the cathode, in which the emitting layer includes a first emitting layer and a second emitting layer, the first emitting layer contains a first host material and a first luminescent compound, the second emitting layer contains a second host material and a second luminescent compound, the first host material and the second host material are mutually different, the first luminescent compound and the second luminescent compound are mutually the same or different, a triplet energy of the first host material $T_1(H1)$ and a triplet energy of the second host material $T_1(H2)$ satisfy a relationship of a numerical formula (Numerical Formula 1) below, and the first host material has a surface potential $V_1$ of −11 (mV/nm) or less.

$$T_1(H1) > T_1(H2) \quad \text{(Numerical Formula 1)}$$

According to still another aspect of the invention, there is provided an electronic device including the organic electroluminescence device according to the above aspect of the invention.

According to a further aspect of the invention, there is provided a method of producing an organic electroluminescence device including an anode, a cathode, and a first emitting layer and a second emitting layer that are disposed between the anode and the cathode, the method including: forming the first emitting layer containing a first host material and a first luminescent compound; and forming the second emitting layer containing a second host material and a second luminescent compound, in which the first host material and the second host material are mutually different, the first luminescent compound and the second luminescent compound are mutually the same or different, and the first host material and the second host material used in forming the first emitting layer and the second emitting layer, respectively, are selected from materials satisfying numerical formula (Numerical Formula 1) and the numerical formula (Numerical Formula 6) below, $$T_1(H1) > T_1(H2) \quad \text{(Numerical Formula 1)}$$

$$D_1 \geq 3.0 \times 10^{-9}(\text{cm}^2/\text{s}) \quad \text{(Numerical Formula 6)}$$

where: $T_1$(H1) is a triplet energy of the first host material $T_1$(H1);

$T_1$(H2) is a triplet energy of the second host material $T_1$(H2); and $D_1$ is a diffusion coefficient of the triplet energy of the first host material $T_1$(H1) calculated according to a diffusion equation.

According to the above aspect of the invention, there is provided a method of producing an organic electroluminescence device including an anode, a cathode, and a first emitting layer and a second emitting layer that are disposed between the anode and the cathode, the method including: forming the first emitting layer containing a first host material and a first luminescent compound; and forming the second emitting layer containing a second host material and a second luminescent compound, in which the first host material and the second host material are mutually different, the first luminescent compound and the second luminescent compound are mutually the same or different, and the first host material and the second host material used in forming the first emitting layer and the second emitting layer, respectively, are selected from materials satisfying numerical formula (Numerical Formula 1) and the numerical formula (Numerical Formula 6) below, $$T_1(H1) > T_1(H2) \quad \text{(Numerical Formula 1)}$$

$$D_1 \geq 3.0 \times 10^{-9}(\text{cm}^2/\text{s}) \quad \text{(Numerical Formula 6)}$$

where: $T_1$(H1) is a triplet energy of the first host material $T_1$(H1);

$T_1$(H2) is a triplet energy of the second host material $T_1$(H2); and $D_1$ is a diffusion coefficient of the triplet energy of the first host material $T_1$(H1) calculated according to a diffusion equation.

According to the above aspect of the invention, an organic electroluminescence device with improved performance can be provided. According to the above aspect of the invention, an organic electroluminescence device with improved luminous efficiency can be provided. According to the above aspect of the invention, an electronic device including the organic electroluminescence device can be provided. According to the above aspect of the invention, a method of producing the organic electroluminescence device can be provided.

DESCRIPTION OF EMBODIMENT(S)

Definitions

Figure 1:
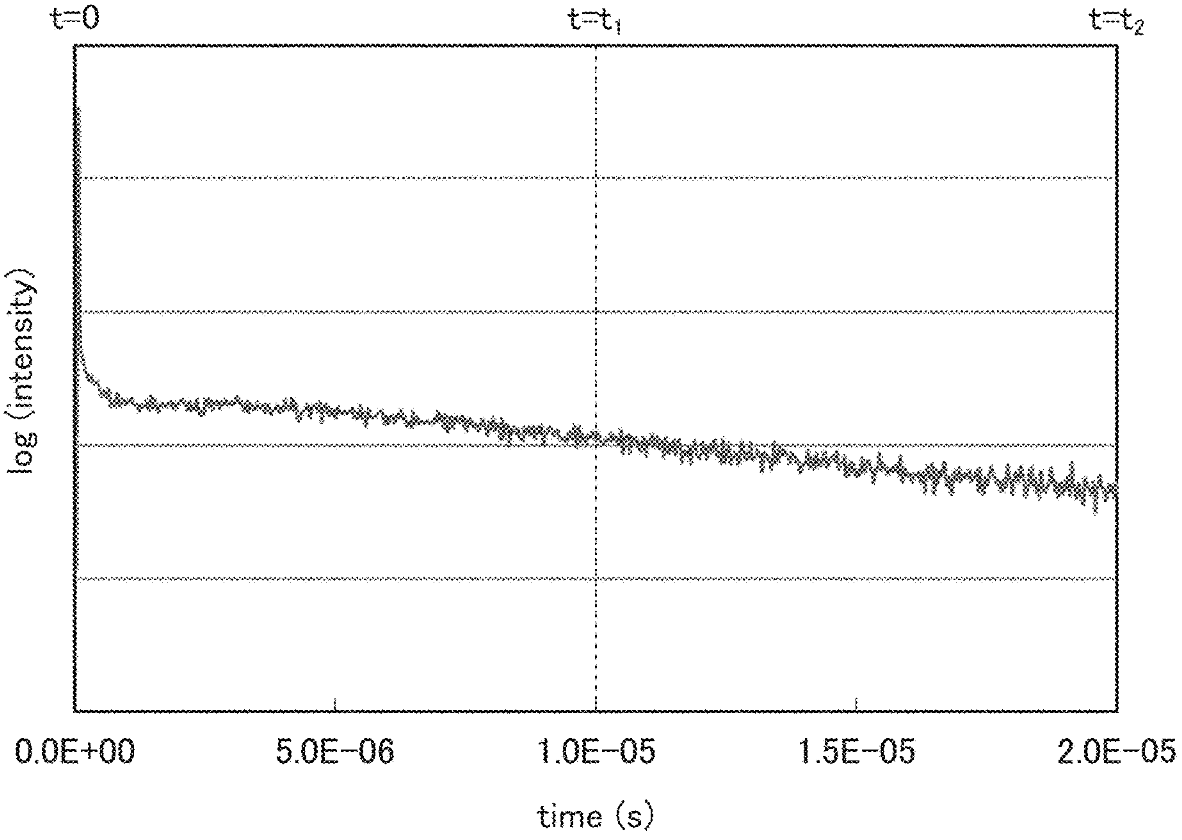
FIG. 1 illustrates a transient PL spectrum of a transient PL data measurement sample 1.

Herein, a hydrogen atom includes isotope having different numbers of neutrons, specifically, protium, deuterium and tritium.

In chemical formulae herein, it is assumed that a hydrogen atom (i.e. protium, deuterium and tritium) is bonded to each of bondable positions that are not annexed with signs "R" or the like or "D" representing a deuterium.

Herein, the ring carbon atoms refer to the number of carbon atoms among atoms forming a ring of a compound (e.g., a monocyclic compound, fused-ring compound, cross-linking compound, carbon ring compound, and heterocyclic compound) in which the atoms are bonded to each other to form the ring. When the ring is substituted by a substituent (s), carbon atom(s) contained in the substituent(s) is not counted in the ring carbon atoms. Unless otherwise specified, the same applies to the "ring carbon atoms" described later. For instance, a benzene ring has 6 ring carbon atoms, a naphthalene ring has 10 ring carbon atoms, a pyridine ring has 5 ring carbon atoms, and a furan ring has 4 ring carbon atoms. Further, for instance, 9,9-diphenylfluorenyl group has 13 ring carbon atoms and 9,9'-spirobifluorenyl group has 25 ring carbon atoms.

When a benzene ring is substituted by a substituent in a form of, for instance, an alkyl group, the number of carbon atoms of the alkyl group is not counted in the number of the ring carbon atoms of the benzene ring. Accordingly, the benzene ring substituted by an alkyl group has 6 ring carbon atoms. When a naphthalene ring is substituted by a substituent in a form of, for instance, an alkyl group, the number of carbon atoms of the alkyl group is not counted in the number of the ring carbon atoms of the naphthalene ring. Accordingly, the naphthalene ring substituted by an alkyl group has 10 ring carbon atoms.

Herein, the ring atoms refer to the number of atoms forming a ring of a compound (e.g., a monocyclic compound, fused-ring compound, cross-linking compound, carbon ring compound, and heterocyclic compound) in which the atoms are bonded to each other to form the ring (e.g., monocyclic ring, fused ring, and ring assembly). Atom(s) not forming the ring (e.g., hydrogen atom(s) for saturating the valence of the atom which forms the ring) and atom(s) in a substituent by which the ring is substituted are not counted as the ring atoms. Unless otherwise specified, the same applies to the "ring atoms" described later. For instance, a pyridine ring has 6 ring atoms, a quinazoline ring has 10 ring atoms, and a furan ring has 5 ring atoms. For instance, the number of hydrogen atom(s) bonded to a pyridine ring or the number of atoms forming a substituent is not counted as the pyridine ring atoms. Accordingly, a pyridine ring bonded to a hydrogen atom(s) or a substituent(s) has 6 ring atoms. For instance, the hydrogen atom(s) bonded to carbon atom(s) of a quinazoline ring or the atoms forming a substituent are not counted as the quinazoline ring atoms. Accordingly, a quinazoline ring bonded to hydrogen atom(s) or a substituent(s) has 10 ring atoms.

Herein, "XX to YY carbon atoms" in the description of "substituted or unsubstituted ZZ group having XX to YY carbon atoms" represent carbon atoms of an unsubstituted ZZ group and do not include carbon atoms of a substituent(s) of the substituted ZZ group. Herein, "YY" is larger than "XX," "XX" representing an integer of 1 or more and "YY" representing an integer of 2 or more.

Herein, "XX to YY atoms" in the description of "substituted or unsubstituted ZZ group having XX to YY atoms" represent atoms of an unsubstituted ZZ group and does not include atoms of a substituent(s) of the substituted ZZ group. Herein, "YY" is larger than "XX," "XX" representing an integer of 1 or more and "YY" representing an integer of 2 or more.

Herein, an unsubstituted ZZ group refers to an "unsubstituted ZZ group" in a "substituted or unsubstituted ZZ group," and a substituted ZZ group refers to a "substituted ZZ group" in a "substituted or unsubstituted ZZ group."

Herein, the term "unsubstituted" used in a "substituted or unsubstituted ZZ group" means that a hydrogen atom(s) in the ZZ group is not substituted with a substituent(s). The hydrogen atom(s) in the "unsubstituted ZZ group" is protium, deuterium, or tritium.

Herein, the term "substituted" used in a "substituted or unsubstituted ZZ group" means that at least one hydrogen atom in the ZZ group is substituted with a substituent. Similarly, the term "substituted" used in a "BB group substituted by AA group" means that at least one hydrogen atom in the BB group is substituted with the AA group.

Substituent Mentioned Herein

Substituent mentioned herein will be described below.

An "unsubstituted aryl group" mentioned herein has, unless otherwise specified herein, 6 to 50, preferably 6 to 30, more preferably 6 to 18 ring carbon atoms.

An "unsubstituted heterocyclic group" mentioned herein has, unless otherwise specified herein, 5 to 50, preferably 5 to 30, more preferably 5 to 18 ring atoms.

An "unsubstituted alkyl group" mentioned herein has, unless otherwise specified herein, 1 to 50, preferably 1 to 20, more preferably 1 to 6 carbon atoms.

An "unsubstituted alkenyl group" mentioned herein has, unless otherwise specified herein, 2 to 50, preferably 2 to 20, more preferably 2 to 6 carbon atoms.

An "unsubstituted alkynyl group" mentioned herein has, unless otherwise specified herein, 2 to 50, preferably 2 to 20, more preferably 2 to 6 carbon atoms.

An "unsubstituted cycloalkyl group" mentioned herein has, unless otherwise specified herein, 3 to 50, preferably 3 to 20, more preferably 3 to 6 ring carbon atoms.

An "unsubstituted arylene group" mentioned herein has, unless otherwise specified herein, 6 to 50, preferably 6 to 30, more preferably 6 to 18 ring carbon atoms.

An "unsubstituted divalent heterocyclic group" mentioned herein has, unless otherwise specified herein, 5 to 50, preferably 5 to 30, more preferably 5 to 18 ring atoms.

An "unsubstituted alkylene group" mentioned herein has, unless otherwise specified herein, 1 to 50, preferably 1 to 20, more preferably 1 to 6 carbon atoms.

Substituted or Unsubstituted Aryl Group

Specific examples (specific example group G1) of the "substituted or unsubstituted aryl group" mentioned herein include unsubstituted aryl groups (specific example group G1A) below and substituted aryl groups (specific example group G1B). (Herein, an unsubstituted aryl group refers to an "unsubstituted aryl group" in a "substituted or unsubstituted aryl group", and a substituted aryl group refers to a "substituted aryl group" in a "substituted or unsubstituted aryl group.") A simply termed "aryl group" herein includes both of an "unsubstituted aryl group" and a "substituted aryl group".

The "substituted aryl group" refers to a group derived by substituting at least one hydrogen atom in an "unsubstituted aryl group" with a substituent. Examples of the "substituted aryl group" include a group derived by substituting at least one hydrogen atom in the "unsubstituted aryl group" in the specific example group G1A below with a substituent, and examples of the substituted aryl group in the specific example group G1B below. It should be noted that the examples of the "unsubstituted aryl group" and the "substituted aryl group" mentioned herein are merely exemplary, and the "substituted aryl group" mentioned herein includes a group derived by further substituting a hydrogen atom bonded to a carbon atom of a skeleton of a "substituted aryl group" in the specific example group G1B below, and a group derived by further substituting a hydrogen atom of a substituent of the "substituted aryl group" in the specific example group G1B below.

Unsubstituted Aryl Group (Specific Example Group G1A):

a phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, benzanthryl group, phenanthryl group, benzophenanthryl group, phenalenyl group, pyrenyl group, chrysenyl group, benzochrysenyl group, triphenylenyl group, benzotriphenylenyl group, tetracenyl group, pentacenyl group, fluorenyl group, 9,9'-spirobifluorenyl group, benzofluorenyl group, dibenzofluorenyl group, fluoranthenyl group, benzofluoranthenyl group, perylenyl group, and monovalent aryl group derived by removing one hydrogen atom from cyclic structures represented by formulae (TEMP-1) to (TEMP-15) below.

[Formula 1]

(TEMP-1)

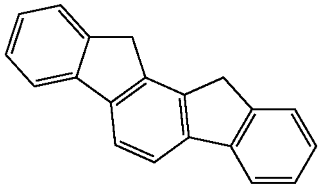

(TEMP-2)

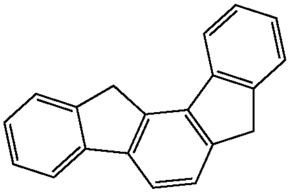

(TEMP-3)

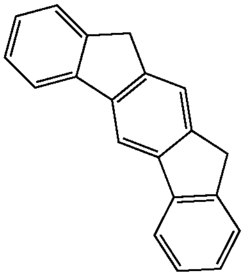

(TEMP-4)

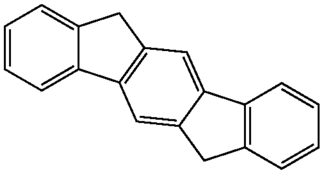

(TEMP-5)

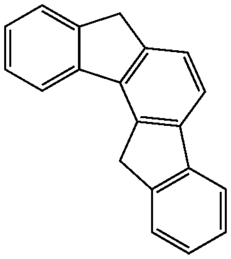

-continued (TEMP-6)

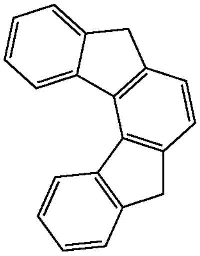

(TEMP-7)

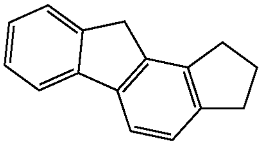

(TEMP-8)

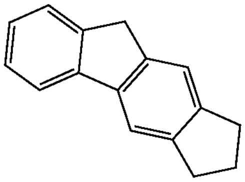

(TEMP-9)

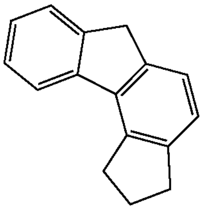

[Formula 2]

(TEMP-10)

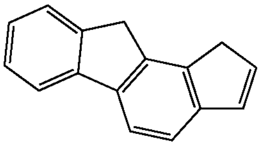

(TEMP-11)

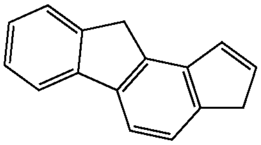

(TEMP-12)

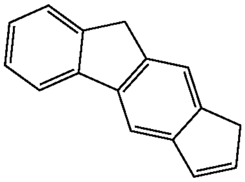

(TEMP-13)

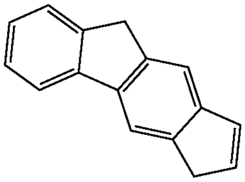

-continued (TEMP-14)

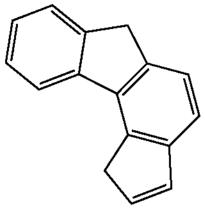

(TEMP-15)

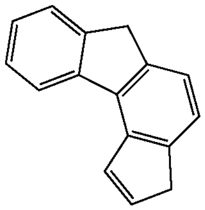

Substituted Aryl Group (Specific Example Group G1B):

an o-tolyl group, m-tolyl group, p-tolyl group, para-xylyl group, meta-xylyl group, ortho-xylyl group, para-isopropylphenyl group, meta-isopropylphenyl group, ortho-isopropylphenyl group, para-t-butylphenyl group, meta-t-butylphenyl group, ortho-t-butylphenyl group, 3,4,5-trimethylphenyl group, 9,9-dimethylfluorenyl group, 9,9-diphenylfluorenyl group, 9,9-bis(4-methylphenyl)fluorenyl group, 9,9-bis(4-isopropylphenyl)fluorenyl group, 9,9-bis(4-t-butylphenyl)fluorenyl group, cyanophenyl group, triphenylsilylphenyl group, trimethylsilylphenyl group, phenylnaphthyl group, naphthylphenyl group, and group derived by substituting at least one hydrogen atom of a monovalent group derived from one of the cyclic structures represented by the formulae (TEMP-1) to (TEMP-15) with a substituent.

Substituted or Unsubstituted Heterocyclic Group

The "heterocyclic group" mentioned herein refers to a cyclic group having at least one hetero atom in the ring atoms. Specific examples of the hetero atom include a nitrogen atom, oxygen atom, sulfur atom, silicon atom, phosphorus atom, and boron atom.

The "heterocyclic group" mentioned herein is a monocyclic group or a fused-ring group.

The "heterocyclic group" mentioned herein is an aromatic heterocyclic group or a non-aromatic heterocyclic group.

Specific examples (specific example group G2) of the "substituted or unsubstituted heterocyclic group" mentioned herein include unsubstituted heterocyclic groups (specific example group G2A) and substituted heterocyclic groups (specific example group G2B). (Herein, an unsubstituted heterocyclic group refers to an "unsubstituted heterocyclic group" in a "substituted or unsubstituted heterocyclic group," and a substituted heterocyclic group refers to a "substituted heterocyclic group" in a "substituted or unsubstituted heterocyclic group.") A simply termed "heterocyclic group" herein includes both of an "unsubstituted heterocyclic group" and a "substituted heterocyclic group."

The "substituted heterocyclic group" refers to a group derived by substituting at least one hydrogen atom in an "unsubstituted heterocyclic group" with a substituent. Specific examples of the "substituted heterocyclic group" include a group derived by substituting at least one hydrogen atom in the "unsubstituted heterocyclic group" in the specific example group G2A below with a substituent, and examples of the substituted heterocyclic group in the specific example group G2B below. It should be noted that the examples of the "unsubstituted heterocyclic group" and the "substituted heterocyclic group" mentioned herein are merely exemplary, and the "substituted heterocyclic group" mentioned herein includes a group derived by further substituting a hydrogen atom bonded to a ring atom of a skeleton of a "substituted heterocyclic group" in the specific example group G2B below, and a group derived by further substituting a hydrogen atom of a substituent of the "substituted heterocyclic group" in the specific example group G2B below.

The specific example group G2A includes, for instance, unsubstituted heterocyclic groups including a nitrogen atom (specific example group G2A1) below, unsubstituted heterocyclic groups including an oxygen atom (specific example group G2A2) below, unsubstituted heterocyclic groups including a sulfur atom (specific example group G2A3) below, and monovalent heterocyclic groups (specific example group G2A4) derived by removing a hydrogen atom from cyclic structures represented by formulae (TEMP-16) to (TEMP-33) below.

The specific example group G2B includes, for instance, substituted heterocyclic groups including a nitrogen atom (specific example group G2B1) below, substituted heterocyclic groups including an oxygen atom (specific example group G2B2) below, substituted heterocyclic groups including a sulfur atom (specific example group G2B3) below, and groups derived by substituting at least one hydrogen atom of the monovalent heterocyclic groups (specific example group G2B4) derived from the cyclic structures represented by formulae (TEMP-16) to (TEMP-33) below.

Unsubstituted Heterocyclic Groups Including Nitrogen Atom (Specific Example Group G2A1):

a pyrrolyl group, imidazolyl group, pyrazolyl group, triazolyl group, tetrazolyl group, oxazolyl group, isoxazolyl group, oxadiazolyl group, thiazolyl group, isothiazolyl group, thiadiazolyl group, pyridyl group, pyridazynyl group, pyrimidinyl group, pyrazinyl group, triazinyl group, indolyl group, isoindolyl group, indolizinyl group, quinolizinyl group, quinolyl group, isoquinolyl group, cinnolyl group, phthalazinyl group, quinazolinyl group, quinoxalinyl group, benzimidazolyl group, indazolyl group, phenanthrolinyl group, phenanthridinyl group, acridinyl group, phenazinyl group, carbazolyl group, benzocarbazolyl group, morpholino group, phenoxazinyl group, phenothiazinyl group, azacarbazolyl group, and diazacarbazolyl group.

Unsubstituted Heterocyclic Groups Including Oxygen Atom (Specific Example Group G2A2):

a furyl group, oxazolyl group, isoxazolyl group, oxadiazolyl group, xanthenyl group, benzofuranyl group, isobenzofuranyl group, dibenzofuranyl group, naphthobenzofuranyl group, benzoxazolyl group, benzisoxazolyl group, phenoxazinyl group, morpholino group, dinaphthofuranyl group, azadibenzofuranyl group, diazadibenzofuranyl group, azanaphthobenzofuranyl group, and diazanaphthobenzofuranyl group.

Unsubstituted Heterocyclic Groups Including Sulfur Atom (Specific Example Group G2A3):

a thienyl group, thiazolyl group, isothiazolyl group, thiadiazolyl group, benzothiophenyl group (benzothienyl group), isobenzothiophenyl group (isobenzothienyl group), dibenzothiophenyl group (dibenzothienyl group), naphthobenzothiophenyl group (nahthobenzothienyl group), benzothiazolyl group, benzisothiazolyl group, phenothiazinyl group, dinaphthothiophenyl group (dinaphthothienyl group), azadibenzothiophenyl group (azadibenzothienyl group), diazadibenzothiophenyl group (diazadibenzothienyl group), azanaphthobenzothiophenyl group (azanaphthobenzothienyl group), and diazanaphthobenzothiophenyl group (diazanaphthobenzothienyl group)

Monovalent Heterocyclic Groups Derived by Removing One Hydrogen Atom from Cyclic Structures Represented by Formulae (TEMP-16) to (TEMP-33) (Specific Example Group G2A4):

[Formula 3]

(TEMP-16)

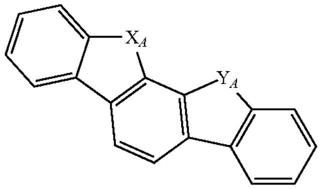

(TEMP-17)

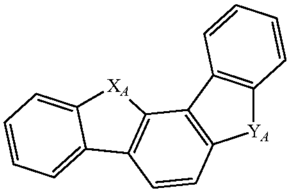

(TEMP-18)

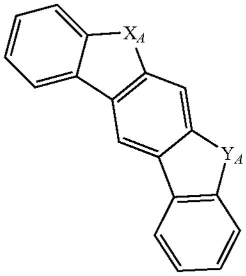

(TEMP-19)

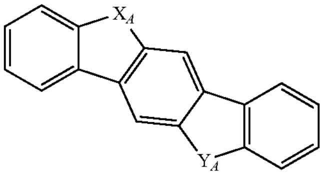

(TEMP-20)

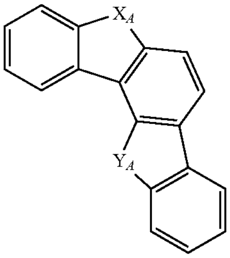

-continued (TEMP-21)

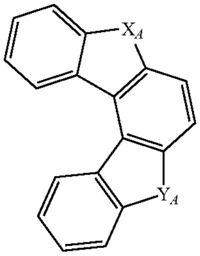

(TEMP-22)

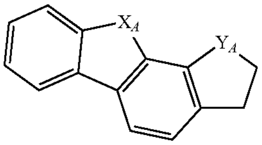

(TEMP-23)

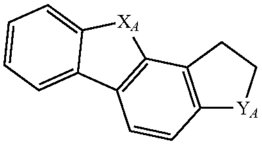

(TEMP-24)

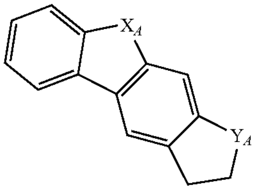

[Formula 4]

(TEMP25)

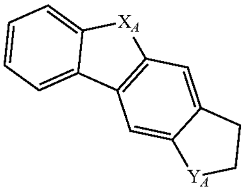

(TEMP-26)

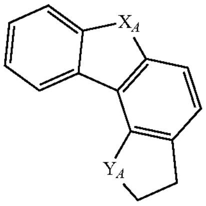

(TEMP-27

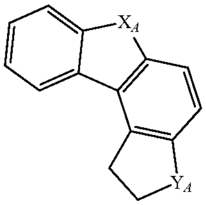

(TEMP-28)

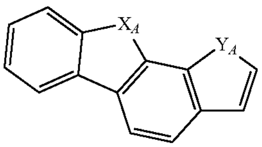

-continued (TEMP-29)

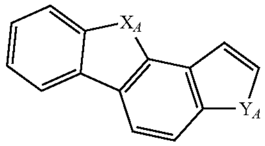

(TEMP-30)

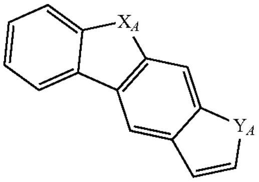

(TEMP-31)

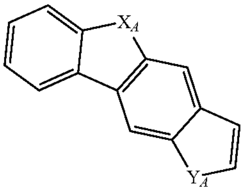

(TEMP-32)

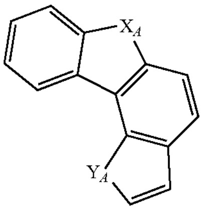

(TEMP-33)

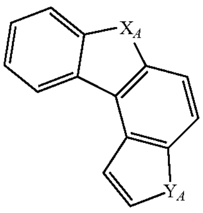

In the formulae (TEMP-16) to (TEMP-33), $X_A$ and $Y_A$ are each independently an oxygen atom, a sulfur atom, NH or $CH_2$, with a proviso that at least one of $X_A$ or $Y_A$ is an oxygen atom, a sulfur atom, or NH.

When at least one of $X_A$ or $Y_A$ in the formulae (TEMP-16) to (TEMP-33) is NH or $CH_2$, the monovalent heterocyclic groups derived from the cyclic structures represented by the formulae (TEMP-16) to (TEMP-33) include a monovalent group derived by removing one hydrogen atom from NH or $CH_2$.

Substituted Heterocyclic Groups Including Nitrogen Atom (Specific Example Group G2B1):

a (9-phenyl)carbazolyl group, (9-biphenylyl)carbazolyl group, (9-phenyl)phenylcarbazolyl group, (9-naphthyl) carbazolyl group, diphenylcarbazole-9-yl group, phenylcarbazole-9-yl group, methylbenzimidazolyl group, ethylbenzimidazolyl group, phenyltriazinyl group, biphenylyltriazinyl group, diphenyltriazinyl group, phenylquinazolinyl group, and biphenylquinazolinyl group.

Substituted Heterocyclic Groups Including Oxygen Atom (Specific Example Group G2B2):

a phenyldibenzofuranyl group, methyldibenzofuranyl group, t-butyl dibenzofuranyl group, and monovalent residue of spiro[9H-xanthene-9,9'-[9H]fluorene].

Substituted Heterocyclic Groups Including Sulfur Atom (Specific Example Group G2B3):

a phenyldibenzothiophenyl group, methyldibenzothiophenyl group, t-butyl dibenzothiophenyl group, and monovalent residue of spiro[9H-thioxanthene-9,9'-[9H]fluorene].

Groups Obtained by Substituting at Least One Hydrogen Atom of Monovalent Heterocyclic Group Derived from Cyclic Structures Represented by Formulae (TEMP-16) to (TEMP-33) with Substituent (Specific Example Group G2B4):

The "at least one hydrogen atom of a monovalent heterocyclic group" means at least one hydrogen atom selected from a hydrogen atom bonded to a ring carbon atom of the monovalent heterocyclic group, a hydrogen atom bonded to a nitrogen atom of at least one of $X_A$ or $Y_A$ in a form of NH, and a hydrogen atom of one of $X_A$ and $Y_A$ in a form of a methylene group ($CH_2$).

Substituted or Unsubstituted Alkyl Group

Specific examples (specific example group G3) of the "substituted or unsubstituted alkyl group" mentioned herein include unsubstituted alkyl groups (specific example group G3A) and substituted alkyl groups (specific example group G3B) below. (Herein, an unsubstituted alkyl group refers to an "unsubstituted alkyl group" in a "substituted or unsubstituted alkyl group," and a substituted alkyl group refers to a "substituted alkyl group" in a "substituted or unsubstituted alkyl group.") A simply termed "alkyl group" herein includes both of an "unsubstituted alkyl group" and a "substituted alkyl group".

The "substituted alkyl group" refers to a group derived by substituting at least one hydrogen atom in an "unsubstituted alkyl group" with a substituent. Specific examples of the "substituted alkyl group" include a group derived by substituting at least one hydrogen atom of an "unsubstituted alkyl group" (specific example group G3A) below with a substituent, and examples of the substituted alkyl group (specific example group G3B) below. Herein, the alkyl group for the "unsubstituted alkyl group" refers to a chain alkyl group. Accordingly, the "unsubstituted alkyl group" include linear "unsubstituted alkyl group" and branched "unsubstituted alkyl group." It should be noted that the examples of the "unsubstituted alkyl group" and the "substituted alkyl group" mentioned herein are merely exemplary, and the "substituted alkyl group" mentioned herein includes a group derived by further substituting a hydrogen atom of a skeleton of the "substituted alkyl group" in the specific example group G3B, and a group derived by further substituting a hydrogen atom of a substituent of the "substituted alkyl group" in the specific example group G3B.

Unsubstituted Alkyl Group (Specific Example Group G3A):

a methyl group, ethyl group, n-propyl group, isopropyl group, n-butyl group, isobutyl group, s-butyl group, and «nret» t-butyl group.

Substituted Alkyl Group (Specific Example Group G3B):

a heptafluoropropyl group (including isomer thereof), pentafluoroethyl group, 2,2,2-trifluoroethyl group, and trifluoromethyl group.

Substituted or Unsubstituted Alkenyl Group

Specific examples (specific example group G4) of the "substituted or unsubstituted alkenyl group" mentioned herein include unsubstituted alkenyl groups (specific example group G4A) and substituted alkenyl groups (specific example group G4B). (Herein, an unsubstituted alkenyl group refers to an "unsubstituted alkenyl group" in a "substituted or unsubstituted alkenyl group," and a substituted alkenyl group refers to a "substituted alkenyl group" in a "substituted or unsubstituted alkenyl group.") A simply termed "alkenyl group" herein includes both of an "unsubstituted alkenyl group" and a "substituted alkenyl group".

The "substituted alkenyl group" refers to a group derived by substituting at least one hydrogen atom in an "unsubstituted alkenyl group" with a substituent. Specific examples of the "substituted alkenyl group" include an "unsubstituted alkenyl group" (specific example group G4A) substituted by a substituent, and examples of the substituted alkenyl group (specific example group G4B) below. It should be noted that the examples of the "unsubstituted alkenyl group" and the "substituted alkenyl group" mentioned herein are merely exemplary, and the "substituted alkenyl group" mentioned herein includes a group derived by further substituting a hydrogen atom of a skeleton of the "substituted alkenyl group" in the specific example group G4B with a substituent, and a group derived by further substituting a hydrogen atom of a substituent of the "substituted alkenyl group" in the specific example group G4B with a substituent.

Unsubstituted Alkenyl Group (Specific Example Group G4A):

a vinyl group, allyl group, 1-butenyl group, 2-butenyl group, and 3-butenyl group.

Substituted Alkenyl Group (Specific Example Group G4B):

a 1,3-butanedienyl group, 1-methylvinyl group, 1-methylallyl group, 1,1-dimethylallyl group, 2-methylallyl group, and 1,2-dimethylallyl group.

Substituted or Unsubstituted Alkynyl Group

Specific examples (specific example group G5) of the "substituted or unsubstituted alkynyl group" mentioned herein include unsubstituted alkynyl groups (specific example group G5A) below. (Herein, an unsubstituted alkynyl group refers to an "unsubstituted alkynyl group" in a "substituted or unsubstituted alkynyl group.") A simply termed "alkynyl group" herein includes both of "unsubstituted alkynyl group" and "substituted alkynyl group".

The "substituted alkynyl group" refers to a group derived by substituting at least one hydrogen atom in an "unsubstituted alkynyl group" with a substituent. Specific examples of the "substituted alkynyl group" include a group derived by substituting at least one hydrogen atom of the "unsubstituted alkynyl group" (specific example group G5A) below with a substituent.

Unsubstituted Alkynyl Group (Specific Example Group G5A):

an ethynyl group.

Substituted or Unsubstituted Cycloalkyl Group

Specific examples (specific example group G6) of the "substituted or unsubstituted cycloalkyl group" mentioned herein include unsubstituted cycloalkyl groups (specific example group G6A) and substituted cycloalkyl groups (specific example group G6B). (Herein, an unsubstituted cycloalkyl group refers to an "unsubstituted cycloalkyl group" in a "substituted or unsubstituted cycloalkyl group," and a substituted cycloalkyl group refers to a "substituted cycloalkyl group" in a "substituted or unsubstituted cycloalkyl group.") A simply termed "cycloalkyl group" herein includes both of "unsubstituted cycloalkyl group" and "substituted cycloalkyl group".

The "substituted cycloalkyl group" refers to a group derived by substituting at least one hydrogen atom of an "unsubstituted cycloalkyl group" with a substituent. Specific examples of the "substituted cycloalkyl group" include a group derived by substituting at least one hydrogen atom of the "unsubstituted cycloalkyl group" (specific example group G6A) below with a substituent, and examples of the substituted cycloalkyl group (specific example group G6B) below. It should be noted that the examples of the "unsubstituted cycloalkyl group" and the "substituted cycloalkyl group" mentioned herein are merely exemplary, and the "substituted cycloalkyl group" mentioned herein includes a group derived by substituting at least one hydrogen atom bonded to a carbon atom of a skeleton of the "substituted cycloalkyl group" in the specific example group G6B with a substituent, and a group derived by further substituting a hydrogen atom of a substituent of the "substituted cycloalkyl group" in the specific example group G6B with a substituent.

Unsubstituted Cycloalkyl Group (Specific Example Group G6A):

a cyclopropyl group, cyclobutyl group, cyclopentyl group, cyclohexyl group, 1-adamantyl group, 2-adamantyl group, 1-norbornyl group, and 2-norbornyl group.

Substituted Cycloalkyl Group (Specific Example Group G6B):

a 4-methylcyclohexyl group.

Group Represented by —Si($R_{901}$)($R_{902}$)($R_{903}$)

Specific examples (specific example group G7) of the group represented herein by —Si($R_{901}$)($R_{902}$)($R_{903}$) include: —Si(G1)(G1)(G1); —Si(G1)(G2)(G2); —Si(G1)(G1)(G2); —Si(G2)(G2)(G2); —Si(G3)(G3)(G3); and —Si(G6)(G6)(G6);

where: G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3;

G6 represents a "substituted or unsubstituted cycloalkyl group" in the specific example group G6;

a plurality of G1 in —Si(G1)(G1)(G1) are mutually the same or different;

a plurality of G2 in —Si(G1)(G2)(G2) are mutually the same or different;

a plurality of G1 in —Si(G1)(G1)(G1) are mutually the same or different;

a plurality of G2 in —Si(G2)(G2)(G2) are mutually the same or different;

a plurality of G3 in —Si(G3)(G3)(G3) are mutually the same or different; and a plurality of G6 in —Si(G6)(G6)(G6) are mutually the same or different.

Group Represented by —O—($R_{904}$)

Specific examples (specific example group G8) of a group represented by —O—($R_{904}$) herein include: —O(G1); —O(G2); —O(G3); and —O(G6);

where: G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

Group Represented by —S—($R_{905}$)

Specific examples (specific example group G9) of a group represented herein by —S—($R_{905}$) include: —S(G1); —S(G2); —S(G3); and —S(G6);

where: G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

Group Represented by —N($R_{906}$)($R_{907}$)

Specific examples (specific example group G10) of a group represented herein by —N($R_{906}$)($R_{907}$) include: —N(G1)(G1); —N(G2)(G2); —N(G1)(G2); —N(G3)(G3); and —N(G6)(G6), where: G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3;

G6 represents a "substituted or unsubstituted cycloalkyl group" in the specific example group G6;

a plurality of G1 in —N(G1)(G1) are mutually the same or different;

a plurality of G2 in —N(G2)(G2) are mutually the same or different;

a plurality of G3 in —N(G3)(G3) are mutually the same or different; and a plurality of G6 in —N(G6)(G6) are mutually the same or different.

Halogen Atom

Specific examples (specific example group G11) of "halogen atom" mentioned herein include a fluorine atom, chlorine atom, bromine atom, and iodine atom.

Substituted or Unsubstituted Fluoroalkyl Group

The "substituted or unsubstituted fluoroalkyl group" mentioned herein refers to a group derived by substituting at least one hydrogen atom bonded to at least one of carbon atoms forming an alkyl group in the "substituted or unsubstituted alkyl group" with a fluorine atom, and also includes a group (perfluoro group) derived by substituting all of hydrogen atoms bonded to carbon atoms forming the alkyl group in the "substituted or unsubstituted alkyl group" with fluorine atoms. An "unsubstituted fluoroalkyl group" has, unless otherwise specified herein, 1 to 50, preferably 1 to 30, more preferably 1 to 18 carbon atoms. The "substituted fluoroalkyl group" refers to a group derived by substituting at least one hydrogen atom in a "fluoroalkyl group" with a substituent. It should be noted that the examples of the "substituted fluoroalkyl group" mentioned herein include a group derived by further substituting at least one hydrogen atom bonded to a carbon atom of an alkyl chain of a "substituted fluoroalkyl group" with a substituent, and a group derived by further substituting at least one hydrogen atom of a substituent of the "substituted fluoroalkyl group" with a substituent. Specific examples of the "unsubstituted fluoroalkyl group" include a group derived by substituting at least one hydrogen atom of the "alkyl group" (specific example group G3) with a fluorine atom.

Substituted or Unsubstituted Haloalkyl Group

The "substituted or unsubstituted haloalkyl group" mentioned herein refers to a group derived by substituting at least one hydrogen atom bonded to carbon atoms forming the alkyl group in the "substituted or unsubstituted alkyl group" with a halogen atom, and also includes a group derived by substituting all hydrogen atoms bonded to carbon atoms forming the alkyl group in the "substituted or unsubstituted alkyl group" with halogen atoms. An "unsubstituted haloalkyl group" has, unless otherwise specified herein, 1 to 50, preferably 1 to 30, and more preferably 1 to 18 carbon atoms. The "substituted haloalkyl group" refers to a group derived by substituting at least one hydrogen atom in a "haloalkyl group" with a substituent. It should be noted that the examples of the "substituted haloalkyl group" mentioned herein include a group derived by further substituting at least one hydrogen atom bonded to a carbon atom of an alkyl chain of a "substituted haloalkyl group" with a substituent, and a group derived by further substituting at least one hydrogen atom of a substituent of the "substituted haloalkyl group" with a substituent. Specific examples of the "unsubstituted haloalkyl group" include a group derived by substituting at least one hydrogen atom of the "alkyl group" (specific example group G3) with a halogen atom. The haloalkyl group is sometimes referred to as a halogenated alkyl group.

Substituted or Unsubstituted Alkoxy Group

Specific examples of a "substituted or unsubstituted alkoxy group" mentioned herein include a group represented by —O(G3), G3 being the "substituted or unsubstituted alkyl group" in the specific example group G3. An "unsubstituted alkoxy group" has, unless otherwise specified herein, 1 to 50, preferably 1 to 30, more preferably 1 to 18 carbon atoms.

Substituted or Unsubstituted Alkylthio Group

Specific examples of a "substituted or unsubstituted alkylthio group" mentioned herein include a group represented by —S(G3), G3 being the "substituted or unsubstituted alkyl group" in the specific example group G3. An "unsubstituted alkylthio group" has, unless otherwise specified herein, 1 to 50, preferably 1 to 30, more preferably 1 to 18 carbon atoms.

Substituted or Unsubstituted Aryloxy Group

Specific examples of a "substituted or unsubstituted aryloxy group" mentioned herein include a group represented by —O(G1), G1 being the "substituted or unsubstituted aryl group" in the specific example group G1. An "unsubstituted aryloxy group" has, unless otherwise specified herein, 6 to 50, preferably 6 to 30, more preferably 6 to 18 ring carbon atoms.

Substituted or Unsubstituted Arylthio Group

Specific examples of a "substituted or unsubstituted arylthio group" mentioned herein include a group represented by —S(G1), G1 being the "substituted or unsubstituted aryl group" in the specific example group G1. An "unsubstituted arylthio group" has, unless otherwise specified herein, 6 to 50, preferably 6 to 30, more preferably 6 to 18 ring carbon atoms.

Substituted or Unsubstituted Trialkylsilyl Group

Specific examples of a "trialkylsilyl group" mentioned herein include a group represented by —Si(G3)(G3)(G3), G3 being the "substituted or unsubstituted alkyl group" in the specific example group G3. A plurality of G3 in —Si(G3)(G3)(G3) are mutually the same or different. Each of the alkyl groups in the "trialkylsilyl group" has, unless otherwise specified herein, 1 to 50, preferably 1 to 20, more preferably 1 to 6 carbon atoms.

Substituted or Unsubstituted Aralkyl Group

Specific examples of a "substituted or unsubstituted aralkyl group" mentioned herein include a group represented by -(G3)-(G1), G3 being the "substituted or unsubstituted alkyl group" in the specific example group G3, G1 being the "substituted or unsubstituted aryl group" in the specific example group G1. Accordingly, the "aralkyl group" is a group derived by substituting a hydrogen atom of the "alkyl group" with a substituent in a form of the "aryl group," which is an example of the "substituted alkyl group." An "unsubstituted aralkyl group," which is an "unsubstituted alkyl group" substituted by an "unsubstituted aryl group,"

has, unless otherwise specified herein, 7 to 50 carbon atoms, preferably 7 to 30 carbon atoms, more preferably 7 to 18 carbon atoms.

Specific examples of the "substituted or unsubstituted aralkyl group" include a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

Preferable examples of the substituted or unsubstituted aryl group mentioned herein include, unless otherwise specified herein, a phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, phenanthryl group, pyrenyl group, chrysenyl group, triphenylenyl group, fluorenyl group, 9,9'-spirobifluorenyl group, 9,9-dimethylfluorenyl group, and 9,9-diphenylfluorenyl group.

Preferable examples of the substituted or unsubstituted heterocyclic group mentioned herein include, unless otherwise specified herein, a pyridyl group, pyrimidinyl group, triazinyl group, quinolyl group, isoquinolyl group, quinazolinyl group, benzimidazolyl group, phenanthrolinyl group, carbazolyl group (1-carbazolyl group, 2-carbazolyl group, 3-carbazolyl group, 4-carbazolyl group, or 9-carbazolyl group), benzocarbazolyl group, azacarbazolyl group, diazacarbazolyl group, dibenzofuranyl group, naphthobenzofuranyl group, azadibenzofuranyl group, diazadibenzofuranyl group, dibenzothiophenyl group, naphthobenzothiophenyl group, azadibenzothiophenyl group, diazadibenzothiophenyl group, (9-phenyl)carbazolyl group ((9-phenyl)carbazole-1-yl group, (9-phenyl)carbazole-2-yl group, (9-phenyl)carbazole-3-yl group, or (9-phenyl)carbazole-4-yl group), (9-biphenylyl)carbazolyl group, (9-phenyl)phenylcarbazolyl group, diphenylcarbazole-9-yl group, phenylcarbazole-9-yl group, phenyltriazinyl group, biphenylyltriazinyl group, diphenyltriazinyl group, phenyldibenzofuranyl group, and phenyldibenzothiophenyl group.

The carbazolyl group mentioned herein is, unless otherwise specified herein, specifically a group represented by one of formulae below.

[Formula 5]

(TEMP-Cz1)

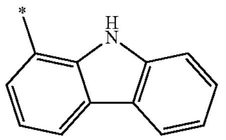

(TEMP-Cz2)

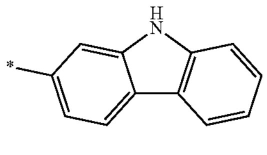

-continued (TEMP-Cz3)

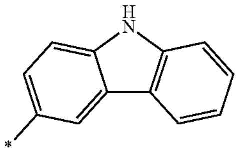

(TEMP-Cz4)

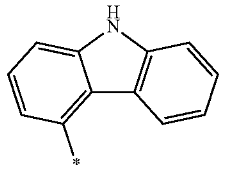

(TEMP-Cz5)

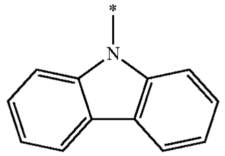

The (9-phenyl)carbazolyl group mentioned herein is, unless otherwise specified herein, specifically a group represented by one of formulae below.

[Formula 6]

(TEMP-Cz6)

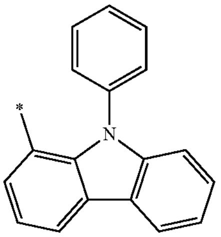

(TEMP-Cz7)

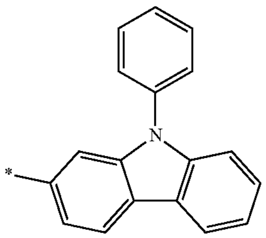

(TEMP-Cz8)

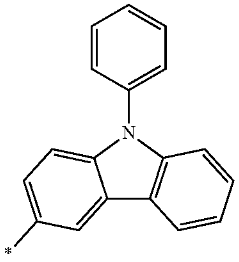

-continued (TEMP-Cz9)

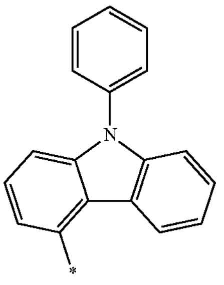

In the formulae (TEMP-Cz1) to (TEMP-Cz9), * represents a bonding position.

The dibenzofuranyl group and dibenzothiophenyl group mentioned herein are, unless otherwise specified herein, each specifically represented by one of formulae below.

[Formula 7]

(TEMP-34)

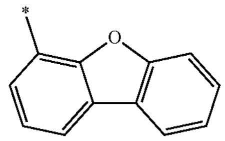

(TEMP-35)

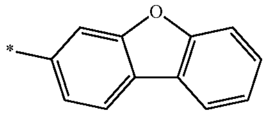

(TEMP-36)

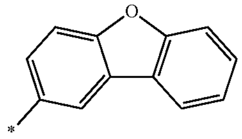

(TEMP-37)

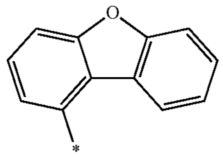

(TEMP-38)

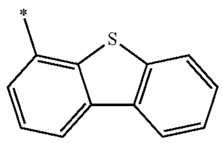

(TEMP-39)

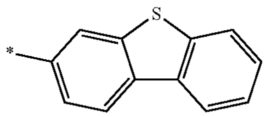

(TEMP-40)

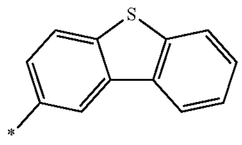

-continued (TEMP-41)

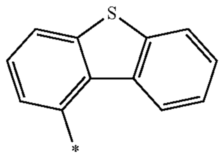

In the formulae (TEMP-34) to (TEMP-41), * represents a bonding position.

Preferable examples of the substituted or unsubstituted alkyl group mentioned herein include, unless otherwise specified herein, a methyl group, ethyl group, propyl group, isopropyl group, n-butyl group, isobutyl group, and t-butyl group.

Substituted or Unsubstituted Arylene Group

The "substituted or unsubstituted arylene group" mentioned herein is, unless otherwise specified herein, a divalent group derived by removing one hydrogen atom on an aryl ring of the "substituted or unsubstituted aryl group." Specific examples of the "substituted or unsubstituted arylene group" (specific example group G12) include a divalent group derived by removing one hydrogen atom on an aryl ring of the "substituted or unsubstituted aryl group" in the specific example group G1.

Substituted or Unsubstituted Divalent Heterocyclic Group

The "substituted or unsubstituted divalent heterocyclic group" mentioned herein is, unless otherwise specified herein, a divalent group derived by removing one hydrogen atom on a heterocycle of the "substituted or unsubstituted heterocyclic group." Specific examples of the "substituted or unsubstituted divalent heterocyclic group" (specific example group G13) include a divalent group derived by removing one hydrogen atom on a heterocyclic ring of the "substituted or unsubstituted heterocyclic group" in the specific example group G2.

Substituted or Unsubstituted Alkylene Group

The "substituted or unsubstituted alkylene group" mentioned herein is, unless otherwise specified herein, a divalent group derived by removing one hydrogen atom on an alkyl chain of the "substituted or unsubstituted alkyl group." Specific examples of the "substituted or unsubstituted alkylene group" (specific example group G14) include a divalent group derived by removing one hydrogen atom on an alkyl chain of the "substituted or unsubstituted alkyl group" in the specific example group G3.

The substituted or unsubstituted arylene group mentioned herein is, unless otherwise specified herein, preferably any one of groups represented by formulae (TEMP-42) to (TEMP-68) below.

[Formula 8]

(TEMP-42)

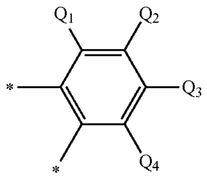

-continued
(TEMP-43)
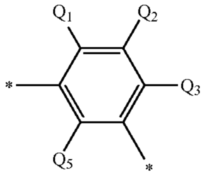
(TEMP-44)
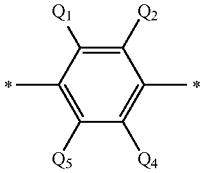
(TEMP-45)
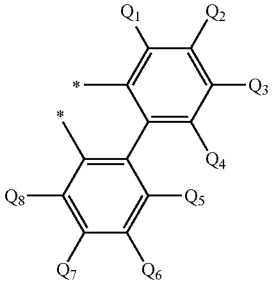
(TEMP-46)
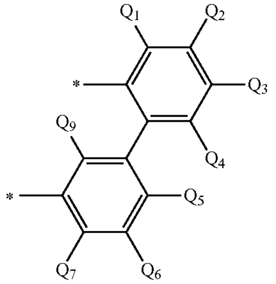
(TEMP-47)
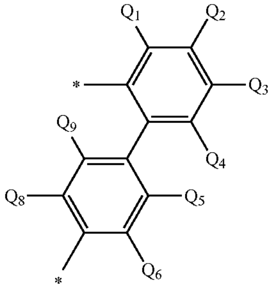
[Formula 9]
(TEMP-48)
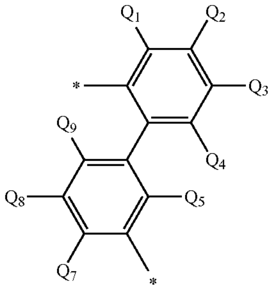
-continued
(TEMP-49)
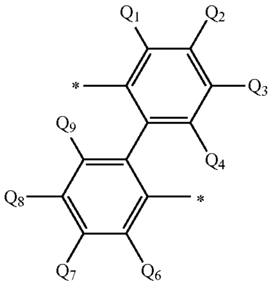
(TEMP-50)
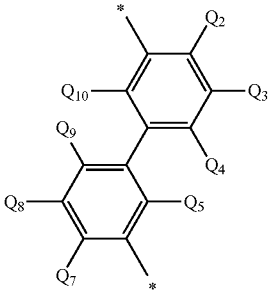
(TEMP-51)
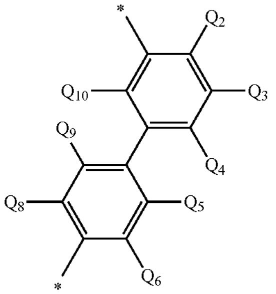
(TEMP-52)
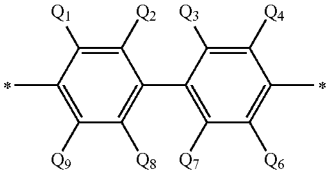
In the formulae (TEMP-42) to (TEMP-52), $Q_1$ to $Q_{10}$ are each independently a hydrogen atom or a substituent.
In the formulae (TEMP-42) to (TEMP-52), * represents a bonding position.
[Formula 10]
(TEMP-53)
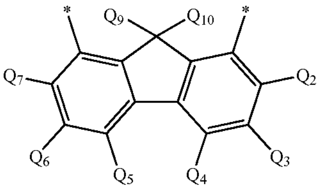

-continued
(TEMP-54)
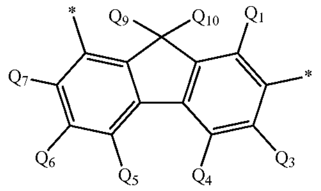
(TEMP-55)
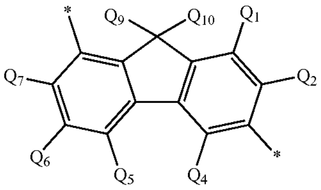
(TEMP-56)
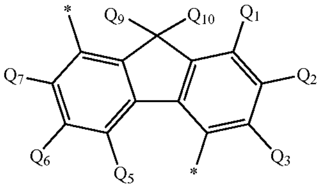
(TEMP-57)
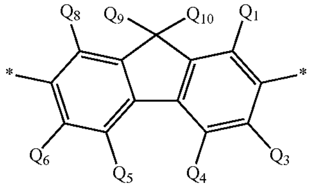
(TEMP-58)
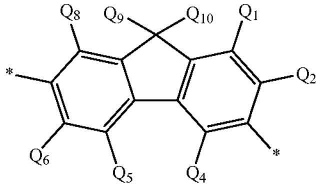
(TEMP-59)
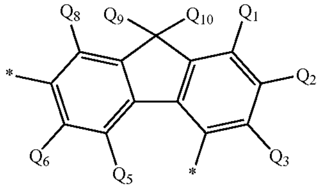
(TEMP-60)
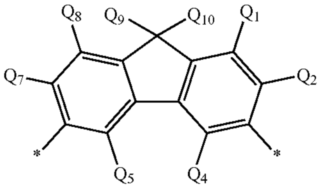
(TEMP-61)
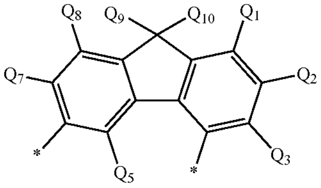
-continued
(TEMP-62)
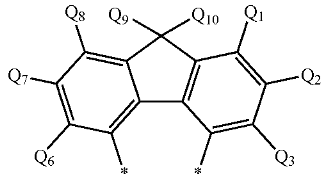
In the formulae (TEMP-53) to (TEMP-62), $Q_1$ to $Q_{10}$ are each independently a hydrogen atom or a substituent.
In the formulae, $Q_9$ and $Q_{10}$ may be mutually bonded through a single bond to form a ring.
In the formulae (TEMP-53) to (TEMP-62), * represents a bonding position.
[Formula 11]
(TEMP-69)
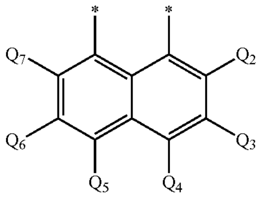
(TEMP-70)
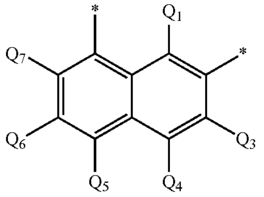
(TEMP-71)
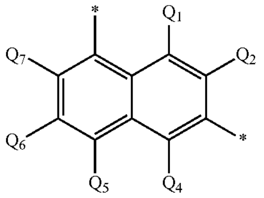
(TEMP-72)
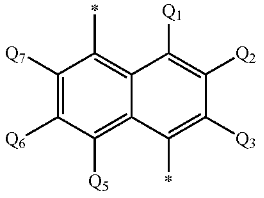
(TEMP-73)
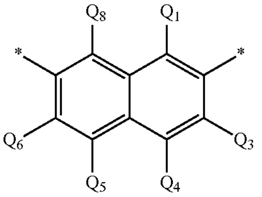

-continued (TEMP-74)

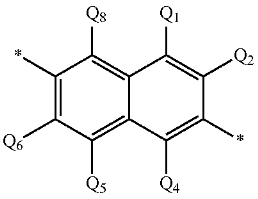

In the formulae (TEMP-63) to (TEMP-68), $Q_1$ to $Q_8$ are each independently a hydrogen atom or a substituent.

In the formulae (TEMP-63) to (TEMP-68), * represents a bonding position.

The substituted or unsubstituted divalent heterocyclic group mentioned herein is, unless otherwise specified herein, preferably a group represented by any one of formulae (TEMP-69) to (TEMP-102) below.

[Formula 12]

(TEMP-69)

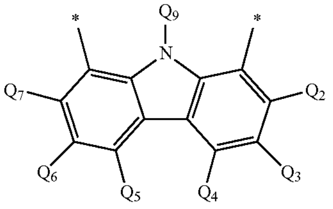

(TEMP-70)

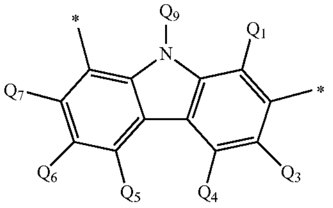

(TEMP-71)

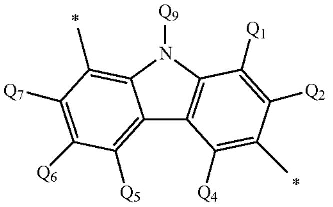

(TEMP-72)

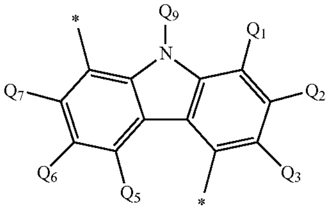

(TEMP-73)

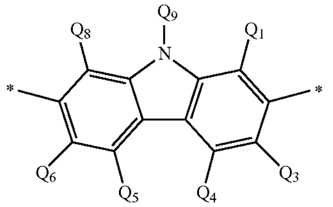

-continued (TEMP-74)

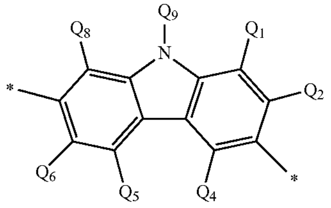

[Formula 13]

(TEMP-75)

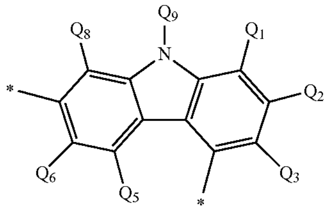

(TEMP-76)

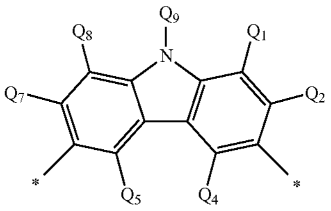

(TEMP-77)

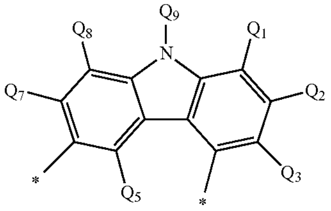

(TEMP-78)

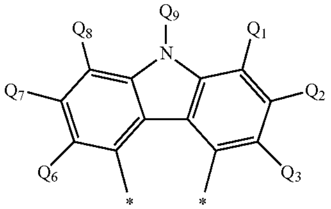

(TEMP-79)

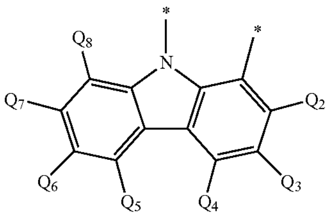

(TEMP-80)

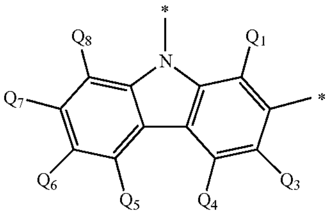

-continued
[Formula 14]
(TEMP-81)
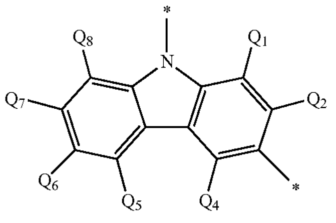
(TEMP-82)
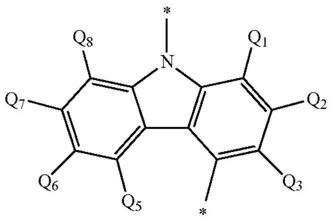
In the formulae (TEMP-69) to (TEMP-82), $Q_1$ to $Q_9$ are each independently a hydrogen atom or a substituent.
[Formula 15]
(TEMP-83)
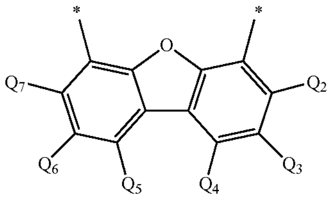
(TEMP-84)
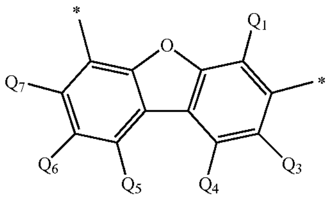
(TEMP-85)
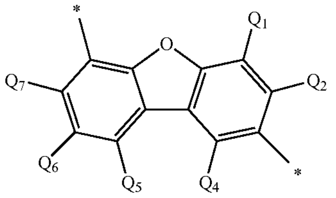
(TEMP-86)
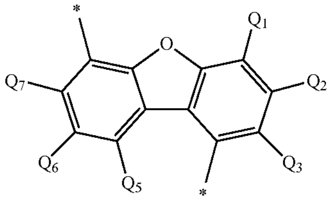
-continued
(TEMP-87)
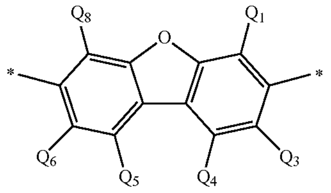
(TEMP-88)
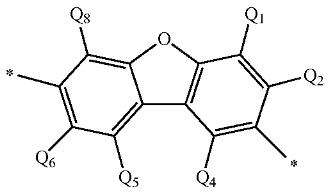
[Formula 16]
(TEMP-89)
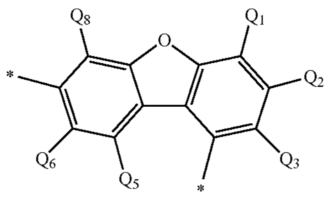
(TEMP-90)
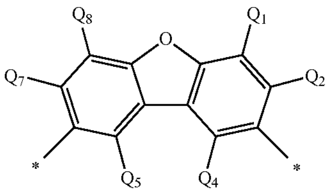
(TEMP-91)
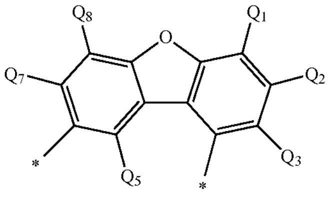
(TEMP-92)
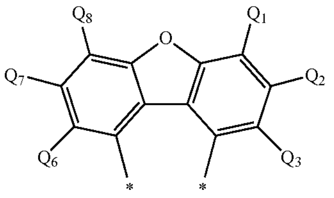
[Formula 17]
(TEMP-93)
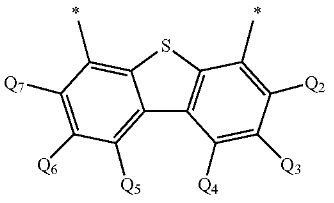

-continued (TEMP-94)

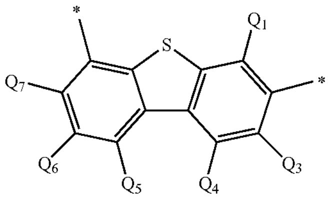

(TEMP-95)

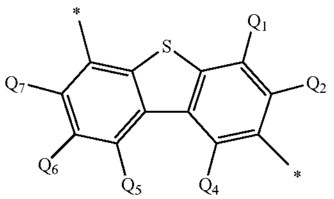

(TEMP-96)

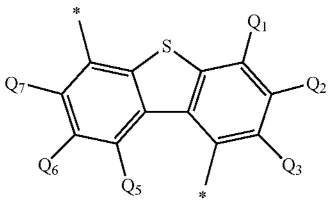

(TEMP-97)

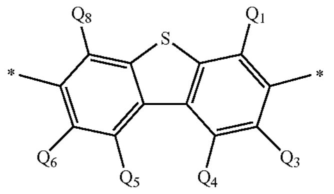

(TEMP-98)

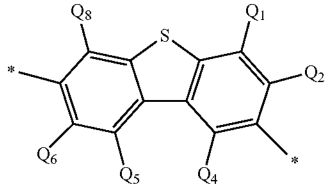

[Formula 18]

(TEMP-99)

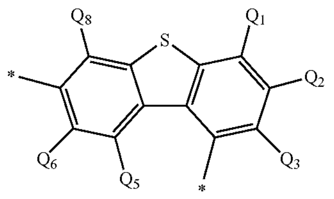

(TEMP-100)

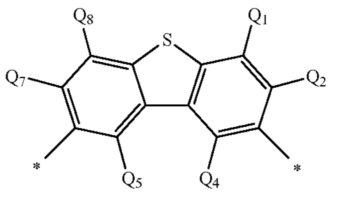

-continued (TEMP-101)

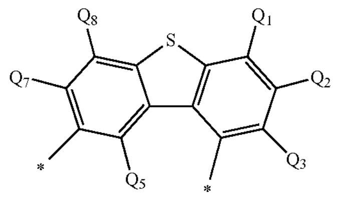

(TEMP-102)

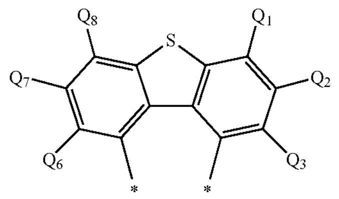

In the formulae (TEMP-83) to (TEMP-102), $Q_1$ to $Q_8$ are each independently a hydrogen atom or a substituent.

The substituent mentioned herein has been described above.

Instance of "Bonded to Form Ring"

Instances where "at least one combination of adjacent two or more (of . . . ) are mutually bonded to form a substituted or unsubstituted monocyclic ring, mutually bonded to form a substituted or unsubstituted fused ring, or not mutually bonded" mentioned herein refer to instances where "at least one combination of adjacent two or more (of . . . ) are mutually bonded to form a substituted or unsubstituted monocyclic ring, "at least one combination of adjacent two or more (of . . . ) are mutually bonded to form a substituted or unsubstituted fused ring," and "at least one combination of adjacent two or more (of . . . ) are not mutually bonded."

Instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (these instances will be sometimes collectively referred to as an instance of "bonded to form a ring" hereinafter) will be described below. An anthracene compound having a basic skeleton in a form of an anthracene ring and represented by a formula (TEMP-103) below will be used as an example for the description.

[Formula 19]

(TEMP-103)

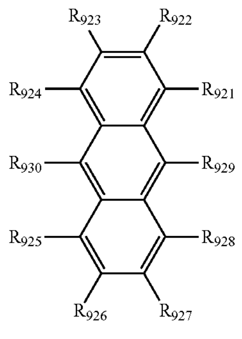

For instance, when "at least one combination of adjacent two or more of $R_{921}$ to $R_{930}$ are mutually bonded to form a ring," the combination of adjacent ones of $R_{921}$ to $R_{930}$ (i.e. the combination at issue) is a combination of $R_{921}$ and $R_{922}$, a combination of $R_{922}$ and $R_{923}$, a combination of $R_{923}$ and $R_{924}$, a combination of $R_{924}$ and $R_{930}$, a combination of $R_{930}$ and $R_{925}$, a combination of $R_{925}$ and $R_{926}$, a combination of $R_{926}$ and $R_{927}$, a combination of $R_{927}$ and $R_{928}$, a combination of $R_{928}$ and $R_{929}$, or a combination of $R_{929}$ and $R_{921}$.

The term "at least one combination" means that two or more of the above combinations of adjacent two or more of $R_{921}$ to $R_{930}$ may simultaneously form rings. For instance, when $R_{921}$ and $R_{922}$ are mutually bonded to form a ring $Q_A$ and $R_{925}$ and $R_{926}$ are simultaneously mutually bonded to form a ring $Q_B$, the anthracene compound represented by the formula (TEMP-103) is represented by a formula (TEMP-104) below.

[Formula 20]

(TEMP-104)

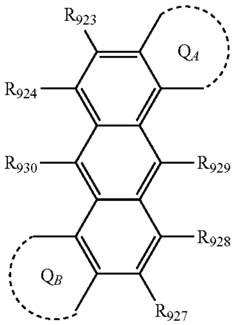

The instance where the "combination of adjacent two or more" form a ring means not only an instance where the "two" adjacent components are bonded but also an instance where adjacent "three or more" are bonded. For instance, $R_{921}$ and $R_{922}$ are mutually bonded to form a ring $Q_A$ and $R_{922}$ and $R_{923}$ are mutually bonded to form a ring $Q_C$, and mutually adjacent three components ($R_{921}$, $R_{922}$ and $R_{923}$) are mutually bonded to form a ring fused to the anthracene basic skeleton. In this case, the anthracene compound represented by the formula (TEMP-103) is represented by a formula (TEMP-105) below. In the formula (TEMP-105) below, the ring $Q_A$ and the ring $Q_C$ share $R_{922}$.

[Formula 21]

(TEMP-105)

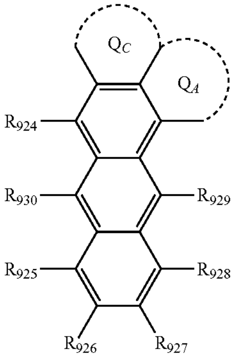

The formed "monocyclic ring" or "fused ring" may be, in terms of the formed ring in itself, a saturated ring or an unsaturated ring. When the "combination of adjacent two" form a "monocyclic ring" or a "fused ring," the "monocyclic ring" or "fused ring" may be a saturated ring or an unsaturated ring. For instance, the ring $Q_A$ and the ring $Q_B$ formed in the formula (TEMP-104) are each independently a "monocyclic ring" or a "fused ring." Further, the ring $Q_A$ and the ring $Q_C$ formed in the formula (TEMP-105) are each a "fused ring." The ring $Q_A$ and the ring $Q_C$ in the formula (TEMP-105) are fused to form a fused ring. When the ring $Q_A$ in the formula (TEMP-104) is a benzene ring, the ring $Q_A$ is a monocyclic ring. When the ring $Q_A$ in the formula (TEMP-104) is a naphthalene ring, the ring $Q_A$ is a fused ring.

The "unsaturated ring" represents an aromatic hydrocarbon ring or an aromatic heterocycle. The "saturated ring" represents an aliphatic hydrocarbon ring or a non-aromatic heterocycle.

Specific examples of the aromatic hydrocarbon ring include a ring formed by terminating a bond of a group in the specific example of the specific example group G1 with a hydrogen atom.

Specific examples of the aromatic heterocycle include a ring formed by terminating a bond of an aromatic heterocyclic group in the specific example of the specific example group G2 with a hydrogen atom.

Specific examples of the aliphatic hydrocarbon ring include a ring formed by terminating a bond of a group in the specific example of the specific example group G6 with a hydrogen atom.

The phrase "to form a ring" herein means that a ring is formed only by a plurality of atoms of a basic skeleton, or by a combination of a plurality of atoms of the basic skeleton and one or more optional atoms. For instance, the ring $Q_A$ formed by mutually bonding $R_{921}$ and $R_{922}$ shown in the formula (TEMP-104) is a ring formed by a carbon atom of the anthracene skeleton bonded to $R_{921}$, a carbon atom of the anthracene skeleton bonded to $R_{922}$, and one or more optional atoms. Specifically, when the ring $Q_A$ is a monocyclic unsaturated ring formed by $R_{921}$ and $R_{922}$, the ring formed by a carbon atom of the anthracene skeleton bonded to $R_{921}$, a carbon atom of the anthracene skeleton bonded to $R_{922}$, and four carbon atoms is a benzene ring.

The "optional atom" is, unless otherwise specified herein, preferably at least one atom selected from the group consisting of a carbon atom, nitrogen atom, oxygen atom, and sulfur atom. A bond of the optional atom (e.g. a carbon atom and a nitrogen atom) not forming a ring may be terminated by a hydrogen atom or the like or may be substituted by an "optional substituent" described later. When the ring includes an optional element other than carbon atom, the resultant ring is a heterocycle.

The number of "one or more optional atoms" forming the monocyclic ring or fused ring is, unless otherwise specified herein, preferably in a range from 2 to 15, more preferably in a range from 3 to 12, further preferably in a range from 3 to 5.

Unless otherwise specified herein, the ring, which may be a "monocyclic ring" or "fused ring," is preferably a "monocyclic ring."

Unless otherwise specified herein, the ring, which may be a "saturated ring" or "unsaturated ring," is preferably an "unsaturated ring."

Unless otherwise specified herein, the "monocyclic ring" is preferably a benzene ring.

Unless otherwise specified herein, the "unsaturated ring" is preferably a benzene ring.

When "at least one combination of adjacent two or more" (of . . . ) are "mutually bonded to form a substituted or unsubstituted monocyclic ring" or "mutually bonded to form a substituted or unsubstituted fused ring," unless otherwise specified herein, at least one combination of adjacent two or more of components are preferably mutually bonded to form a substituted or unsubstituted "unsaturated ring" formed of a plurality of atoms of the basic skeleton, and 1 to 15 atoms of at least one element selected from the group consisting of carbon, nitrogen, oxygen and sulfur.

When the "monocyclic ring" or the "fused ring" has a substituent, the substituent is the substituent described in later-described "optional substituent." When the "monocyclic ring" or the "fused ring" has a substituent, specific examples of the substituent are the substituents described in the above under the subtitle "Substituent Mentioned Herein."

When the "saturated ring" or the "unsaturated ring" has a substituent, the substituent is the substituent described in later-described "optional substituent." When the "monocyclic ring" or the "fused ring" has a substituent, specific examples of the substituent are the substituents described in the above under the subtitle "Substituent Mentioned Herein."

The above is the description for the instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (sometimes referred to as an instance of "bonded to form a ring").

Substituent for Substituted or Unsubstituted Group

In an exemplary embodiment herein, the substituent for the substituted or unsubstituted group (sometimes referred to as an "optional substituent". hereinafter), is for instance, a group selected from the group consisting of an unsubstituted alkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, —Si($R_{901}$)($R_{902}$)($R_{903}$), —O—($R_{904}$), —S—($R_{905}$), —N($R_{906}$)($R_{907}$), a halogen atom, a cyano group, a nitro group, an unsubstituted aryl group having 6 to 50 ring carbon atoms, and an unsubstituted heterocyclic group having 5 to 50 ring atoms;

- $R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;
- when two or more $R_{901}$ are present, the two or more $R_{901}$ are mutually the same or different;
- when two or more $R_{902}$ are present, the two or more $R_{902}$ are mutually the same or different;
- when two or more $R_{903}$ are present, the two or more $R_{903}$ are mutually the same or different;
- when two or more $R_{904}$ are present, the two or more $R_{904}$ are mutually the same or different;
- when two or more $R_{905}$ are present, the two or more $R_{905}$ are mutually the same or different;
- when two or more $R_{906}$ are present, the two or more $R_{906}$ are mutually the same or different; and
- when two or more $R_{907}$ are present, the two or more $R_{907}$ are mutually the same or different.

In an exemplary embodiment, the substituent for the substituted or unsubstituted group is a group selected from the group consisting of an alkyl group having 1 to 50 carbon atoms, an aryl group having 6 to 50 ring carbon atoms, and a heterocyclic group having 5 to 50 ring atoms.

In an exemplary embodiment, the substituent for the substituted or unsubstituted group is a group selected from the group consisting of an alkyl group having 1 to 18 carbon atoms, an aryl group having 6 to 18 ring carbon atoms, and a heterocyclic group having 5 to 18 ring atoms.

Specific examples of the above optional substituent are the same as the specific examples of the substituent described in the above under the subtitle "Substituent Mentioned Herein."

Unless otherwise specified herein, adjacent ones of the optional substituents may form a "saturated ring" or an "unsaturated ring," preferably a substituted or unsubstituted saturated five-membered ring, a substituted or unsubstituted saturated six-membered ring, a substituted or unsubstituted unsaturated five-membered ring, or a substituted or unsubstituted unsaturated six-membered ring, more preferably a benzene ring.

Unless otherwise specified herein, the optional substituent may further include a substituent. Examples of the substituent for the optional substituent are the same as the examples of the optional substituent.

Herein, numerical ranges represented by "AA to BB" represent a range whose lower limit is the value (AA) recited before "to" and whose upper limit is the value (BB) recited after "to."

First Exemplary Embodiment

Organic Electroluminescence Device

An organic EL device according to the exemplary embodiment includes an anode, a cathode and an emitting layer disposed between the anode and the cathode. The emitting layer includes a first emitting layer and a second emitting layer. The first emitting layer contains a first host material and a first luminescent compound. The second emitting layer contains a second host material and a second luminescent compound.

The first host material and the second host material are mutually different. The first luminescent compound and the second luminescent compound are mutually the same or different.

A triplet energy of the first host material $T_1(H1)$ and a triplet energy of the second host material $T_1(H2)$ satisfy a relationship of a numerical formula (Numerical Formula 1) below, and a diffusion coefficient $D_1$ of the triplet energy of the first host material $T_1(H1)$ calculated according to a diffusion equation is $3.0\times10^{-9}$ ($cm^2/s$) or more.

$$T_1(H1) > T_1(H2) \qquad \text{(Numerical Formula 1)}$$

In the organic EL device according to the exemplary embodiment, the diffusion coefficient $D_1$ of the triplet energy of the first host material $T_1(H1)$ is determined by: preparing a diffusion rate analysis layer including a first analysis layer and a second analysis layer that are layered, the first analysis layer containing the first host material and a first phosphorescent complex, the second analysis layer containing the first host material and a second phosphorescent complex; making an excitation light enter the first analysis layer to be transmitted from the second analysis layer to obtain a transmitted light; measuring a transient PL spectrum of the transmitted light; and calculating the diffusion coefficient $D_1$ based on the measured transient PL spectrum according to a diffusion equation.

The triplet energy of the first host material $T_1$(H1) and the triplet energy of the first phosphorescent complex $T_1$(C1) satisfy a numerical formula (Numerical Formula X) below.

The triplet energy of the first host material $T_1$(H1) and the triplet energy of the second phosphorescent complex $T_1$(C2) satisfy a numerical formula (Numerical Formula Y) below.

$$T_1(C1) > T_1(H1) \quad \text{(Numerical Formula X)}$$

$$T_1(H1) > T_1(C2) \quad \text{(Numerical Formula Y)}$$

The inventors have found that the luminous efficiency of an organic EL device in which the first emitting layer and the second emitting layer are layered is further improvable by selecting a first host material and a second host material that satisfy the relationship of the numerical formula (Numerical Formula 1), the first host material being a material with $3.0\times10^{-9}$ ($cm^2$/s) or more of the diffusion coefficient $D_1$ of the triplet energy $T_1$(H1) calculated according to the diffusion equation.

First, Triplet-Triplet-Annihilation (occasionally referred to as TTA.), known as the technology for enhancing the luminous efficiency of the organic EL device, will be described.

Conventionally, Triplet-Triplet-Annihilation (occasionally referred to as TTA) is known as a technique for enhancing the luminous efficiency of the organic electroluminescence device. TTA is a mechanism in which triplet excitons collide with one another to generate singlet excitons. The TTA mechanism is also referred to as a TTF mechanism.

The TTF phenomenon will be described. Holes injected from an anode and electrons injected from a cathode are recombined in an emitting layer to generate excitons. As for the spin state, as is conventionally known, singlet excitons account for 25% and triplet excitons account for 75%. In a conventionally known fluorescent device, light is emitted when singlet excitons of 25% are relaxed to the ground state. The remaining triplet excitons of 75% are returned to the ground state without emitting light through a thermal deactivation process. Accordingly, the theoretical limit value of the internal quantum efficiency of the conventional fluorescent device is believed to be 25%.

The behavior of triplet excitons generated within an organic substance has been theoretically examined. According to S. M. Bachilo et al. (J. Phys. Chem. A, 104, 7711 (2000)), assuming that high-order excitons such as quintet excitons are quickly returned to triplet excitons, triplet excitons (hereinafter abbreviated as $^3A^*$) collide with one another with an increase in density thereof, whereby a reaction shown by the following formula occurs. In the formula, $^1A$ represents the ground state and $^1A^*$ represents the lowest singlet excitons.

$$^3A^* + {}^3A^* \rightarrow (4/9)^1A + (1/9)^1A^* + (13/9)^3A^*$$

In other words, $5^3A^* \rightarrow 4^1A + 1A^*$ is satisfied, and it is expected that, among triplet excitons initially generated, which account for 75%, one fifth thereof (i.e., 20%) is changed to singlet excitons. Accordingly, the amount of singlet excitons which contribute to emission is 40%, which is a value obtained by adding 15% (75%×(1/5)=15%) to 25%, which is the amount ratio of initially generated singlet excitons. At this time, a ratio of luminous intensity derived from TTF (TTF ratio) relative to the total luminous intensity is 15/40, i.e., 37.5%. Assuming that singlet excitons are generated by collision of initially generated triplet excitons accounting for 75% (i.e., one singlet exciton is generated from two triplet excitons), a significantly high internal quantum efficiency of 62.5% is obtained, which is a value obtained by adding 37.5% (75%×(1/2)=37.5%) to 25% (the amount ratio of initially generated singlet excitons). At this time, the TTF ratio is 37.5/62.5=60%.

Significance of Triplet Energy of First Host Material $T_1$(H1) in First Emitting Layer and Triplet Energy of Second Host Material $T_1$(H2) in Second Emitting Layer Satisfying Relationship of Numerical Formula (Numerical Formula 1)

Subsequently, the significance of the triplet energy of the first host material $T_1$(H1) in the first emitting layer and the triplet energy of the second host material $T_1$(H2) in the second emitting layer satisfying the relationship of the numerical formula (Numerical Formula 1) will be described below.

In the organic EL device according to the exemplary embodiment, it is considered that triplet excitons generated by recombination of holes and electrons in the first emitting layer and present on an interface between the first emitting layer and organic layer(s) in direct contact therewith are not likely to be quenched even under the presence of excessive carriers on the interface between the first emitting layer and the organic layer(s). For instance, the presence of a recombination region locally on an interface between the first emitting layer and a hole transporting layer or an electron blocking layer is considered to cause quenching by excessive electrons. Meanwhile, the presence of a recombination region locally on an interface between the first emitting layer and an electron transporting layer or a hole blocking layer is considered to cause quenching by excessive holes.

The organic EL device according to the exemplary embodiment includes at least two emitting layers (i.e., the first emitting layer and the second emitting layer) so as to satisfy the relationship of the numerical formula (Numerical Formula 1), and thereby triplet excitons generated in the first emitting layer can transfer to the second emitting layer without being quenched by excessive carriers and be inhibited from back-transferring from the second emitting layer to the first emitting layer. Consequently, the second emitting layer exhibits the TTF mechanism to effectively generate singlet excitons, thereby improving the luminous efficiency.

Accordingly, the organic EL device includes, as different regions, the first emitting layer mainly generating triplet excitons and the second emitting layer mainly exhibiting the TTF mechanism using triplet excitons having transferred from the first emitting layer, and a difference in triplet energy is provided by using a compound having a smaller triplet energy than that of the first host material in the first emitting layer as the second host material in the second emitting layer, thereby improving the luminous efficiency.

Subsequently, the significance of using the first host material with $3.0\times10^{-9}$ ($cm^2$/s) or more of a diffusion coefficient $D_1$ of the triplet energy $T_1$(H1) in the organic EL device according to the exemplary embodiment will be described.

As described above, in order to improve the luminous efficiency, the organic EL device of the exemplary embodiment is designed by layering the emitting layers and also using the first host material and the second host material that satisfy the relationship of the numerical formula (Numerical Formula 1).

Singlet excitons generated in the first host material energy-transfer to singlet excitons of the first luminescent compound and then emit light, whereas triplet excitons generated in the first host material have a longer lifetime and cause self-quenching and therefore are unlikely to contribute to the emission in the first emitting layer. Efficient energy transfer (diffusion) of such triplet excitons to the second host material and the second luminescent compound is important for improving the device performance.

According to the organic EL device of the exemplary embodiment, selecting, as the first host material, a material with a diffusion coefficient $D_1$ of the triplet energy $T_1(H1)$ being large ($3.0\times10^{-9}$ ($cm^2/s$) or more), in addition to the satisfaction of the relationship of the numerical formula (Numerical Formula 1), is considered to cause more energy transfer of the triplet excitons generated in the first host material to the second host material and the second luminescent compound in the second emitting layer, so that the energy-transferred triplet excitons are effectively utilized for the emission in the second emitting layer. That is considered to result in the further improvement in luminous efficiency.

The triplet excitons generated in the first host material diffuse in greater amount into the second emitting layer, thereby reducing load on emitting sites in the first emitting layer. This is considered to result in the improvement also in the drive lifetime of the device.

Diffusion Coefficient $D_1$

In the organic EL device according to the exemplary embodiment, the diffusion coefficient $D_1$ of the triplet energy of the first host material $T_1(H1)$ satisfies a numerical formula (Numerical Formula 6) below.

The diffusion coefficient $D_1$ of the triplet energy of the first host material $T_1(H1)$ preferably satisfies a numerical formula (Numerical Formula 6A) below, more preferably satisfies a numerical formula (Numerical Formula 6B) below. The upper limit of the diffusion coefficient $D_1$ is preferably at a level that does not inhibit TTF in the second host material, and is for instance, $1.0\times10^{-5}$ ($cm^2/s$) or less.

$$D_1 \geq 3.0\times10^{-9}(cm^2/s) \quad \text{(Numerical Formula 6)}$$

$$D_1 \geq 5.0\times10^{-9}(cm^2/s) \quad \text{(Numerical Formula 6A)}$$

$$D_1 \geq 1.0\times10^{-8}(cm^2/s) \quad \text{(Numerical Formula 6B)}$$

Calculation Method of Diffusion Coefficient $D_1$

The diffusion coefficient $D_1$ of the triplet energy of the first host material $T_1(H1)$ is calculated by:

(1) preparing a transient PL data measurement sample including a diffusion rate analysis layer;

(2) measuring a transient PL spectrum using the transient PL data measurement sample; and (3) numerically solving a diffusion equation represented by a numerical formula (100) described below based on the transient PL spectrum measured.

The above-described (1) to (3) will be described in order.

(1) Preparation of Transient PL Data Measurement Sample Including Diffusion Rate Analysis Layer The transient PL data measurement sample is produced by forming a diffusion rate analysis layer on a glass substrate and sealing the diffusion rate analysis layer with a sealing glass.

The diffusion rate analysis layer is produced by layering a first analysis layer and a second analysis layer, the first analysis layer being given by adding a first phosphorescent complex to a first host material, the second analysis layer being given by adding a second phosphorescent complex to a first host material.

The first host material and the first phosphorescent complex that are contained in the first analysis layer are selected so that the respective triplet energies $T_1$ satisfy the relationship of the numerical formula (Numerical Formula X).

The first host material and the second phosphorescent complex that are contained in the second analysis layer are selected so that their triplet energies $T_1$ satisfy the relationship of the numerical formula (Numerical Formula Y).

The first phosphorescent complex and the second phosphorescent complex are preferably selected according to the triplet energy of the first host material $T_1(H1)$.

For instance, when $2.2\ eV \geq T_1(H1) \geq 2.0\ eV$ is satisfied, the first phosphorescent complex is preferably $Ir(ppy)_3$ and the second phosphorescent complex is preferably $Ir(piq)_2(acac)$. The structures of $Ir(ppy)_3$ and $Ir(piq)_2(acac)$ will be shown below.

When $2.0\ eV > T_1(H1) \geq 1.9\ eV$ is satisfied, $Ir(ppy)_3$ is usable as the first phosphorescent complex and PtOEP (platinum octaethyl porphyrin) is usable as the second phosphorescent complex.

[Formula 22]

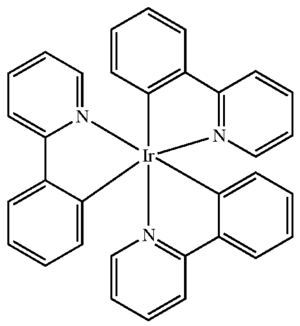

$Ir(ppy)_3$

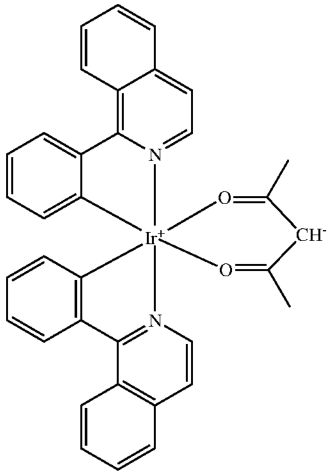

$Ir(piq)_2(acac)$

The transient PL data measurement sample is produced, for instance, by the following procedure.

A compound Target serving as the first host material and a compound C2 serving as the second phosphorescent complex are co-deposited on a glass substrate to form a second analysis layer.

Subsequently, a compound Target serving as the first host material and a compound C1 serving as the first phosphorescent complex are co-deposited on the second analysis layer to form a first analysis layer. In this way, the diffusion rate analysis layer including the first analysis layer and the second analysis layer that are layered on the glass substrate is obtained.

The diffusion rate analysis layer is then sealed with a sealing glass.

Through the foregoing procedures, the transient PL data measurement sample is obtained.

The compounds Target, C1 and C2 are selected so as to satisfy the numerical formulae (Numerical Formula X) and (Numerical Formula Y).

A film thickness of the first analysis layer d1 is adjusted to be in a range from 10 nm to 200 nm. A film thickness of the second analysis layer d2 is adjusted to be in a range from 10 nm to 200 nm.

The arrangement of the transient PL data measurement sample is roughly shown below, with d1=100 nm and d2=20 nm.

Transmitted-Light Side/Glass (0.7 mm)/Compound Target: Compound C2 (20 nm, 95%:5%)/Compound Target:Compound C1 (100 nm, 80%:20%)/Sealing Glass (0.6 mm)/ Incident-Light Side Numerals in parentheses indicate film thickness. The numerals (95%:5%) represented by percentage in the same parentheses indicate the ratios (mass %) between the compound Target and the compound C2. The numerals (80%: 20%) represented by percentage in the same parentheses indicates the ratios (mass %) between the compound Target and the compound C1.

(2) Measurement of Transient PL Spectrum

An excitation light enters the transient PL data measurement sample produced in (1) above from a side closer to the first analysis layer and is transmitted from the second analysis layer. A transient PL spectrum of the transmitted light is measured. Specifically, a delayed luminescence component of the compound C2 (second phosphorescent complex) in the second analysis layer is measured as the transient PL spectrum under the following conditions (measurement system).

Conditions: Light source used; NanoLED-340

Detector: PPD850 produced by HORIBA, Ltd.

Detection wavelength: 620 nm

The delayed luminescence component of the compound C2 (second phosphorescent complex) corresponds to an intensity at a peak wavelength of the emission spectrum of the second phosphorescent complex.

In general, photoexcitation of organic compounds not containing heavy atoms usually causes the formation of singlet excitons due to forbidden transition of triplet excitons (triplets). Therefore, as a sensitizer that converts singlet excitons of the first host material into triplet excitons, the compound C1 (the first phosphorescent complex) that satisfies the relationship of the numerical formula (Numerical Formula X) is used. By the use of the compound C1 as a sensitizer, singlet excitons are converted to triplet excitons, and furthermore the triplet excitons generated by the compound C1 energy-transfer to the triplet excitons of the first host material.

Therefore, the singlet excitons of the first host material generated in the first analysis layer are in a slight amount, and thus energy transfer of the singlet excitons from the first host material is negligible.

Since the relationships of the numerical formulae (Numerical Formula X) and (Numerical Formula Y) are satisfied regarding a difference in a lowest triplet excitation level between the first host material and the compound C1 and a difference in a lowest triplet excitation level between the first host material and the compound C2, the reverse energy transfer from the compound C1 and the compound C2 to the first host material is also negligible.

The transient PL spectrum measured will be described.

FIG. 1 illustrates a transient PL spectrum of the transient PL data measurement sample 1 produced using a compound BH1-C (first host material) below as the compound Target.

Figure 2A:
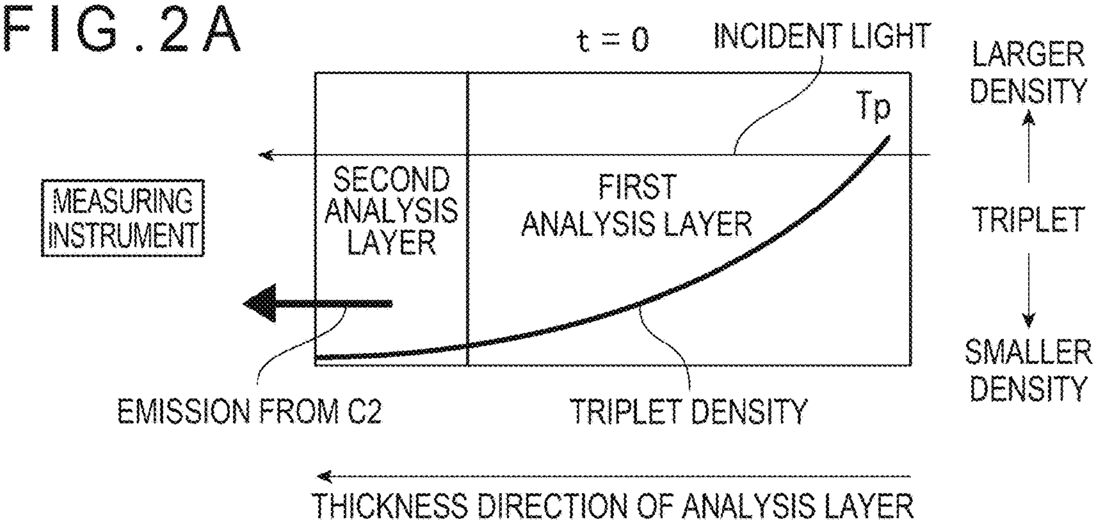
FIG. 2A illustrates behavior and density of triplets exhibited when excitation light was incident on the transient PL data measurement sample 1.
Figure 2B:
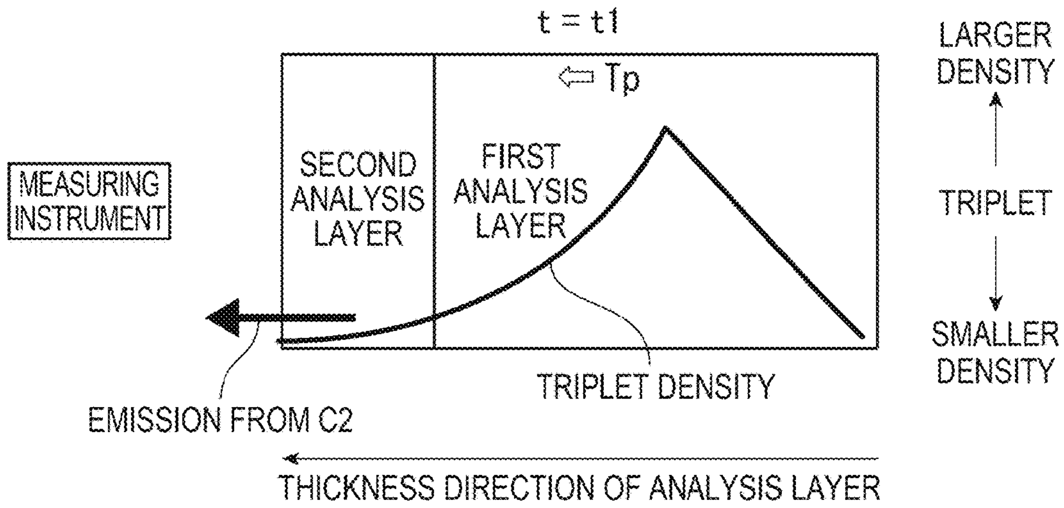
FIG. 2B illustrates behavior and density of triplets exhibited when time $t_1$ elapsed after excitation light was incident on the transient PL data measurement sample 1.
Figure 2C:
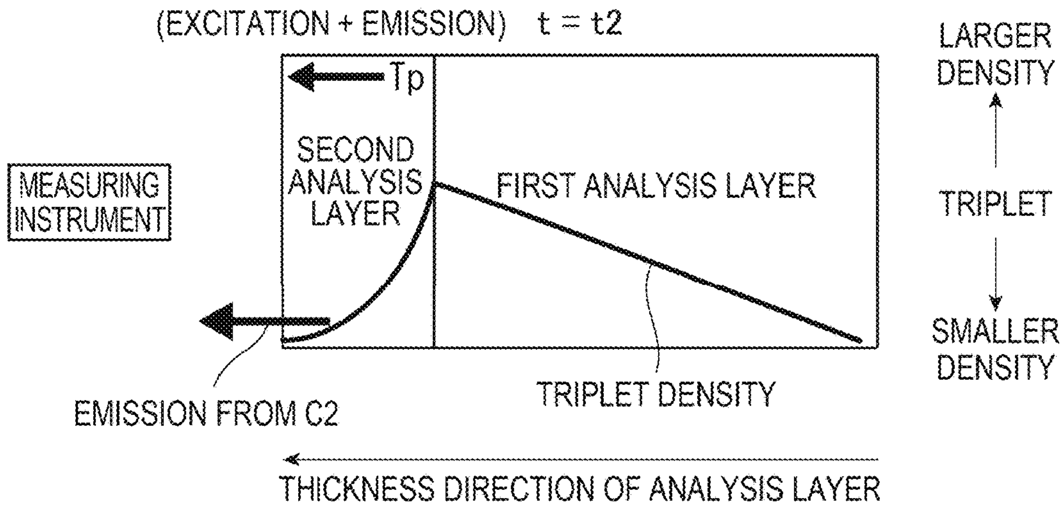
FIG. 2C illustrates behavior and density of triplets exhibited when time $t_2$ elapsed after excitation light was incident on the transient PL data measurement sample 1.

FIGS. 2A to 2C illustrate behaviors and densities of triplets exhibited at the time excitation light (incident light) was incident on the transient PL data measurement sample 1 (t=0), time $t_1$ elapsed, and time $t_2$ elapsed.

In FIGS. 2A to 2C, Tp indicates triplets and "emission from C2" indicates emission from the compound C2 (second phosphorescent complex).

[Formula 23]

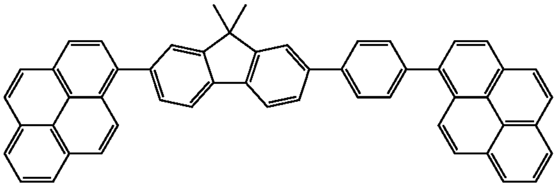

BH1-C

In FIG. 1, the arrangement of the transient PL data measurement sample 1 is roughly shown below.

Transmitted-Light Side of Transient PL Data Measurement Sample 1/Glass (0.7 mm)/Compound BH1-C: $Ir(Piq)_2$ (Acac) (20, 95%:5%)/Compound BH1-C: $Ir(Ppy)_3$ (100, 80%:20%)/Sealing Glass (0.6 mm)/Incident-Light Side In FIG. 1, t=0 indicates that the excitation light (incident light) was incident on the transient PL data measurement sample, $t=t_1$ indicates that time $t_1$ elapsed since the incidence of light, and $t=t_2$ indicates that time $t_2$ elapsed since the incidence of light. The same corresponds to t=0, $t=t_1$ and $t=t_2$ indicated in FIGS. 2A to 2C.

The behaviors of the triplets will be specifically described.

It is shown in FIG. 1 and FIG. 2A that when the excitation light was incident from a side where the first analysis layer was provided at t=0, the compound C1 (first phosphorescent complex) was excited by the incident light to produce triplets Tp in an amount corresponding to an amount of absorption of the excitation light. The excitons are generated in an amount in accordance with Lambert's law, which is represented by a numerical formula (Numerical Formula 10B) below. It is assumed that all the energy absorbed here is converted into the triplets.

[Numerical Formula 1]

$$-\log\left(\frac{T(x)}{T_0}\right) = Ax \tag{10B}$$

T(x): Triplet concentration ($cm^{-3}$) at position x in the measurement sample

A: Absorbance coefficient/cm

To: Triplet concentration/$cm^3$ generated at t=0 at light incident end (x=0)

It is shown in FIG. 1 and FIG. 2B that at $t=t_1$, the triplets Tp generated in the first analysis layer diffuse toward the second analysis layer on the basis of the relationship represented in the numerical formula (Numerical Formula 1).

It is shown in FIG. 1 and FIG. 2C that at $t=t_2$, the triplets Tp having diffused to the second analysis layer and reached the second phosphorescent complex emit phosphorescence. The phosphorescence emission from the second analysis layer is derived both from triplets generated when the compound C2 was excited by the incident light and from triplets Tp having diffused from the first analysis layer ("emission from C2" in FIG. 2C).

Using the model described above (the behaviors of the triplets Tp), the diffusion coefficient $D_1$ of the triplet energy $T_1$(H1) is calculated from the transient PL spectrum (light intensity) according to a diffusion equation represented by a numerical formula (Numerical Formula 100A) below.

The calculation is made assuming that generation and inflow of energy to x=0 at t>0 do not occur (T(t>0, x=0)=0).

(3) Calculation of Diffusion Coefficient $D_1$ of Triplet Energy of First Host Material $T_1$(H1)

The diffusion coefficient $D_1$ of the triplet energy of the first host material $T_1$(H1) is calculated by the following procedure.

Description will be provided below on how to calculate the diffusion coefficient $D_1$ of the triplet energy of the first host material $T_1$(H1) according to the diffusion equation represented by the numerical formula (Numerical Formula 100A) below on the basis of the measurement result of the transient PL spectrum of the transient PL data measurement sample 1 illustrated in FIG. 1.

[Numerical Formula 2]

$$\frac{\partial T}{\partial t} = D\frac{\partial^2 T}{\partial x^2} - k_{tt}T^2 - k_tT \qquad (100A)$$

T: Triplet concentration [$cm^{-3}$]

D: Diffusion coefficient [$cm^2$/s]

$k_{tt}$: TTF rate [$cm^{-3}$/s]

$k_t$: Self-quenching rate [/s]

A numerical analysis method for the diffusion equation will be described.

The numerical analysis method to be applied is an explicit method. The explicit method, as illustrated in Table 1 (see FIG. 10A), is a method of dividing space and time into grids, sequentially calculating values below, and finally calculating an overall value. In the case of the transient PL data measurement sample 1, when space is x and time is t (the space being defined as a thickness direction extending from a surface of the first analysis layer on a side closer to the incident light (x=0 in Table 2 (see FIG. 10B)) to a surface of a second analysis layer on a side closer to a measuring instrument (x=A in Table 2 (see FIG. 10B)), "spatial-temporal distribution of Triplet concentration T(x,t)" is created, for instance, as shown in Table 2 (see FIG. 10B). In Table 2 (see FIG. 10B), T1 concentration indicates Triplet concentration.

Figure 10A:
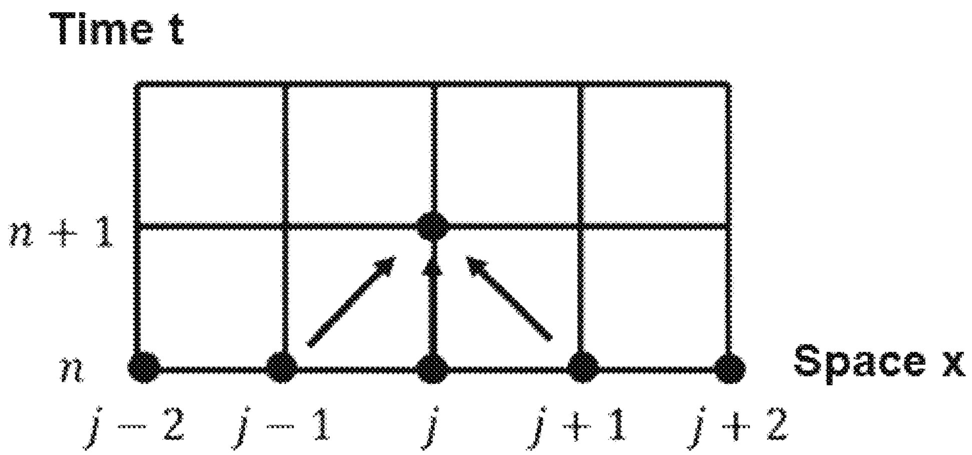
FIG. 10A shows Table 1.
Figure 10B:
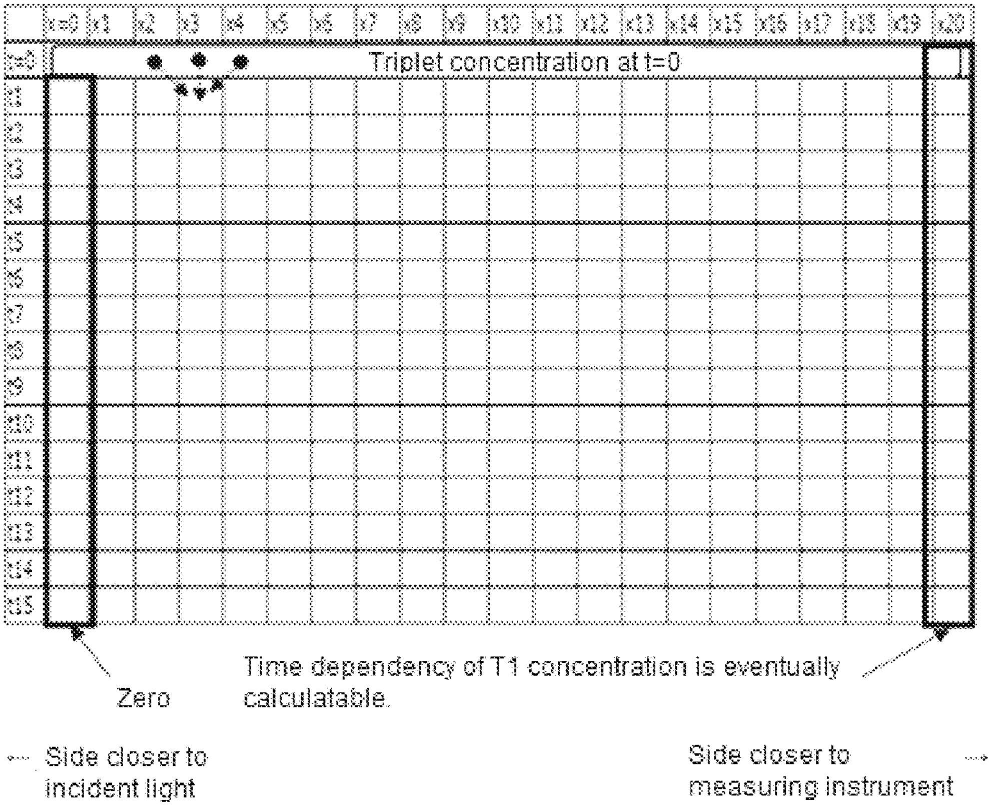
FIG. 10B shows Table 2.

In the transient PL data measurement sample 1, since the total thickness of the first and second analysis layers is 120 nm, A in x=A corresponds to 120 nm in Table 2 (see FIG. 10B). Therefore, space x1 to space x20 respectively represent 20 divided spaces of the first analysis layer and the second analysis layer in the thickness direction.

Similarly, in Table 2 (see FIG. 10B), t15 in time t=t15 corresponds to $t_2$ in FIG. 1. Therefore, time t1 to time t15 respectively represent 15 divided times of the time $t_2$.

Table 1 is shown as FIG. 10A

Table 2 is shown as FIG. 10B.

Here, a value to be calculated in each of the cells in Table 2 (see FIG. 10B), due to representing a spatial-temporal distribution T(x,t) of Triplet concentration, needs to be converted into emission.

When the iridium complex is excited, a luminous intensity Int(t) is obtained in a time-dependent manner. The luminous intensity of the iridium complex at time t is represented by a numerical formula (Numerical Formula 101) below.

[Numerical Formula 3]

$$\mathrm{Int}(t) = \sum_{\tau = 0 \sim t} T(\tau) \times I(\tau) \qquad (101)$$

T: Triplet concentration [$cm^{-3}$]

τ: Triplet emission lifetime [s]

I: Normalized luminous intensity [a.u.]

Fitting of a transient PL spectrum of the transient PL data measurement sample 1 is performed by the method of least squares.

Figure 3:
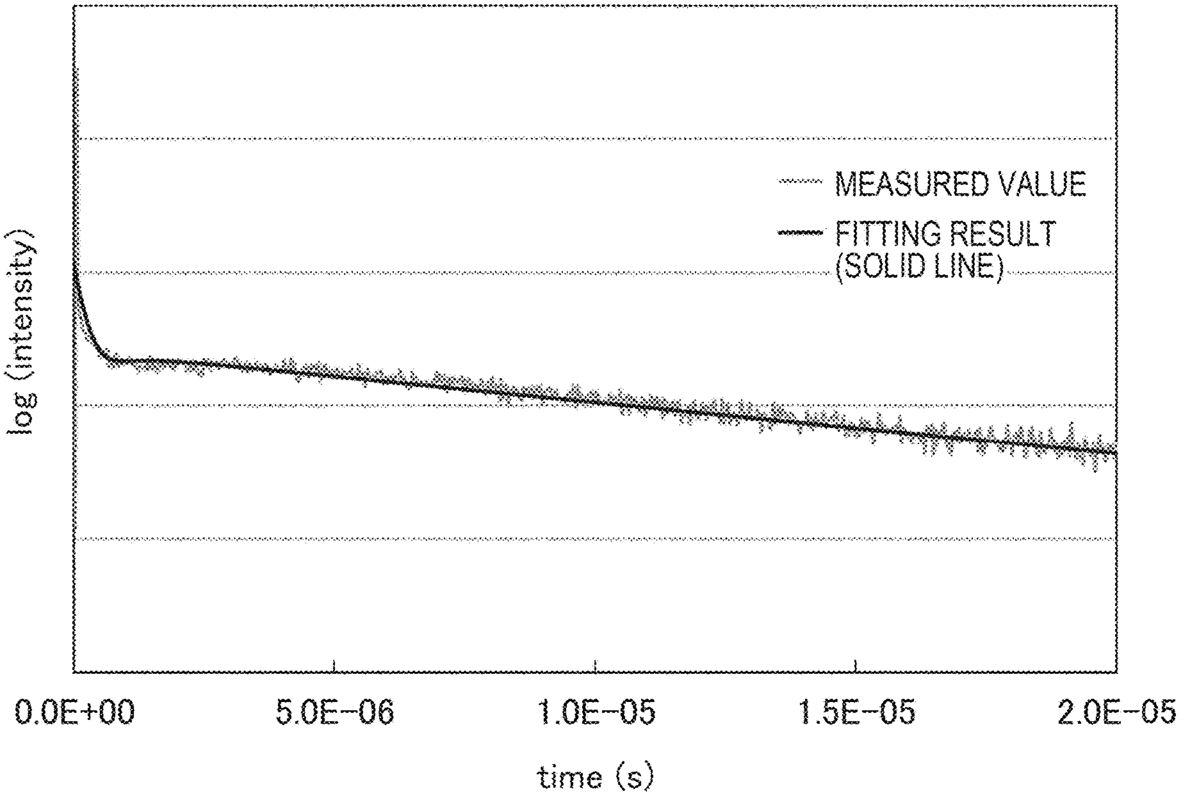
FIG. 3 illustrates a transient PL spectrum of the transient PL data measurement sample 1 and a transient PL spectrum thereof obtained after fitting.

FIG. 3 illustrates a transient PL spectrum of the transient PL data measurement sample 1 and a transient PL spectrum thereof obtained after fitting.

Subsequently, a diffusion coefficient (D), a TTF rate ($k_{tt}$) and a self-quenching rate ($k_t$) are determined from the diffusion equation represented by the numerical formula (Numerical Formula 100A). The time range used for the fitting is from t=0 to 1.0E-05 (sec). Here, E represents a power of 10.

The diffusion coefficient (D) calculated is defined as the diffusion coefficient $D_1$ of the triplet energy of the compound BH1-C (first host material) $T_1$(H1). In such a manner as described above, the diffusion coefficient $D_1$ of the triplet energy of the first host material $T_1$(H1) is calculated.

TTF Ratio

In the organic EL device according to the exemplary embodiment, the first host material and the second host material that satisfy the relationship of the numerical formula (Numerical Formula 1) are included and the first host material having the diffusion coefficient $D_1$ of the triplet energy $T_1$(H1) being $3.0\times10^{-9}$ ($cm^2$/s) or more is selected, a high value of a ratio of the luminous intensity derived from TTF relative to the entire emission of the organic EL device is achievable.

The ratio of the luminous intensity derived from TTF is measurable by a transient EL method. The transient EL method is a method for measuring decay behavior (transient property) of EL emission after DC voltage applied on the device is removed. EL luminous intensity is classified into a luminescence component from singlet excitons generated in first recombination and a luminescence component from singlet excitons generated through TTF phenomenon. Since lifetime of the singlet excitons is very short at nano-second order, the emission therefrom rapidly decays after removal of DC voltage.

On the other hand, since the TTF phenomenon provides emission from singlet excitons generated through long-life triplet excitons, the emission therefrom gradually decays. Thus, since there is a large difference in time between emission from the singlet excitons and emission from the triplet excitons, a luminous intensity derived from TTF is obtainable. Specifically, the luminous intensity can be determined by the following method.

Figure 7:
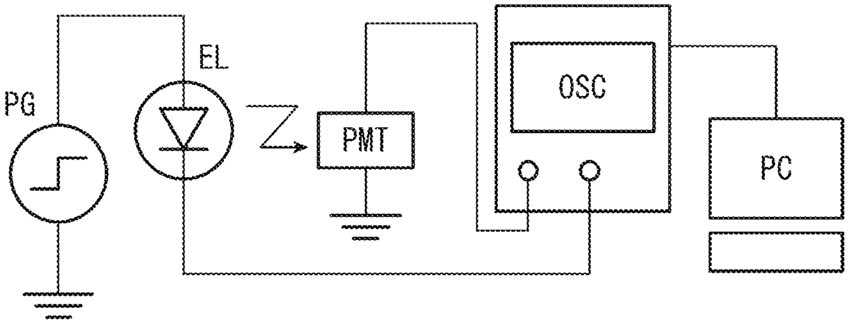
FIG. 7 depicts a transient EL waveform measurement system.

Transient EL waveform is measured as follows (see FIG. 7). Pulse voltage waveform output from a voltage pulse generator (PG) is applied on an EL device. The applied voltage waveform is loaded in an oscilloscope (OSC). When a pulse voltage is applied on the EL device, the EL device generates pulse emission. This emission is loaded in the oscilloscope (OSC) through a photomultiplier (PMT). The voltage waveform and the pulse emission are synchronized and loaded in a personal computer (PC).

A ratio of the luminous intensity derived from TTF is determined as follows based on analysis of the transient EL waveform.

A rate equation for decay behavior of triplet excitons is resolved, whereby the decay behavior of luminous intensity based on TTF phenomenon is brought into modeling. Time-varying decay of a density $n_T$ of triplet excitons within the emitting layer is represented by the following rate equation using a decay speed α due to lifetime of the triplet excitons and a decay speed γ due to collision of the triplet excitons.

$$\frac{dn_T}{dt} = -\alpha \cdot n_T - \gamma \cdot n_T^2 \quad \text{[Numerical Formula 4]}$$

When this differential equation is approximately resolved, the following formula is obtained.

In the formula, $I_{TTF}$ represents luminous intensity derived from TTF. A is a constant. Thus, when the transient EL emission is based on TTF, a reciprocal number of the square root of intensity of the transient EL emission is shown by linear approximation. The measured transient EL waveform data is subjected to fitting to the following approximate expression to obtain the constant A. At this time, luminous intensity $1/A^2$ at the time t=0 when DC voltage is removed is defined as the ratio of the luminous intensity derived from TTF.

$$\frac{1}{\sqrt{I_{TTF}}} \propto A \rightarrow \gamma \cdot t \quad \text{[Numerical Formula 5]}$$

Figure 8A:
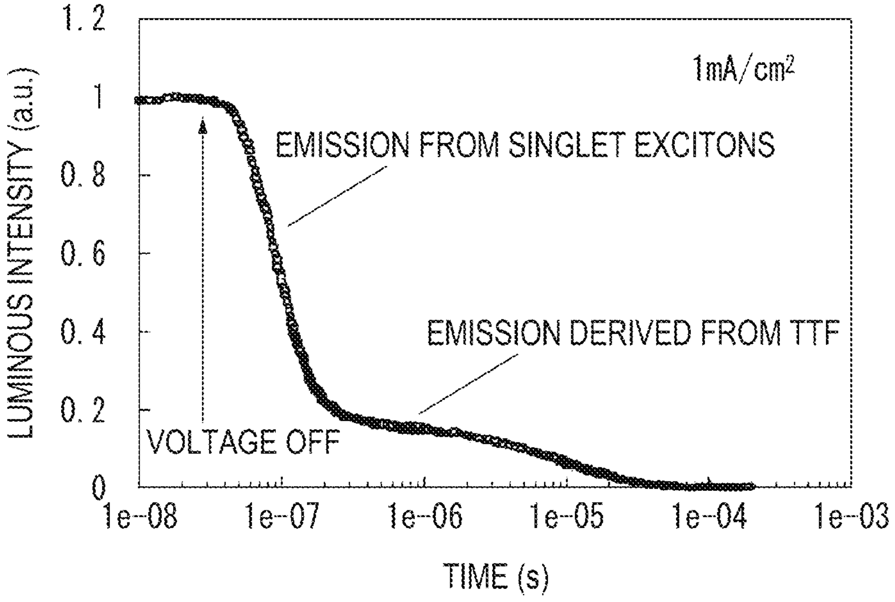
FIG. 8A is a diagram illustrating a method of measuring a ratio of luminous intensity derived from TTF and a time-varying luminous intensity of an EL device.
Figure 8B:
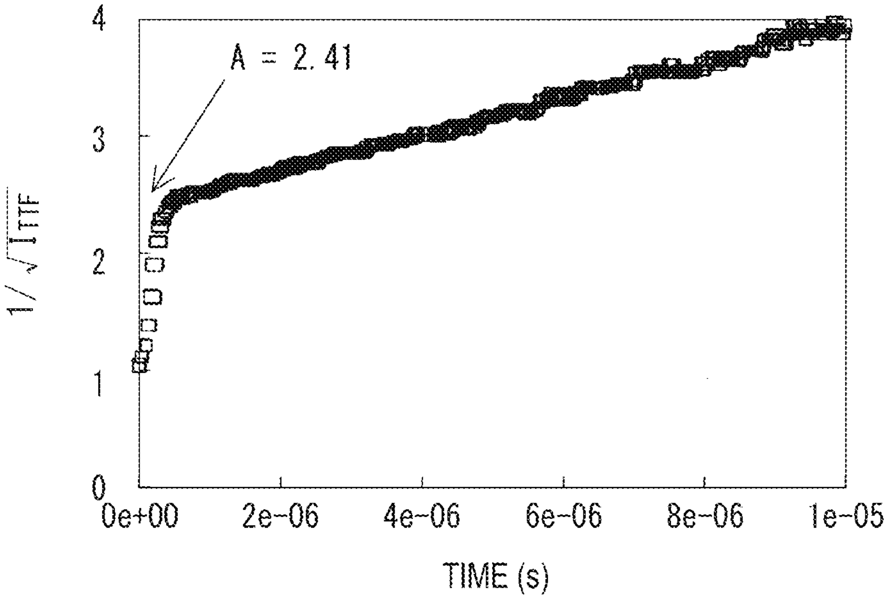
FIG. 8B is a diagram illustrating a method of measuring a ratio of luminous intensity derived from TTF and a time-varying reciprocal of a square root of light intensity.

A graph of FIG. 8(A) illustrates a measurement example where a predetermined DC voltage is applied on the EL device and then the DC voltage is removed and depicts time-varying luminous intensity of the EL device. The DC voltage is removed at the time of about $3\times10^{-8}$ seconds in the graph of FIG. 8(A). In the graph, the luminous intensity when voltage is removed is defined as 1. After rapid decay before the elapse of about $2\times10^{-7}$ seconds, a gradual decay component appears. In the graph of FIG. 8(B), the voltage removal time is determined as the origin and the reciprocal numbers of the square root of the luminous intensity before the elapse of $10^{-5}$ seconds after voltage removal are plotted. The graph can show that the reciprocal numbers of the square root of the luminous intensity are well approximated to a linear line. A value at an intersection A of the ordinate axis and the linear line extended to the origin is 2.41. Accordingly, the ratio of the luminous intensity derived from TTF obtained from the transient EL waveform is $1/2.41^2=0.17$, which means 17% of the entire luminous intensity is derived from TTF.

The fitting to a linear line is preferably conducted by a method of least squares. In this case, the fitting is preferably conducted using the value before the elapse of $10^{-5}$ seconds.

Voltage pulse waveform (pulse width: 500 micro second, frequency: 20 Hz, voltage: equivalent to 0.1 to 100 mA/cm$^2$) output from a pulse generator (8114A: manufactured by Agilent Technologies) was applied. EL emission was input in a photomultiplier ($R_{928}$: manufactured by Hamamatsu Photonics K.K.). The pulse voltage waveform and the EL emission were synchronized and loaded in an oscilloscope (2440: manufactured by Tektronix) to obtain a transient EL waveform.

The transient EL waveform was analyzed to determine a TTF ratio.

Second Exemplary Embodiment

Organic Electroluminescence Device

The organic EL device according to the second exemplary embodiment includes an anode, a cathode, and an emitting layer disposed between the anode and the cathode, in which the emitting layer includes a first emitting layer and a second emitting layer, the first emitting layer contains a first host material and a first luminescent compound, the second emitting layer contains a second host material and a second luminescent compound, the first host material and the second host material are mutually different, the first luminescent compound and the second luminescent compound are mutually the same or different, a triplet energy of the first host material $T_1$(H1) and a triplet energy of the second host material $T_1$(H2) satisfy a relationship of a numerical formula (Numerical Formula 1), and the first host material has a surface potential $V_1$ of −11 (mV/nm) or less.

$$T_1(H1) > T_1(H2) \quad \text{(Numerical Formula 1)}$$

The inventors have found that the luminous efficiency of an organic EL device in which a first emitting layer and a second emitting layer are layered is further improvable by selecting a first host material and a second host material that satisfy the relationship of the numerical formula (Numerical Formula 1) and at the same time by selecting, as the first host material, a material having a surface potential $V_1$ of −11 (mV/nm) or less.

The significance of the triplet energy of the first host material $T_1$(H1) in the first emitting layer and the triplet energy of the second host material $T_1$(H2) in the second emitting layer satisfying the relationship of the numerical formula (Numerical Formula 1) is as described in the first exemplary embodiment.

Subsequently, the significance of using the first host material having a surface potential $V_1$ of −11 (mV/nm) or less in the organic EL device according to the second exemplary embodiment will be described.

In order to improve the luminous efficiency, the organic EL device of the second exemplary embodiment is designed by layering the emitting layers and furthermore using the first host material and the second host material that satisfy the relationship of the numerical formula (Numerical Formula 1).

The recombination of holes and electrons in the first emitting layer generates singlet and triplet excitons in the first host material. Singlet excitons generated in the first host material energy-transfer to singlet excitons of the first luminescent compound and thereafter emit light, whereas triplet excitons generated in the first host material have a longer life and cause self-quenching and therefore are unlikely to contribute to the emission in the first emitting layer. Therefore, it is important to recombine holes and electrons as much as possible in the first emitting layer to improve the device performance.

In the organic EL device according to the second exemplary embodiment, when the first emitting layer and the second emitting layer are layered in this order from the anode side (hereafter, occasionally referred to as being "normally-layered"), selecting a material with a surface potential $V_1$ that is a larger negative value (−11 (mV/nm) or less) as the first host material causes an energy level of the first emitting layer toward the second emitting layer to be a larger negative value. As a result, holes enter the first emitting layer more easily from the anode, which increases the recombination probability in the first emitting layer, resulting in improved luminous efficiency.

Selecting a material with a surface potential $V_1$ that is a larger negative value (−11 (mV/nm) or less) as the first host material causes the first host material to be biased in the directions opposite to energies of hole and electron charges, leading to the suppression of wasteful carrier accumulation. That is considered to lead to suppression of charge quenching, resulting in improvement in luminous efficiency.

In the organic EL device according to the second exemplary embodiment, since the first emitting layer has a relatively thin film thickness (preferably in a range from 2 nm to 20 nm), the larger negative value of the surface potential $V_1$ is more preferable from the viewpoint of the exhibition of the improvement in luminous efficiency.

In the organic EL device according to the second exemplary embodiment, when the second emitting layer and the first emitting layer are layered in this order from the anode side (hereafter, occasionally referred to as being "reversely-layered"), selecting a material with a surface potential $V_1$ that is a larger negative value (−11 (mV/nm) or less) as the first host material causes the energy level of the first emitting layer toward the cathode to be larger negative value. As a result, electrons enter the first emitting layer more easily from the cathode side, which increases the probability of recombination in the first emitting layer. Therefore, even when the emitting layers are reversely-layered, the same effect as that exhibited when the emitting layers are normally-layered is expected.

Surface Potential $V_1$

In the organic EL device according to the second exemplary embodiment, the surface potential of the first host material $V_1$ (mV/nm) satisfies a numerical formula (Numerical Formula 10) below.

The surface potential of the first host material $V_1$ preferably satisfies a numerical formula (Numerical Formula 10A) below. The larger negative value of the surface potential of the first host material $V_1$ is more preferable, but the lower limit thereof is −400 (mV/nm) from the viewpoint of suppressing excessive voltage increase.

$$V_1 \leq -11\,(\mathrm{mV/nm}) \quad \text{(Numerical Formula 10)}$$

$$V_1 \leq -15\,(\mathrm{mV/nm}) \quad \text{(Numerical Formula 10A)}$$

Surface Potential of First Host Material $V_1$

The surface potential of the first host material $V_1$ (mV/nm) is calculated by the Kelvin probe method using surface potential measurement samples 1 and 2 produced by a method described below. The surface potential measurement sample 1 is hereinafter sometimes referred to as the sample 1. The surface potential measurement sample 2 is sometimes referred to as the sample 2.

Herein, the "surface potential of the first host material $V_1$ (mV/nm)" is defined as a value given when a difference between a work function W(d2) (unit: mV) of a first host material layer (film thickness d2 (unit: nm)) of the sample 2 and a work function W(d1) (unit: mV) of a first host material layer (film thickness d1 (unit: nm)) of the sample 1 is divided by a difference between a film thickness d2 (unit: nm) of the first host material layer of the sample 2 and a film thickness d1 (unit: nm) of the first host material layer of the sample 1.

That is, herein, a value calculated from a numerical formula (Numerical Formula 100) below is defined as the "surface potential of the first host material $V_1$ (mV/nm)".

$$\text{Surface potential of first host material } V_1 = (W(d2) - W(d1))/(d2 - d1) \quad \text{(Numerical Formula 100)}$$

A production method of the samples 1 and 2 and a measurement method of the surface potential $V_1$ will be described in order.

Production Method of Surface Potential Measurement Samples 1 and 2

The surface potential measurement samples 1 and 2 are produced, for instance, by the following procedure.

A glass substrate with an ITO (Indium Tin Oxide) transparent electrode is prepared.

A compound Target serving as a first host material is vapor-deposited on the glass substrate with the ITO transparent electrode to form a first host material layer with a film thickness d1. In this way, the sample 1 is obtained.

A compound Target serving as a first host material is vapor-deposited on a glass substrate with an ITO transparent electrode to form a first host material layer with a film thickness d2 different from the film thickness d1. In this way, the sample 2 is obtained.

The film thickness d1 (the film thickness of the first host material layer of the sample 1) is adjusted to be in a range from 10 nm to 100 nm. The film thickness d2 (the film thickness of the first host material layer of the sample 2) is adjusted to be in a range from 10 nm to 100 nm. The difference between the film thickness d2 and the film thickness d1 is adjusted to be in a range from 20 nm to 50 nm.

The arrangements of the samples 1 and 2 are roughly shown below with d1=20 nm and d2=60 nm, respectively.

Sample 1: glass substrate (0.7 mm)/ITO (130 nm)/compound Target (20 nm)

Sample 2: glass substrate (0.7 mm)/ITO (130 nm)/compound Target (60 nm)

Numerals in parentheses indicate film thickness.

Measurement Method of Surface Potential $V_1$

The sample 1 is placed on a sample table so as to face a probe. The probe has a 10 mm-diameter stainless steel electrode (reference electrode) in the cross section.

The stainless steel electrode is vibrated up and down with the probe, and an external electric field Vex is applied between the ITO transparent electrode of the sample 1 and the stainless steel electrode. Vex applied when an output signal reaches 0 mV is defined as the work function W(d1) (mV) of the first host material layer of the sample 1.

For the sample 2, the work function W(d2) (mV) of the first host material layer of the sample 2 is measured in the same manner as in the sample 1.

In the following equipment, values of the work functions W(d1) and W(d2) are corrected by comparison with a reference sample (Au) and output.

The measurement conditions are as follows.

Conditions: Equipment: UHVKP020 manufactured by KP Technology Ltd.

Measurement area: 10 mm in diameter

In the organic EL device according to each of the first and second exemplary embodiments, an absolute value of an energy level of a highest occupied molecular orbital of the first host material HOMO(H1) and an absolute value of an energy level of a highest occupied molecular orbital of the first luminescent compound HOMO($D_1$) preferably satisfy a relationship of a numerical formula (Numerical Formula 2) below.

$$|HOMO(H1)|-|HOMO(D1)|\geq 0.2\text{ eV} \quad \text{(Numerical Formula 2)}$$

When the absolute value of HOMO(H1) and the absolute value of HOMO($D_1$) satisfy the relationship of the numerical formula (Numerical Formula 2), a hole trap occurs more easily. As a result, the recombination occurs more easily in the first emitting layer.

The absolute value of the energy level of the highest occupied molecular orbital of the first host material HOMO (H1) is preferably 7.0 eV or less.

Herein, the energy level of the highest occupied molecular orbital HOMO is measured using a photoelectron spectroscope under atmosphere. Specifically, the energy level of the highest occupied molecular orbital HOMO is measurable by a method described in Examples.

In the organic EL device according to each of the first and second exemplary embodiments, when the first emitting layer and the second emitting layer are layered in this order from the anode side, an electron mobility of the second host material μe(H2) and an electron mobility of the first host material μe(H1) preferably satisfy a relationship of a numerical formula (Numerical Formula 4) below.

$$\mu e(H2)>\mu e(H1) \quad \text{(Numerical Formula 40)}$$

When the first host material and the second host material satisfy the relationship of the numerical formula (Numerical Formula 4), a recombination ability between holes and electrons in the first emitting layer is improved.

In the organic EL device according to each of the first and second exemplary embodiments, when the first emitting layer and the second emitting layer are layered in this order from the anode side, a hole mobility of the first host material μh(H1) and a hole mobility of the second host material μh(H2) also preferably satisfy a relationship of a numerical formula (Numerical Formula 40) below.

$$\mu h(H1)>\mu h(H2) \quad \text{(Numerical Formula 40)}$$

In the organic EL device according to each of the first and second exemplary embodiments, when the first emitting layer and the second emitting layer are layered in this order from the anode side, the hole mobility of the first host material μh(H1), the electron mobility of the first host material μe(H1), the hole mobility of the second host material μh(H2) and the electron mobility of the second host material μe(H2) also preferably satisfy a relationship of a numerical formula (Numerical Formula 40A) below.

$$(\mu e(H2)/\mu h(H2))>(\mu e(H1)/\mu h(H1)) \quad \text{(Numerical Formula 40A)}$$

The electron mobility can be measured as follows according to impedance spectroscopy.

A measurement target layer having a thickness in a range from 100 nm to 200 nm is held between the anode and the cathode, to which a small alternating voltage of 100 mV or less is applied while a bias DC voltage is applied. A value of an alternating current (absolute value and phase) which flows at this time is measured. This measurement is performed while changing a frequency of the alternating voltage, and complex impedance (Z) is calculated from the current value and the voltage value. A frequency dependency of the imaginary part (ImM) of the modulus M=iωZ (i: imaginary unit, ω: angular frequency) is obtained. The reciprocal number of a frequency ω at which the ImM becomes the maximum is defined as a response time of electrons carried in the measurement target layer. The electron mobility is calculated by the following equation.

$$\text{Electron Mobility}=(\text{Film Thickness of Measurement Target Layer})^2/(\text{Response Time}\cdot\text{Voltage})$$

The hole mobility can be measured according to impedance spectroscopy by the same method as for the electron mobility.

The hole mobility is calculated by the following equation.

$$\text{Hole Mobility}=(\text{Film Thickness of Measurement Target Layer})^2/(\text{Response Time}\cdot\text{Voltage})$$

In the organic EL device according to each of the first and second exemplary embodiments, the triplet energy of the first luminescent compound $T_1(D_1)$ and the triplet energy of the second host material $T_1$(H2) preferably satisfy a relationship of a numerical formula (Numerical Formula 3) below.

$$T_1(D1)>T_1(H2). \quad \text{(Numerical Formula 3)}$$

When $T_1(D_1)$ and $T_1$(H2) satisfy the relationship of the numerical formula (Numerical Formula 3), triplets of the second host material occur more easily. As a result, TTF more easily occurs efficiently in the second host material.

In the organic EL device according to each of the first and second exemplary embodiments, the singlet energy of the first host material $S_1$(H1) and the singlet energy of the second host material $S_1(H2)$ preferably satisfy a relationship of a numerical formula (Numerical Formula 5) below.

$$S_1(H1) > S_1(H2) \quad \text{(Numerical Formula 5)}$$

When $S_1(H1)$ and $S_1(H2)$ satisfy the relationship of the numerical formula (Numerical Formula 5), energy transfer of singlet excitons from the first host material to the second host material easily occurs. That is considered to result in the separation of recombination portions from emitting portions, allowing for increased luminous efficiency or extended drive life.

In the organic EL device according to each of the first and second embodiments, the van der Waals radius of the first host material calculated by molecular orbital calculation is preferably 1.08 nm or more, more preferably 1.20 nm or more.

When the van der Waals radius of the first host material is 1.08 nm or more, self-quenching is suppressed. As a result, efficient energy transfer to the second host material easily occurs, leading to the improvement in luminous efficiency.

The "van der Waals radius of the compound (first host material)" is calculated from a "van der Waals volume of the compound" by using a numerical formula (Numerical Formula 102) when a structure optimized by the molecular orbital calculation method is displayed with a Winmoster. The molecular orbital calculation is performed using a quantum chemical calculation program (Gaussian09 (Gaussian Inc.); Calculation Method: B3LYP/6-31G* (B3LYP used for theory, 6-31G* used for basis function)).

The "van der Waals volume of the compound" refers to a volume of a region occupied by a van der Waals sphere based on a "van der Waals radius of atoms" that form the compound, and refers to a value calculated by using a molecular orbital calculation software and finding a stable structure by PM3 method.

$$V = 4/3 \times \pi r^3 \quad \text{(Numerical Formula 102)}$$

V is a van der Waals volume of the compound and r is a van der Waals radius of the compound.

In the organic EL device according to each of the first and second exemplary embodiments, the film thickness of the first emitting layer is preferably in a range from 2 nm to 20 nm, more preferably in a range from 5 nm to 10 nm.

When the thickness of the first emitting layer is in a range from 2 nm and 20 nm, triplets generated in the first host material energy-transfer to the second host material more easily without being deactivated. As a result, luminous efficiency is improved.

Herein, the "host material" refers to, for instance, a material that accounts for "50 mass % or more of the layer". That is, for instance, the first emitting layer contains 50 mass % or more of the first host material with respect to the total mass of the first emitting layer. For instance, the second emitting layer contains 50 mass % or more of the second host material with respect to the total mass of the second emitting layer.

Emission Wavelength of Organic EL Device

The organic EL device according to each of the first and second exemplary embodiments preferably emits light having a maximum peak wavelength of 500 nm or less when the organic electroluminescence device is driven.

The organic electroluminescence device according to each of the first and second exemplary embodiments more preferably emits light having a maximum peak wavelength in a range from 430 nm to 480 nm when the organic electroluminescence device is driven.

The maximum peak wavelength of the light emitted from the organic EL device when being driven is measured as follows. Voltage is applied to the organic EL device such that a current density becomes 10 $mA/cm^2$, where spectral radiance spectrum is measured by a spectroradiometer CS-2000 (produced by Konica Minolta, Inc.). A peak wavelength of an emission spectrum, at which the luminous intensity of the obtained spectral radiance spectrum is at the maximum, is measured and defined as a maximum peak wavelength (unit: nm).

First Emitting Layer

The first emitting layer contains a first host material and a first luminescent compound. The first host material and the second host material that is contained in the second emitting layer are mutually different compounds.

The first luminescent compound preferably has a maximum peak wavelength of 500 nm or less, more preferably 480 nm or less. The first luminescent compound preferably has a maximum peak wavelength of 430 nm or more.

The first luminescent compound contained in the first emitting layer is more preferably a fluorescent compound that emits fluorescence having a maximum peak wavelength of 500 nm or less, still more preferably a fluorescent compound that emits fluorescence having a maximum peak wavelength of 480 nm or less. The first luminescent compound contained in the first emitting layer is preferably a fluorescent compound that emits fluorescence having a maximum peak wavelength of 430 nm or more.

In the organic EL device according to each of the first and second exemplary embodiments, the first luminescent compound and the second luminescent compound may be mutually different compounds or the same compound.

In the organic EL device according to each of the first and second exemplary embodiments, the first luminescent compound is preferably a compound containing no azine ring structure in a molecule.

In the organic EL device according to each of the first and second exemplary embodiments, the first luminescent compound is preferably not a boron-containing complex, more preferably not a complex.

In the organic EL device according to each of the first and second exemplary embodiments, the first emitting layer preferably does not contain a metal complex. Moreover, in the organic EL device according to each of the first and second exemplary embodiments, the first emitting layer also preferably does not contain a boron-containing complex.

In the organic EL device according to each of the first and second exemplary embodiments, the first emitting layer preferably does not contain a phosphorescent material (dopant material).

In addition, the first emitting layer preferably does not contain a heavy-metal complex or a phosphorescent rare earth metal complex. Examples of the heavy-metal complex herein include iridium complex, osmium complex, and platinum complex.

A measurement method of the maximum peak wavelength of a compound is as follows. A toluene solution of a measurement target compound at a concentration of 5 μmol/L was prepared and put in a quartz cell. An emission spectrum (ordinate axis: luminous intensity, abscissa axis:

wavelength) of each of the samples was measured at a normal temperature (300K). The emission spectrum can be measured using a spectrophotometer (machine name: F-7000) produced by Hitachi High-Tech Science Corporation. It should be noted that the machine for measuring the emission spectrum is not limited to the machine used herein.

A peak wavelength of the emission spectrum exhibiting the maximum luminous intensity is defined as the maximum peak wavelength. Herein, the maximum peak wavelength of fluorescence is occasionally referred to as a maximum fluorescence peak wavelength (FL-peak).

In an emission spectrum of the first luminescent compound, where a peak exhibiting a maximum luminous intensity is defined as a maximum peak and a height of the maximum peak is defined as 1, heights of other peaks appearing in the emission spectrum are preferably less than 0.6. It should be noted that the peaks in the emission spectrum are defined as local maximum values.

Moreover, in the emission spectrum of the first luminescent compound, the number of peaks is preferably less than three.

In the organic EL device according to each of the first and second exemplary embodiments, the first emitting layer preferably emits light having a maximum peak wavelength of 500 nm or less when the organic electroluminescence device is driven.

The maximum peak wavelength of the light emitted from the emitting layer when the device is driven is measured as follows.

Maximum Peak Wavelength $\lambda p$ of Light Emitted from Emitting Layer when Organic EL Device is Driven For a maximum peak wavelength $\lambda p_1$ of light emitted from the first emitting layer when the organic EL device is driven, the organic EL device is produced by using the material of the first emitting layer for the first emitting layer and the second emitting layer, and voltage is applied to the organic EL device so that a current density becomes 10 mA/cm$^2$, where spectral radiance spectrum is measured by a spectroradiometer CS-2000 (produced by Konica Minolta, Inc.). The maximum peak wavelength $\lambda p_1$ (unit: nm) is calculated from the obtained spectral radiance spectrum.

For a maximum peak wavelength $\lambda p_2$ of light emitted from the second emitting layer when the organic EL device is driven, the organic EL device is produced by using the material of the second emitting layer for the first emitting layer and the second emitting layer, and voltage is applied to the organic EL device so that a current density becomes 10 mA/cm$^2$, where spectral radiance spectrum is measured by a spectroradiometer CS-2000 (produced by Konica Minolta, Inc.). The maximum peak wavelength $\lambda p_2$ (unit: nm) is calculated from the obtained spectral radiance spectrum.

In the organic EL device according to each of the first and second exemplary embodiments, the singlet energy of the first host material $S_1$(H1) and the singlet energy of the first luminescent compound $S_1(D_1)$ preferably satisfy a relationship of a numerical formula (Numerical Formula 20) below.

$$S_1(H1) > S_1(D1) \quad \text{(Numerical Formula 20)}$$

The singlet energy $S_1$ means an energy difference between the lowest singlet state and the ground state.

When the first host material and the first luminescent compound satisfy the relationship of the numerical formula (Numerical Formula 20), singlet excitons generated on the first host material easily energy-transfer from the first host material to the first luminescent compound, thereby contributing to emission (preferably fluorescence) of the first luminescent compound.

In the organic EL device according to each of the first and second exemplary embodiments, the triplet energy of the first host material $T_1$(H1) and the triplet energy of the first luminescent compound $T_1(D_1)$ preferably satisfy a relationship of a numerical formula (Numerical Formula 20A) below.

$$T_1(D1) > T_1(H1). \quad \text{(Numerical Formula 20A)}$$

When the first host material and the first luminescent compound satisfy the relationship of the numerical formula (Numerical Formula 20A), triplet excitons generated in the first emitting layer are transferred not onto the first luminescent compound having higher triplet energy but onto the first host material, thereby being easily transferred to the second emitting layer.

The organic EL device according to each of the first and second exemplary embodiments preferably satisfies a relationship of a numerical formula (Numerical Formula 20B) below.

$$T_1(D1) > T_1(H1) > T_1(H2) \quad \text{(Numerical Formula 20B)}$$

Triplet Energy $T_1$

A method of measuring triplet energy $T_1$ is exemplified by a method below.

A measurement target compound is dissolved in EPA (diethylether:isopentane:ethanol=5:5:2 in volume ratio) so as to fall within a range from $10^{-5}$ mol/L to $10^{-4}$ mol/L, and the obtained solution is encapsulated in a quartz cell to provide a measurement sample. A phosphorescence spectrum (ordinate axis: phosphorescent luminous intensity, abscissa axis: wavelength) of the measurement sample is measured at a low temperature (77K). A tangent is drawn to the rise of the phosphorescence spectrum close to the short-wavelength region. An energy amount is calculated by a conversion equation (F1) below on a basis of a wavelength value $\lambda_{edge}$ [nm] at an intersection of the tangent and the abscissa axis. The calculated energy amount is defined as triplet energy $T_1$.

$$T_1\,[\text{eV}] = 1239.85/\lambda_{edge} \quad \text{Conversion Equation (F1)}$$

The tangent to the rise of the phosphorescence spectrum close to the short-wavelength region is drawn as follows. While moving on a curve of the phosphorescence spectrum from the short-wavelength region to the local maximum value closest to the short-wavelength region among the local maximum values of the phosphorescence spectrum, a tangent is checked at each point on the curve toward the long-wavelength of the phosphorescence spectrum. An inclination of the tangent is increased along the rise of the curve (i.e., a value of the ordinate axis is increased). A tangent drawn at a point of the local maximum inclination (i.e., a tangent at an inflection point) is defined as the tangent to the rise of the phosphorescence spectrum close to the short-wavelength region.

A local maximum point where a peak intensity is 15% or less of the maximum peak intensity of the spectrum is not counted as the above-mentioned local maximum peak intensity closest to the short-wavelength region. The tangent drawn at a point that is closest to the local maximum peak intensity closest to the short-wavelength region and where the inclination of the curve is the local maximum is defined as a tangent to the rise of the phosphorescence spectrum close to the short-wavelength region.

For phosphorescence measurement, a spectrophotofluorometer body F-4500 (manufactured by Hitachi High-Technologies Corporation) is usable. Any device for phosphorescence measurement is usable. A combination of a cooling unit, a low temperature container, an excitation light source and a light-receiving unit may be used for phosphorescence measurement.

Singlet Energy $S_1$

A method of measuring the singlet energy $S_1$ with use of a solution (occasionally referred to as a solution method) is exemplified by a method below.

A toluene solution of a measurement target compound at a concentration ranging from $10^{-5}$ mol/L to $10^{-4}$ mol/L is prepared and put in a quartz cell. An absorption spectrum (ordinate axis: absorption intensity, abscissa axis: wavelength) of the thus-obtained sample is measured at a normal temperature (300K). A tangent is drawn to the fall of the absorption spectrum close to the long-wavelength region, and a wavelength value $\lambda_{edge}$ (nm) at an intersection of the tangent and the abscissa axis is assigned to a conversion equation (F2) below to calculate singlet energy.

$$S_1[\text{eV}] = 1239.85/\lambda_{edge} \qquad \text{Conversion Equation (F2)}$$

Any device for measuring absorption spectrum is usable. For instance, a spectrophotometer (U3310 manufactured by Hitachi, Ltd.) is usable.

The tangent to the fall of the absorption spectrum close to the long-wavelength region is drawn as follows. While moving on a curve of the absorption spectrum from the local maximum value closest to the long-wavelength region, among the local maximum values of the absorption spectrum, in a long-wavelength direction, a tangent at each point on the curve is checked. An inclination of the tangent is decreased and increased in a repeated manner as the curve falls (i.e., a value of the ordinate axis is decreased). A tangent drawn at a point where the inclination of the curve is the local minimum closest to the long-wavelength region (except when absorbance is 0.1 or less) is defined as the tangent to the fall of the absorption spectrum close to the long-wavelength region.

The local maximum absorbance of 0.2 or less is not counted as the above-mentioned local maximum absorbance closest to the long-wavelength region.

In the organic EL device according to each of the first and second exemplary embodiments, the first luminescent compound is preferably contained at more than 1.1 mass % in the first emitting layer. Specifically, the first emitting layer contains the first luminescent compound preferably at more than 1.1 mass %, more preferably at 1.2 mass % or more, and still more preferably at 1.5 mass % or more with respect to the total mass of the first emitting layer.

The first emitting layer contains the first luminescent compound preferably at 10 mass % or less, more preferably at 7 mass % or less, and still more preferably at 5 mass % or less with respect to the total mass of the first emitting layer.

In the organic EL device according to each of the first and second exemplary embodiments, the first emitting layer preferably contains the first compound as the first host material at 60 mass % or more, more preferably at 70 mass % or more, still more preferably at 80 mass % or more, still further more preferably at 90 mass % or more, yet still further more preferably at 95 mass % or more, with respect to the total mass of the first emitting layer.

The first emitting layer preferably contains the first host material at 99 mass % or less with respect to the total mass of the first emitting layer.

When the first emitting layer contains the first host material and the first luminescent compound, the upper limit of a total of the content ratios of the first host material and the first luminescent compound is 100 mass %.

In the organic EL device according to each of the first and second exemplary embodiment, the first emitting layer may further contain any other material than the first host material and the first luminescent compound.

The first emitting layer may contain a single type of the first host material or may contain two or more types of the first host material. The first emitting layer may contain a single type of the first luminescent compound or may contain two or more types of the first luminescent compound.

Second Emitting Layer

The second emitting layer contains a second host material and a second luminescent compound. The second host material of the second emitting layer is different from the second host material contained in the first emitting layer.

The second luminescent compound preferably has a maximum peak wavelength of 500 nm or less, more preferably 480 nm or less. The second luminescent compound preferably has a maximum peak wavelength of 430 nm or more.

The second luminescent compound contained in the second emitting layer is preferably a fluorescent compound that emits fluorescence having a maximum peak wavelength of 500 nm or less, more preferably a fluorescent compound that emits fluorescence having a maximum peak wavelength of 480 nm or less. The second luminescent compound contained in the second emitting layer is preferably a fluorescent compound that emits fluorescence having a maximum peak wavelength of 430 nm or more.

A measurement method of the maximum peak wavelength of a compound is as described above.

In the organic EL device according to each of the first and second exemplary embodiments, the second emitting layer preferably emits light having a maximum peak wavelength of 500 nm or less when the organic electroluminescence device is driven.

In the organic EL device according to each of the first and second exemplary embodiments, a full width at half maximum of a maximum peak of the second luminescent compound is preferably in a range from 1 nm to 20 nm.

In the organic EL device according to each of the first and second exemplary embodiments, a Stokes shift of the second luminescent compound preferably exceeds 7 nm.

When the Stokes shift of the second luminescent compound exceeds 7 nm, a decrease in the luminous efficiency due to self-absorption is easily inhibited.

The self-absorption is a phenomenon in which emitted light is absorbed by the same compound to reduce luminous efficiency. The self-absorption is notably observed in a compound having a small Stokes shift (i.e., a large overlap between an absorption spectrum and a fluorescence spectrum). Accordingly, in order to reduce the self-absorption, it is preferable to use a compound having a large Stokes shift (i.e., a small overlap between the absorption spectrum and the fluorescence spectrum). The Stokes shift can be measured by the following method.

A measurement target compound is dissolved in toluene at a concentration of $2.0\times10^{-5}$ mol/L to prepare a measurement sample. The measurement sample is put into a quartz cell and is irradiated with continuous light falling within an ultraviolet-to-visible region at a room temperature (300K) to measure an absorption spectrum (ordinate axis: absorbance, abscissa axis: wavelength). A spectrophotometer such as a spectrophotometer U-3900/3900H produced by Hitachi High-Tech Science Corporation can be used for the absorption spectrum measurement. Moreover, a measurement target compound is dissolved in toluene at a concentration of $4.9\times10^{-6}$ mol/L to prepare a measurement sample. The measurement sample was put into a quartz cell and was irradiated with excited light at a room temperature (300K) to measure fluorescence spectrum (ordinate axis: fluorescence intensity, abscissa axis: wavelength). A spectrophotometer can be used for the fluorescence spectrum measurement. For instance, a spectrophotofluorometer F-7000 produced by Hitachi High-Tech Science Corporation can be used for the measurement.

A difference between an absorption local maximum wavelength and a fluorescence local maximum wavelength is calculated from the absorption spectrum and the fluorescence spectrum to obtain a Stokes shift (SS). A unit of the Stokes shift (SS) is denoted by nm.

In the organic EL device according to each of the first and second exemplary embodiments, the triplet energy of the second luminescent compound $T_1(D_2)$ and the triplet energy of the second host material $T_1(H2)$ preferably satisfy a relationship of a numerical formula (Numerical Formula 3A) below.

$$T_1(D2) > T_1(H2) \quad \text{(Numerical Formula 3A)}$$

In the organic EL device according to each of the first and second exemplary embodiments, when the second luminescent compound and the second host material satisfy the relationship of the numerical formula (Numerical Formula 3A), in transfer of triplet excitons generated in the first emitting layer to the second emitting layer, the triplet excitons energy-transfer not onto the second luminescent compound having higher triplet energy but onto molecules of the second host material. In addition, triplet excitons generated by recombination of holes and electrons on the second host material do not transfer to the second luminescent compound having higher triplet energy. Triplet excitons generated by recombination on molecules of the second luminescent compound quickly energy-transfer to molecules of the second host material.

Triplet excitons in the second host material do not transfer to the second luminescent compound but efficiently collide with one another on the second host material to generate singlet excitons by the TTF phenomenon.

In the organic EL device according to each of the first and second exemplary embodiments, the singlet energy of the second host material $S_1(H2)$ and the singlet energy of the second luminescent compound $S_1(D_2)$ preferably satisfy a relationship of a numerical formula (Numerical Formula 41) below.

$$S_1(H2) > S_1(D2) \quad \text{(Numerical Formula 41)}$$

In the organic EL device according to each of the first and second exemplary embodiments, when the second luminescent compound and the second host material satisfy the relationship of the numerical formula (Numerical formula 41), due to the singlet energy of the second luminescent compound being smaller than the singlet energy of the second host material, singlet excitons generated by the TTF phenomenon energy-transfer from the second host material to the second luminescent compound, thereby contributing to emission (preferably fluorescence) of the second luminescent compound.

In the organic EL device according to each of the first and second exemplary embodiments, the second luminescent compound is preferably a compound containing no azine ring structure in a molecule.

In the organic EL device according to each of the first and second exemplary embodiments, the second luminescent compound is preferably not a boron-containing complex, more preferably not a complex.

In the organic EL device according to each of the first and second exemplary embodiments, the second emitting layer preferably does not contain a metal complex. Moreover, in the organic EL device according to each of the first and second exemplary embodiments, the second emitting layer also preferably does not contain a boron-containing complex.

In the organic EL device according to each of the first and second exemplary embodiments, the second emitting layer preferably does not contain a phosphorescent material (dopant material).

In addition, the second emitting layer preferably does not contain a heavy-metal complex or a phosphorescent rare earth metal complex. Examples of the heavy-metal complex herein include iridium complex, osmium complex, and platinum complex.

In the organic EL device according to each of the first and second exemplary embodiments, the second emitting layer preferably contains more than 1.1 mass % of the second luminescent compound. Specifically, the second emitting layer contains the second luminescent compound preferably at more than 1.1 mass %, more preferably at 1.2 mass % or more, and still more preferably at 1.5 mass % or more with respect to the total mass of the second emitting layer.

The second emitting layer contains the second luminescent compound preferably at 10 mass % or less, more preferably at 7 mass % or less, and still more preferably at 5 mass % or less with respect to the total mass of the second emitting layer.

The second emitting layer contains a second compound as the second host material preferably at 60 mass % or more, more preferably at 70 mass % or more, still more preferably at 80 mass % or more, still further more preferably at 90 mass % or more, and yet still further more preferably at 95 mass % or more, with respect to the total mass of the second emitting layer.

The second emitting layer preferably contains the second host material at 99 mass % or less with respect to the total mass of the second emitting layer.

When the second emitting layer contains the second host material and the second luminescent compound, the upper limit of a total of the content ratios of the second host material and the second luminescent compound is 100 mass %.

In each of the first and second exemplary embodiments, the second emitting layer may further contain any other material than the second host material and the second luminescent compound.

The second emitting layer may contain a single type of the second host material or may contain two or more types of the second host material. The second emitting layer may contain a single type of the second luminescent compound or may contain two or more types of the second luminescent compound.

In the organic EL device according to each of the first and second exemplary embodiments, the film thickness of the second emitting layer is preferably 5 nm or more, more preferably 10 nm or more. When the film thickness of the second emitting layer is 5 nm or more, it is easy to inhibit triplet excitons having transferred from the first emitting layer to the second emitting layer from returning to the first emitting layer. Further, when the film thickness of the second emitting layer is 5 nm or more, triplet excitons can be sufficiently separated from the recombination portion in the first emitting layer.

In the organic EL device according to each of the first and second exemplary embodiments, the film thickness of the second emitting layer is preferably 30 nm or less. When the film thickness of the second emitting layer is 30 nm or less, a density of the triplet excitons in the second emitting layer is increased to cause the TTF phenomenon more easily.

In the organic EL device according to each of the first and second exemplary embodiments, the film thickness of the second emitting layer is preferably in a range from 5 nm to 30 nm.

In the organic EL device according to each of the first and second exemplary embodiments, the triplet energy of the first luminescent compound $T_1(D_1)$ and the triplet energy of the first host material $T_1(H1)$ preferably satisfy a relationship of a numerical formula (Numerical Formula 11A) below.

$$0\text{ eV} < T_1(D1) - T_1(H1) < 0.6\text{ eV} \quad \text{(Numerical Formula 11A)}$$

In the organic EL device according to each of the first and second exemplary embodiments, the triplet energy of the first host material $T_1(H1)$ preferably satisfies a relationship of a numerical formula (Numerical Formula 12) below.

$$T_1(H1) > 2.0\text{ eV} \quad \text{(Numerical Formula 12)}$$

Additional Layers of Organic EL Device

In addition to the first emitting layer and the second emitting layer, the organic EL device according to each of the first and second exemplary embodiments may include one or more organic layers. Examples of the organic layer include at least one layer selected from the group consisting of a hole injecting layer, a hole transporting layer, an emitting layer, an electron injecting layer, an electron transporting layer, a hole blocking layer, and an electron blocking layer.

The layers of the organic EL device according to each of the first and second exemplary embodiments may consist of the first emitting layer and the second emitting layer. Alternatively, the organic EL device according to each of the first and second exemplary embodiments may further include, for instance, at least one layer selected from the group consisting of a hole injecting layer, a hole transporting layer, an electron injecting layer, an electron transporting layer, a hole blocking layer, and an electron blocking layer.

In the organic EL device according to each of the first and second exemplary embodiments, it is also preferable that the first emitting layer is disposed between the anode and the cathode and the second emitting layer is disposed between the first emitting layer and the cathode. The organic EL device according to each of the first and second exemplary embodiments may include the first emitting layer and the second emitting layer in this order from the side close to the anode, or may include the second emitting layer and the first emitting layer in this order from the side close to the anode. When the first emitting layer and the second emitting layer are layered in either order, the same effect resulting from layering the emitting layers can be expected by selecting a combination of materials that satisfy the relationship of the numerical formula (Numerical Formula 1).

Figure 4:
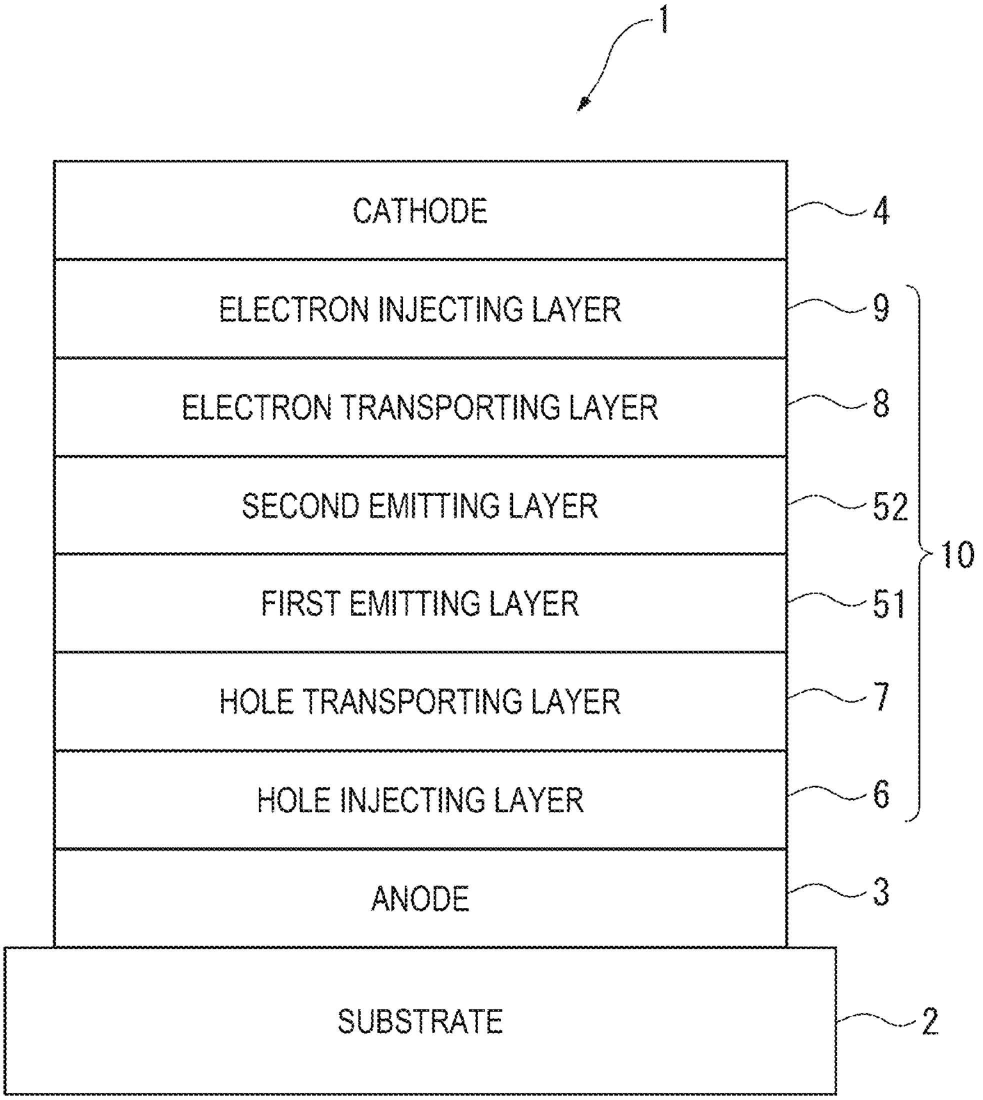
FIG. 4 schematically illustrates an exemplary arrangement of an organic electroluminescence device according to each of a first exemplary embodiment and a second exemplary embodiment.

FIG. 4 schematically illustrates an exemplary arrangement of an organic EL device according to each of the first and second exemplary embodiments.

An organic EL device 1 includes a light-transmissive substrate 2, an anode 3, a cathode 4, and organic layers 10 provided between the anode 3 and the cathode 4. The organic layers 10 include the hole injecting layer 6, the hole transporting layer 7, the first emitting layer 51, the second emitting layer 52, the electron transporting layer 8, and the electron injecting layer 9 that are layered in this order from the side close to the anode 3.

Figure 5:
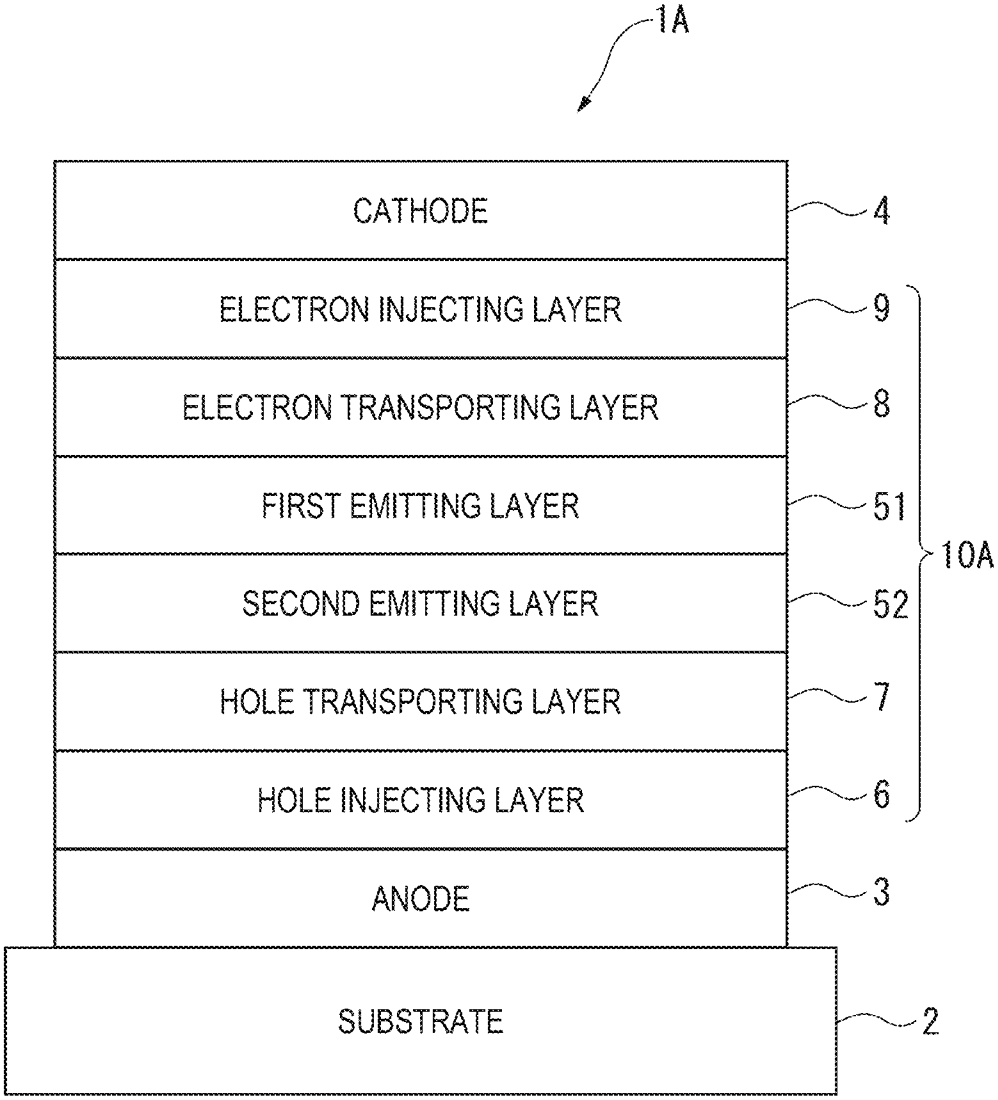
FIG. 5 schematically illustrates another exemplary arrangement of the organic electroluminescence device according to each of the first exemplary embodiment and the second exemplary embodiment.

FIG. 5 schematically illustrates another exemplary arrangement of the organic EL device according to each of the first and second exemplary embodiments.

An organic EL device 1A includes a light-transmissive substrate 2, an anode 3, a cathode 4, and organic layers 10 provided between the anode 3 and the cathode 4. The organic layers 10A include a hole injecting layer 6, a hole transporting layer 7, a second emitting layer 52, a first emitting layer 51, an electron transporting layer 8, and an electron injecting layer 9 that are layered in this order from the side close to the anode 3.

The invention is not limited to the exemplary arrangements of the organic EL device illustrated in FIG. 4 and FIG. 5.

Third Emitting Layer

The organic EL device according to each of the first and second exemplary embodiments may further include a third emitting layer.

Preferably, the third emitting layer contains a third host material; the first host material, the second host material, and the third host material are mutually different; the third emitting layer contains at least a third luminescent compound; the first luminescent compound, the second luminescent compound, and the third luminescent compound are mutually the same or different; and the triplet energy of the first host material $T_1(H1)$ and a triplet energy of the third host material $T_1(H3)$ satisfy a relationship of a numerical formula (1A) below.

$$T_1(H1) > T_1(H3) \quad \text{(Numerical Formula 1A)}$$

The third luminescent compound preferably has a maximum peak wavelength of 500 nm or less.

The third luminescent compound is preferably a fluorescent compound that emits fluorescence having a maximum peak wavelength of 500 nm or less.

When the organic EL device according to each of the first and second exemplary embodiments includes the third emitting layer, the triplet energy of the second host material $T_1(H2)$ and the triplet energy of the third host material $T_1(H3)$ preferably satisfy a relationship of a numerical formula (Numerical Formula 1B) below.

$$T_1(H2) > T_1(H3) \quad \text{(Numerical Formula 1B)}$$

In the organic EL device according to each of the first and second exemplary embodiments, the first emitting layer and the second emitting layer are preferably in direct contact with each other.

Herein, a layer arrangement in which the first emitting layer and the second emitting layer are in direct contact with each other can include one of arrangements (LS1), (LS2) and (LS3) below.

(LS1) An arrangement in which a region containing both the first host material and the second host material is generated in a process of vapor-depositing the compound of the first emitting layer and vapor-depositing the compound of the second emitting layer, and is present on the interface between the first emitting layer and the second emitting layer.

(LS2) An arrangement in which in a case of containing an luminescent compound in the first emitting layer and the second emitting layer, a region containing the first host material, the second host material and the luminescent compound is generated in a process of vapor-depositing the compound of the first emitting layer and vapor-depositing the compound of the second emitting layer, and is present on the interface between the first emitting layer and the second emitting layer.

(LS3) An arrangement in which in a case of containing a luminescent compound in the first emitting layer and the second emitting layer, a region containing the luminescent compound, a region containing the first host material or a region containing the second host material is generated in a process of vapor-depositing the compound of the first emitting layer and vapor-depositing the compound of the second emitting layer, and is present on the interface between the first emitting layer and the second emitting layer.

When the organic EL device according to each of the first and second exemplary embodiments includes the third emitting layer, preferably, the first emitting layer and the second emitting layer are in direct contact with each other and the second emitting layer and the third emitting layer are in direct contact with each other.

Herein, a layer arrangement in which the second emitting layer and the third emitting layer are in direct contact with each other can include one of arrangements (LS4), (LS5) and (LS6) below.

(LS4) An embodiment in which a region containing both the second host material and the third host material is generated in a process of vapor-depositing the compound of the second emitting layer and vapor-depositing the compound of the third emitting layer, and is present on the interface between the second emitting layer and the third emitting layer.

(LS5) An embodiment in which in a case of containing a luminescent compound in the second emitting layer and the third emitting layer, a region containing the second host material, the third host material and the luminescent compound is generated in a process of vapor-depositing the compound of the second emitting layer and vapor-depositing the compound of the third emitting layer, and is present on the interface between the second emitting layer and the third emitting layer.

(LS6) An embodiment in which in a case of containing a luminescent compound in the second emitting layer and the third emitting layer, a region containing the luminescent compound, a region containing the second host material or a region containing the third host material is generated in a process of vapor-depositing the compound of the second emitting layer and vapor-depositing the compound of the third emitting layer, and is present on the interface between the second emitting layer and the third emitting layer.

Also preferably, the organic EL device according to each of the first and second exemplary embodiments further includes a diffusion layer.

The diffusion layer included in the organic EL device according to each of the first and second exemplary embodiments is preferably provided between the first emitting layer and the second emitting layer.

An arrangement of an organic EL device will be further described below. It should be noted that the reference numerals are occasionally omitted below.

Substrate

The substrate is used as a support for the organic EL device. For instance, glass, quartz, plastics and the like are usable for the substrate. A flexible substrate is also usable. The flexible substrate is a bendable substrate, which is exemplified by a plastic substrate. Examples of the material for the plastic substrate include polycarbonate, polyarylate, polyethersulfone, polypropylene, polyester, polyvinyl fluoride, polyvinyl chloride, polyimide, and polyethylene naphthalate. Further, an inorganic vapor deposition film is also usable.

Anode

Metal, an alloy, an electrically conductive compound, a mixture thereof, or the like having a large work function (specifically, 4.0 eV or more) is preferably used as the anode formed on the substrate. Specific examples of the material include indium tin oxide (ITO), indium oxide-tin oxide containing silicon or silicon oxide, indium oxide-zinc oxide, indium oxide containing tungsten oxide and zinc oxide, and graphene. In addition, gold (Au), platinum (Pt), nickel (Ni), tungsten (W), chrome (Cr), molybdenum (Mo), iron (Fe), cobalt (Co), copper (Cu), palladium (Pd), titanium (Ti), and nitrides of a metal material (e.g., titanium nitride) are usable.

The material is typically formed into a film by a sputtering method. For instance, the indium oxide-zinc oxide can be formed into a film by the sputtering method using a target in which zinc oxide in a range from 1 mass % to 10 mass % is added to indium oxide. Moreover, for instance, the indium oxide containing tungsten oxide and zinc oxide can be formed by the sputtering method using a target in which tungsten oxide in a range from 0.5 mass % to 5 mass % and zinc oxide in a range from 0.1 mass % to 1 mass % are added to indium oxide. In addition, the anode may be formed by a vacuum deposition method, a coating method, an inkjet method, a spin coating method or the like.

Among the EL layers formed on the anode, since the hole injecting layer adjacent to the anode is formed of a composite material into which holes are easily injectable irrespective of the work function of the anode, a material usable as an electrode material (e.g., metal, an alloy, an electroconductive compound, a mixture thereof, and the elements belonging to the group 1 or 2 of the periodic table) is also usable for the anode.

A material having a small work function such as elements belonging to Groups 1 and 2 in the periodic table of the elements, specifically, an alkali metal such as lithium (Li) and cesium (Cs), an alkaline earth metal such as magnesium (Mg), calcium (Ca) and strontium (Sr), alloys (e.g., MgAg and AlLi) including the alkali metal or the alkaline earth metal, a rare earth metal such as europium (Eu) and ytterbium (Yb), alloys including the rare earth metal are also usable for the anode. It should be noted that the vacuum deposition method and the sputtering method are usable for forming the anode using the alkali metal, alkaline earth metal and the alloy thereof. Further, when a silver paste is used for the anode, the coating method and the inkjet method are usable.

Cathode

It is preferable to use metal, an alloy, an electroconductive compound, a mixture thereof, or the like having a small work function (specifically, 3.8 eV or less) for the cathode. Examples of the material for the cathode include elements belonging to Groups 1 and 2 in the periodic table of the elements, specifically, an alkali metal such as lithium (Li) and cesium (Cs), an alkaline earth metal such as magnesium (Mg), calcium (Ca) and strontium (Sr), alloys (e.g., MgAg and AlLi) including the alkali metal or the alkaline earth metal, a rare earth metal such as europium (Eu) and ytterbium (Yb), and alloys including the rare earth metal.

It should be noted that the vacuum deposition method and the sputtering method are usable for forming the cathode using the alkali metal, alkaline earth metal and the alloy thereof. Further, when a silver paste is used for the cathode, the coating method and the inkjet method are usable.

By providing the electron injecting layer, various conductive materials such as Al, Ag, ITO, graphene, and indium oxide-tin oxide containing silicon or silicon oxide may be used for forming the cathode regardless of the work function. The conductive materials can be formed into a film using the sputtering method, inkjet method, spin coating method and the like.

Electron Transporting Layer

In the organic EL device according to each of the first and second exemplary embodiments, the electron transporting layer is preferably provided between the emitting layers and the cathode.

The electron transporting layer is a layer containing a highly electron-transporting substance. For the electron transporting layer, 1) a metal complex such as an aluminum complex, beryllium complex, and zinc complex, 2) a hetero aromatic compound such as imidazole derivative, benzimidazole derivative, azine derivative, carbazole derivative, and phenanthroline derivative, and 3) a high polymer compound are usable. Specifically, as a low-molecule organic compound, a metal complex such as Alq, tris(4-methyl-8-quinolinato)aluminum (abbreviation: $Almq_3$), bis(10-hydroxybenzo[h]quinolinato)beryllium (abbreviation: $BeBq_2$), BAlq, Znq, ZnPBO and ZnBTZ is usable. In addition to the metal complex, a heteroaromatic compound such as 2-(4-biphenylyl)-5-(4-tert-butylphenyl)-1,3,4-oxadiazole (abbreviation: PBD), 1,3-bis[5-(ptert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), and 4,4'-bis(5-methylbenzoxazole-2-yl)stilbene (abbreviation: BzOs) is usable. In the exemplary embodiment, a benzimidazole compound is preferably usable. The above-described substances mostly have an electron mobility of $10^{-6}$ $cm^2/Vs$ or more. It should be noted that any substance other than the above substance may be used for the electron transporting layer as long as the substance exhibits a higher electron transportability than the hole transportability. The electron transporting layer may be provided in the form of a single layer or a laminate of two or more layers of the above substance(s).

Further, a high polymer compound is usable for the electron transporting layer. For instance, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy) and the like are usable.

Electron Injecting Layer

The electron injecting layer is a layer containing a highly electron-injectable substance. Examples of a material for the electron injecting layer include an alkali metal, alkaline earth metal and a compound thereof, examples of which include lithium (Li), cesium (Cs), calcium (Ca), lithium fluoride (LiF), cesium fluoride (CsF), calcium fluoride ($CaF_2$), and lithium oxide (LiOx). In addition, the alkali metal, alkaline earth metal or the compound thereof may be added to the substance exhibiting the electron transportability in use. Specifically, for instance, magnesium (Mg) added to Alq may be used. In this case, the electrons can be more efficiently injected from the cathode.

Alternatively, the electron injecting layer may be provided by a composite material in a form of a mixture of the organic compound and the electron donor. Such a composite material exhibits excellent electron injectability and electron transportability since electrons are generated in the organic compound by the electron donor. In this case, the organic compound is preferably a material excellent in transporting the generated electrons. Specifically, the above examples (e.g., the metal complex and the hetero aromatic compound) of the substance forming the electron transporting layer are usable. As the electron donor, any substance exhibiting electron donating property to the organic compound is usable. Specifically, the electron donor is preferably alkali metal, alkaline earth metal and rare earth metal such as lithium, cesium, magnesium, calcium, erbium and ytterbium. The electron donor is also preferably alkali metal oxide and alkaline earth metal oxide such as lithium oxide, calcium oxide, and barium oxide. Moreover, a Lewis base such as magnesium oxide is usable. Further, the organic compound such as tetrathiafulvalene (abbreviation: TTF) is usable.

Layer Formation Method(s)

A method of forming each layer of the organic EL device in each of the first and second exemplary embodiments is subject to no limitation except for the above particular description. However, known methods of dry film-forming such as vacuum deposition, sputtering, plasma or ion plating and wet film-forming such as spin coating, dipping, flow coating or ink-jet are applicable.

Film Thickness

A film thickness of each of the organic layers of the organic EL device in each of the first and second exemplary embodiments is not limited unless otherwise specified in the above. In general, the thickness preferably ranges from several nanometers to 1 μm because an excessively small film thickness is likely to cause defects (e.g. pin holes) and an excessively large thickness leads to the necessity of applying high voltage and consequent reduction in efficiency.

First Host Material, Second Host Material, and Third Host Material

In the organic EL device according to the first exemplary embodiment, the first host material may be any material that satisfies the relationship of the numerical formula (Numerical Formula 1) and has a diffusion coefficient $D_1$ of $3.0\times10^{-9}$ ($cm^2/s$) or more. The second host material may be any material that satisfies the relationship of the numerical formula (Numerical Formula 1).

In the organic EL device according to the second exemplary embodiment, the first host material may be any material that satisfies the relationship of the numerical formula (Numerical Formula 1) and has a surface potential $V_1$ of −11 (mV/nm) or less. The second host material may be any material that satisfies the relationship of the numerical formula (Numerical Formula 1).

In the organic EL device according to each of the first and second exemplary embodiments, the first host material is preferably a compound with a fused aromatic ring, a compound with a fused heteroaromatic ring, or a compound with a fused aromatic ring and a fused heteroaromatic ring. The fused aromatic ring is preferably a compound having one or more skeletons selected from the group consisting of an anthracene skeleton, a pyrene skeleton, a fluoranthene skeleton, a phenanthrene skeleton, a naphthalene skeleton, a fluorene skeleton, a chrysene skeleton, a triphenylene skeleton, a tetracene skeleton, a benzanthracene skeleton, and a benzocrysene skeleton. The fused heteroaromatic ring is preferably a compound having one or more skeletons selected from the group consisting of a dibenzofuran skeleton, a dibenzothiophene skeleton, a xanthene skeleton, and a benzoxanthene skeleton.

In the organic EL device according to the first exemplary embodiment, the first host material may be, for instance, a compound that is selected from the first compound represented by a formula (1), a formula (1X), a formula (12X), a formula (13X), a formula (14X), a formula (15X) or a formula (16X) below and the second compound represented by a formula (2) below, the compound satisfying the relationship of the numerical formula (Numerical Formula 1) and having the diffusion coefficient $D_1$ of $3.0\times10^{-9}$ ($cm^2/s$) or more.

In the organic EL device according to the second exemplary embodiment, the first host material may be, for instance, a compound that is selected from the first compound represented by the formula (1), the formula (1X), the formula (12X), the formula (13X), the formula (14X), the formula (15X) or the formula (16X) below and the second compound represented by the formula (2) below, the compound satisfying the relationship of the numerical formula (Numerical Formula 1) and having the surface potential $V_1$ of −11 (mV/nm) or less.

In the organic EL device according to each of the first and second exemplary embodiments, the second host material may be, for instance, a compound that is selected from the first compound represented by the formula (1), the formula (1X), the formula (12X), the formula (13X), the formula (14X), the formula (15X) or the formula (16X) below and the second compound represented by the formula (2) below and that satisfies the relationship of the numerical formula (Numerical Formula 1).

In the organic EL device according to each of the first and second exemplary embodiments, the first compound may be used as the first host material and also as the second host material. In this case, the compound represented by the formula (1), (1X), (12X), (13X), (14X), (15X), or (16X) below that is used as the second host material is sometimes referred to as the second compound for convenience.

In the organic EL device according to each of the first and second exemplary embodiments, the third host material may be any material, but for instance may be the first compound represented by the formula (1), the formula (1X), the formula (12X), the formula (13X), the formula (14X), the formula (15X) or the formula (16X) below or the second compound represented by the formula (2) below.

First Compound

Compound Represented by Formula (1)

[Formula 24]

(1)

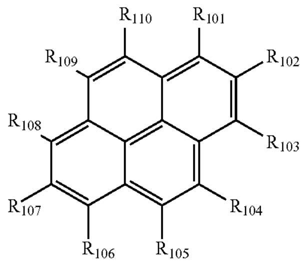

(11)

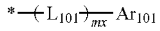

In the formula (1):

$R_{101}$ to $R_{110}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (11);

at least one of $R_{101}$ to $R_{110}$ is a group represented by the formula (11);

when a plurality of groups represented by the formula (11) are present, the plurality of groups represented by the formula (11) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms;

$Ar_{101}$ is a substituted or unsubstituted aryl group having 6 to 50 ring carbon atoms, or a substituted or unsubstituted heterocyclic group having 5 to 50 ring atoms;

mx is 0, 1, 2, 3, 4, or 5;

when two or more $L_{101}$ are present, the two or more $L_{101}$ are mutually the same or different;

when two or more $Ar_{101}$ are present, the two or more $Ar_{101}$ are mutually the same or different; and in the formula (11), * represents a bonding position to a pyrene ring in the formula (1).

In the first compound according to each of the first and second exemplary embodiments, $R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

In the organic EL device according to each of the first and second exemplary embodiments, the group represented by the formula (11) is preferably a group represented by a formula (111) below.

[Formula 25]

(111)

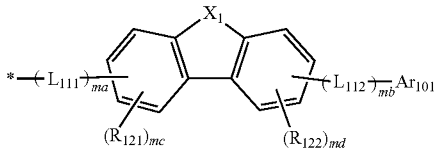

In the formula (111):

$X_1$ is $CR_{123}R_{124}$, an oxygen atom, a sulfur atom, or $NR_{125}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 0, 1, 2, 3, or 4;

mb is 0, 1, 2, 3, or 4;

ma+mb is 0, 1, 2, 3, or 4;

$Ar_{101}$ represents the same as $Ar_{101}$ in the formula (11);

$R_{121}$, $R_{122}$, $R_{123}$, $R_{124}$ and $R_{125}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3;

three $R_{121}$ are mutually the same or different;

md is 3; and three $R_{122}$ are mutually the same or different.

Among positions *1 to *8 of carbon atoms in a cyclic structure represented by a formula (111a) below in the group represented by the formula (111), $L_{111}$ is bonded to one of the positions *1 to *4, $R_{121}$ is bonded to each of three positions of the rest of *1 to *4, $L_{112}$ is bonded to one of the positions *5 to *8, and $R_{122}$ is bonded to each of three positions of the rest of *5 to *8.

[Formula 26]

(111a)

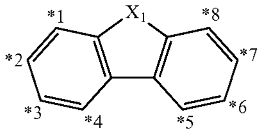

For instance, in the group represented by the formula (111), when $L_{111}$ is bonded to a carbon atom at a position *2 in the cyclic structure represented by the formula (111a) and $L_{112}$ is bonded to a carbon atom at a position *7 in the cyclic structure represented by the formula (111a), the group represented by the formula (111) is represented by a formula (111b) below.

[Formula 27]

(111b)

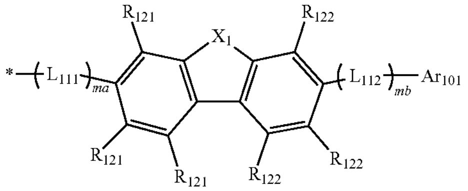

In the formula (111b):

$X_1$, $L_{111}$, $L_{112}$, ma, mb, $Ar_{101}$, $R_{121}$, $R_{122}$, $R_{123}$, $R_{124}$, and $R_{125}$ each independently represent the same as $X_1$, $L_{111}$, $L_{112}$, ma, mb, $Ar_{101}$, $R_{121}$, $R_{122}$, $R_{123}$, $R_{124}$, and $R_{125}$ in the formula (111);

a plurality of $R_{121}$ are mutually the same or different; and a plurality of $R_{122}$ are mutually the same or different.

In the organic EL device according to each of the first and second exemplary embodiments, the group represented by the formula (111) is preferably a group represented by a formula (111b) below.

In the organic EL device according to each of the first and second exemplary embodiments, preferably, ma is 0, 1 or 2, and mb is 0, 1 or 2.

In the organic EL device according to each of the first and second exemplary embodiments, preferably, ma is 0 or 1, and mb is 0 or 1.

In the organic EL device according to each of the first and second exemplary embodiments, $Ar_{101}$ is preferably a substituted or unsubstituted aryl group having 6 to 50 ring carbon atoms.

In the organic EL device according to each of the first and second exemplary embodiments, preferably, $Ar_{101}$ is a substituted or unsubstituted phenyl group, a substituted or unsubstituted naphthyl group, a substituted or unsubstituted biphenyl group, a substituted or unsubstituted terphenyl group, a substituted or unsubstituted pyrenyl group, a substituted or unsubstituted phenanthryl group, or a substituted or unsubstituted fluorenyl group.

In the organic EL device according to each of the first and second exemplary embodiments, $Ar_{101}$ is also preferably a group represented by a formula (12), a formula (13), or a formula (14) below.

[Formula 28]

(12)

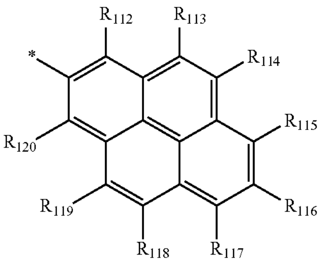

(13)

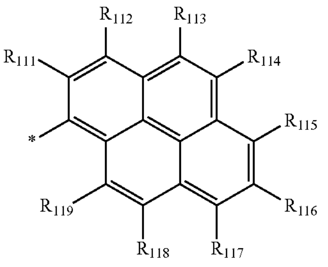

(14)

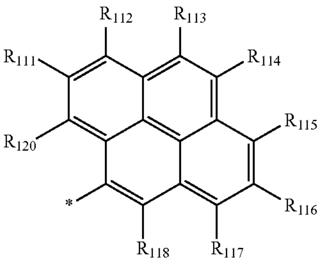

In the formulae (12), (13), and (14):

$R_{111}$ to $R_{120}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a substituted or unsubstituted aralkyl group having 7 to 50 carbon atoms, a group represented by $-C(=O)R_{124}$, a group represented by $-COOR_{125}$, a halogen atom, a cyano group, a nitro group, a substituted or unsubstituted aryl group having 6 to 50 ring carbon atoms, or a substituted or unsubstituted heterocyclic group having 5 to 50 ring atoms; and in the formulae (12), (13) and (14), * represents a bonding position to $L_{101}$ in the formula (11), or a bonding position to $L_{112}$ in the formula (111) or (111b).

Compound Represented by Formula (1X)

In the organic EL device according to each of the first and second exemplary embodiments, the first compound is also preferably a compound represented by the formula (1X).

[Formula 29]

(1X)

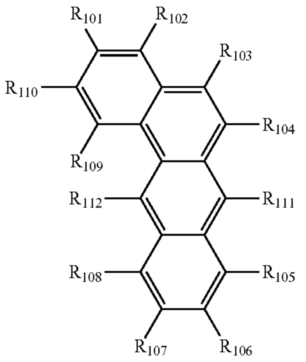

(11X)

$$*-(L_{101})_{mx}-Ar_{101}$$

In the formula (1X):

$R_{101}$ to $R_{112}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (11X);

at least one of $R_{101}$ to $R_{112}$ is a group represented by the formula (11X);

when a plurality of groups represented by the formula (11X) are present, the plurality of groups represented by the formula (11X) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms;

$Ar_{101}$ is a substituted or unsubstituted aryl group having 6 to 50 ring carbon atoms, or a substituted or unsubstituted heterocyclic group having 5 to 50 ring atoms;

mx is 1, 2, 3, 4, or 5;

when two or more $L_{101}$ are present, the two or more $L_{101}$ are mutually the same or different;

when two or more $Ar_{101}$ are present, the two or more $Ar_{101}$ are mutually the same or different; and in the formula (11X), * represents a bonding position to a benz[a]anthracene ring in the formula (1X).

In the organic EL device according to each of the first and second exemplary embodiments, the group represented by the formula (11X) is preferably a group represented by a formula (111X) below.

[Formula 30]

(111X)

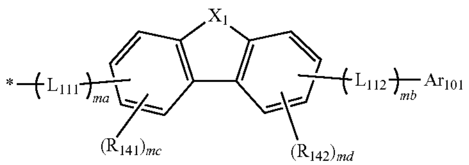

In the formula (111X):

$X_1$ is $CR_{143}R_{144}$, an oxygen atom, a sulfur atom, or $NR_{145}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 1, 2, 3 or 4;

mb is 1, 2, 3 or 4;

ma+mb is 2, 3, or 4;

$Ar_{101}$ represents the same as $Ar_{101}$ in the formula (11X);

$R_{141}$, $R_{142}$, $R_{143}$, $R_{144}$ and $R_{145}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —$COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3;

three $R_{141}$ are mutually the same or different;

md is 3; and three $R_{142}$ are mutually the same or different.

Among positions *1 to *8 of carbon atoms in a cyclic structure represented by a formula (111aX) below in the group represented by the formula (111X), $L_{111}$ is bonded to one of the positions *1 to *4, $R_{141}$ is bonded to each of three positions of the rest of *1 to *4, $L_{112}$ is bonded to one of the positions *5 to *8, and $R_{142}$ is bonded to each of three positions of the rest of *5 to *8.

[Formula 31]

(111aX)

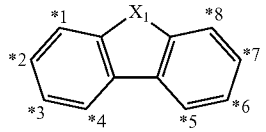

For instance, in the group represented by the formula (111X), when $L_{111}$ is bonded to a carbon atom at *2 in the cyclic structure represented by the formula (111aX) and $L_{112}$ is bonded to a carbon atom at *7 in the cyclic structure represented by the formula (111aX), the group represented by the formula (111X) is represented by a formula (111bX) below.

[Formula 32]

(111bX)

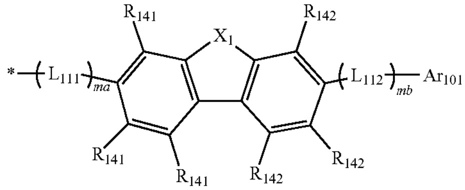

In the formula (111bX):

$X_1$, $L_{111}$, $L_{112}$, ma, mb, $Ar_{101}$, $R_{141}$, $R_{142}$, $R_{143}$, $R_{144}$ and $R_{145}$ each independently represent the same as $X_1$, $L_{111}$, $L_{112}$, ma, mb, $Ar_{101}$, $R_{141}$, $R_{142}$, $R_{143}$, $R_{144}$ and $R_{145}$ in the formula (111X);

a plurality of $R_{141}$ are mutually the same or different; and a plurality of $R_{142}$ are mutually the same or different.

In the organic EL device according to each of the first and second exemplary embodiments, the group represented by the formula (111X) is preferably a group represented by a formula (111bX) below.

In the compound represented by the formula (1X), preferably, ma is 1 or 2 and mb is 1 or 2.

In the compound represented by the formula (1X), preferably, ma is 1 and mb is 1.

In the compound represented by the formula (1X), $Ar_{101}$ is preferably a substituted or unsubstituted aryl group having 6 to 50 ring carbon atoms.

In the compound represented by the formula (1X), $Ar_{101}$ is preferably a substituted or unsubstituted phenyl group, a substituted or unsubstituted naphthyl group, a substituted or unsubstituted biphenyl group, a substituted or unsubstituted terphenyl group, a substituted or unsubstituted benz[a]anthryl group; a substituted or unsubstituted pyrenyl group, a substituted or unsubstituted phenanthryl group, or a substituted or unsubstituted fluorenyl group.

Compound Represented by Formula (12X)

In the organic EL device according to each of the first and second exemplary embodiments, the first compound is also preferably a compound represented by the formula (12X).

[Formula 33]

(12X)

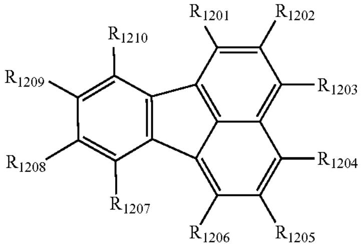

(121)

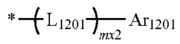

In the formula (12X):

at least one combination of adjacent two or more of $R_{1201}$ to $R_{1210}$ are mutually bonded to form a substituted or unsubstituted monocyclic ring, or mutually bonded to form a substituted or unsubstituted fused ring;

$R_{1201}$ to $R_{1210}$ forming neither the substituted or unsubstituted monocyclic ring nor the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (121);

at least one of a substituent, if present, for the substituted or unsubstituted monocyclic ring, a substituent, if present, for the substituted or unsubstituted fused ring, or $R_{1201}$ to $R_{1210}$ is a group represented by the formula (121);

when a plurality of groups represented by the formula (121) are present, the plurality of groups represented by the formula (121) are mutually the same or $L_{1201}$ is a single bond, a substituted or unsubstituted arylene group having 6 to 50 ring carbon atoms, or a substituted or unsubstituted divalent heterocyclic group having 5 to 50 ring atoms;

$Ar_{1201}$ is a substituted or unsubstituted aryl group having 6 to 50 ring carbon atoms, or a substituted or unsubstituted heterocyclic group having 5 to 50 ring atoms;

mx2 is 0, 1, 2, 3, 4, or 5;

when two or more $L_{1201}$ are present, the two or more $L_{1201}$ are mutually the same or different;

when two or more $Ar_{1201}$ are present, the two or more $Ar_{1201}$ are mutually the same or different; and in the formula (121), * represents a bonding position to a ring represented by the formula (12X).

In the formula (12X), combinations of adjacent two of $R_{1201}$ to $R_{1210}$ refer to a combination of $R_{1201}$ and $R_{1202}$, a combination of $R_{1202}$ and $R_{1203}$, a combination of $R_{1203}$ and $R_{1204}$, a combination of $R_{1204}$ and $R_{1205}$, a combination of $R_{1205}$ and $R_{1206}$, a combination of $R_{1207}$ and $R_{1208}$, a combination of $R_{1208}$ and $R_{1209}$, and a combination of $R_{1209}$ and $R_{1210}$.

Compound Represented by Formula (13X)

In the organic EL device according to each of the first and second exemplary embodiments, the first compound is also preferably a compound represented by the formula (13X).

[Formula 34]

(13X)

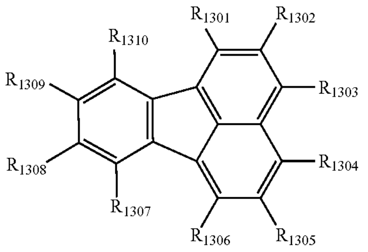

-continued (131)

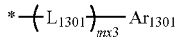

In the formula (13X):

$R_{1301}$ to $R_{1310}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (131);

at least one of $R_{1301}$ to $R_{1310}$ is a group represented by the formula (131);

when a plurality of groups represented by the formula (131) are present, the plurality of groups represented by the formula (131) are mutually the same or different;

$L_{1301}$ is a single bond, a substituted or unsubstituted arylene group having 6 to 50 ring carbon atoms, or a substituted or unsubstituted divalent heterocyclic group having 5 to 50 ring atoms;

$Ar_{1301}$ is a substituted or unsubstituted aryl group having 6 to 50 ring carbon atoms, or a substituted or unsubstituted heterocyclic group having 5 to 50 ring atoms;

mx3 is 0, 1, 2, 3, 4, or 5;

when two or more $L_{1301}$ are present, the two or more $L_{1301}$ are mutually the same or different;

when two or more $Ar_{1301}$ are present, the two or more $Ar_{1301}$ are mutually the same or different; and in the formula (131), * represents a bonding position to a fluoranthene ring in the formula (13X).

In the organic EL device according to each of the first and second exemplary embodiments, none of combinations of adjacent two or more of $R_{1301}$ to $R_{1310}$ not being the group represented by the formula (131) are bonded to each other. Combinations of adjacent two of $R_{1301}$ to $R_{1310}$ in the formula (13X) refer to a combination of $R_{1301}$ and $R_{1302}$, a combination of $R_{1302}$ and $R_{1303}$, a combination of $R_{1303}$ and $R_{1304}$, a combination of $R_{1304}$ and $R_{1305}$, a combination of $R_{1305}$ and $R_{1306}$, a combination of $R_{1307}$ and $R_{1308}$, a combination of $R_{1308}$ and $R_{1309}$, and a combination of $R_{1309}$ and $R_{1310}$.

Compound Represented by Formula (14X)

In the organic EL device according to each of the first and second exemplary embodiments, the first compound is also preferably a compound represented by the formula (14X).

[Formula 35]

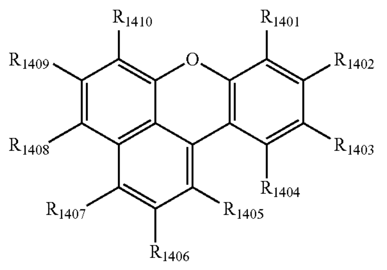

(14X)

$$*\!-\!\left(L_{1401}\right)_{mx4}\!-\!Ar_{1401}$$ (141)

In the formula (14X):

$R_{1401}$ to $R_{1410}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (141);

at least one of $R_{1401}$ to $R_{1410}$ is a group represented by the formula (141);

when a plurality of groups represented by the formula (141) are present, the plurality of groups represented by the formula (141) are mutually the same or different;

$L_{1401}$ is a single bond, a substituted or unsubstituted arylene group having 6 to 50 ring carbon atoms, or a substituted or unsubstituted divalent heterocyclic group having 5 to 50 ring atoms;

$Ar_{1401}$ is a substituted or unsubstituted aryl group having 6 to 50 ring carbon atoms, or a substituted or unsubstituted heterocyclic group having 5 to 50 ring atoms;

mx4 is 0, 1, 2, 3, 4, or 5;

when two or more $L_{1401}$ are present, the two or more $L_{1401}$ are mutually the same or different;

when two or more $Ar_{1401}$ are present, the two or more $Ar_{1401}$ are mutually the same or different; and in the formula (141), * represents a bonding position to a ring represented by the formula (14X).

Compound Represented by Formula (15X)

In the organic EL device according to each of the first and second exemplary embodiments, the first compound is also preferably a compound represented by the formula (15X).

[Formula 36]

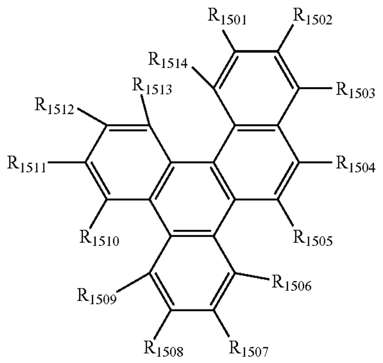

(15X)

$$*\!-\!\left(L_{1501}\right)_{mx5}\!-\!Ar_{1501}$$ (151)

In the formula (15X):

$R_{1501}$ to $R_{1514}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (151);

at least one of $R_{1501}$ to $R_{1514}$ is a group represented by the formula (151);

when a plurality of groups represented by the formula (151) are present, the plurality of groups represented by the formula (151) are mutually the same or different;

$L_{1501}$ is a single bond, a substituted or unsubstituted arylene group having 6 to 50 ring carbon atoms, or a substituted or unsubstituted divalent heterocyclic group having 5 to 50 ring atoms;

$Ar_{1501}$ is a substituted or unsubstituted aryl group having 6 to 50 ring carbon atoms, or a substituted or unsubstituted heterocyclic group having 5 to 50 ring atoms;

mx5 is 0, 1, 2, 3, 4, or 5;

when two or more $L_{1501}$ are present, the two or more $L_{1501}$ are mutually the same or different;

when two or more $Ar_{1501}$ are present, the two or more $Ar_{1501}$ are mutually the same or different; and in the formula (151), * represents a bonding position to a ring represented by the formula (15X).

Compound Represented by Formula (16X)

In the organic EL device according to each of the first and second exemplary embodiments, the first compound is also preferably a compound represented by the formula (16X).

[Formula 37]

(16X)

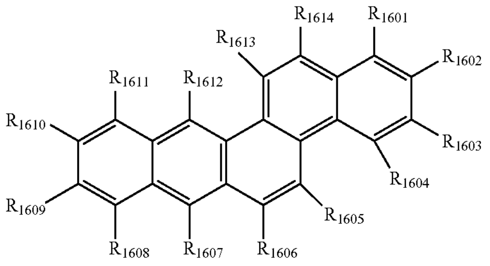

(161)

$*-(L_{1601})_{mx6}-Ar_{1601}$

In the formula (16X):

$R_{1601}$ to $R_{1614}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (161);

at least one of $R_{1601}$ to $R_{1614}$ is a group represented by the formula (161);

when a plurality of groups represented by the formula (161) are present, the plurality of groups represented by the formula (161) are mutually the same or different;

$L_{1601}$ is a single bond, a substituted or unsubstituted arylene group having 6 to 50 ring carbon atoms, or a substituted or unsubstituted divalent heterocyclic group having 5 to 50 ring atoms;

$Ar_{1601}$ is a substituted or unsubstituted aryl group having 6 to 50 ring carbon atoms, or a substituted or unsubstituted heterocyclic group having 5 to 50 ring atoms;

mx6 is 0, 1, 2, 3, 4, or 5;

when two or more $L_{1601}$ are present, the two or more $L_{1601}$ are mutually the same or different;

when two or more $Ar_{1601}$ are present, the two or more $Ar_{1601}$ are mutually the same or different; and in the formula (161), * represents a bonding position to a ring represented by the formula (16X).

In the organic EL device according to each of the first and second exemplary embodiments, it is also preferable that the first host material has, in a molecule, a linking structure including a benzene ring and a naphthalene ring that are linked with a single bond, in which the benzene ring and the naphthalene ring in the linking structure are each independently fused or not fused with a further monocyclic ring or fused ring, and the benzene ring and the naphthalene ring in the linking structure are further linked to each other by cross-linking at at least one site other than the single bond.

When the first host material has the linking structure including such cross-linking, deterioration in the chromaticity of the organic EL device is expected to be inhibited.

The first host material in the above case is only required to have a linking structure as the minimum unit in a molecule, the linking structure including a benzene ring and a naphthalene ring linked to each other with a single bond (occasionally referred to as a benzene-naphthalene linking structure), the linking structure being as represented by a formula (X1) or a formula (X2) below. The benzene ring may be fused with a further monocyclic ring or fused ring, and the naphthalene ring may be fused with a further monocyclic ring or fused ring. For instance, also in a case where the first host material has, in a molecule, a linking structure including a naphthalene ring and a naphthalene ring linked to each other with a single bond (occasionally referred to as a naphthalene-naphthalene linking structure) and being as represented by a formula (X3), a formula (X4), or a formula (X5) below, the naphthalene-naphthalene linking structure is regarded as including the benzene-naphthalene linking structure since one of the naphthalene rings includes a benzene ring.

[Formula 38]

(X1)

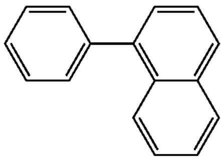

(X2)

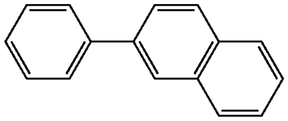

(X3)

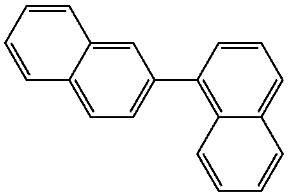

(X4)

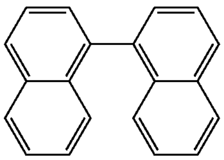

(X5)

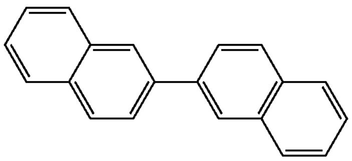

In the organic EL device according to each of the first and second exemplary embodiments, the cross-linking also preferably includes a double bond. Specifically, the first host material also preferably has a structure in which the benzene ring and the naphthalene ring are further linked to each other at any other site than the single bond by the cross-linking structure including a double bond.

Assuming that the benzene ring and the naphthalene ring in the benzene-naphthalene linking structure are further linked to each other at least one site other than the single bond by cross-linking, for instance, a linking structure (fused ring) represented by a formula (X11) below is obtained in a case of the formula (X1), and a linking structure (fused ring) represented by a formula (X31) below is obtained in a case of the formula (X3).

Assuming that the benzene ring and the naphthalene ring in the benzene-naphthalene linking structure are further linked to each other at any other site than the single bond by cross-linking including a double bond, for instance, a linking structure (fused ring) represented by a formula (X12) below is obtained in a case of the formula (X1), a linking structure (fused ring) represented by a formula (X21) or formula (X22) below is obtained in a case of the formula (X2), a linking structure (fused ring) represented by a formula (X41) below is obtained in a case of the formula (X4), and a linking structure (fused ring) represented by a formula (X51) below is obtained in a case of the formula (X5).

Assuming that the benzene ring and the naphthalene ring in the benzene-naphthalene linking structure are further linked to each other at least one site other than the single bond by cross-linking including a hetero atom (e.g., an oxygen atom), for instance, a linking structure (fused ring) represented by a formula (X13) below is obtained in a case of the formula (X1).

[Formula 39]

(X11)

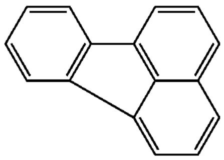

(X12)

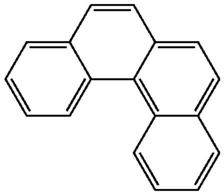

(X13)

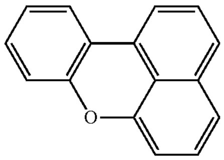

(X21)

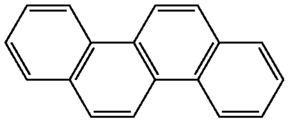

(X22)

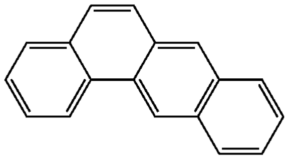

-continued (X31)

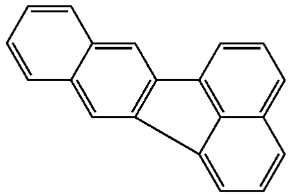

(X41)

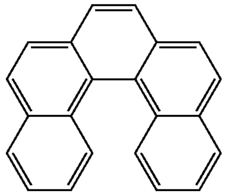

(X51)

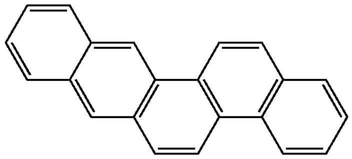

In the organic EL device according to each of the first and second exemplary embodiments, also preferably, the first host material has, in a molecule, a biphenyl structure including a first benzene ring and a second benzene ring linked to each other with a single bond, and the first benzene ring and the second benzene ring in the biphenyl structure are further linked to each other by cross-linking at at least one site other than the single bond.

In the organic EL device according to each of the first and second exemplary embodiments, also preferably, the first benzene ring and the second benzene ring in the biphenyl structure are further linked to each other by the cross-linking at one site other than the single bond. When the first host material has the biphenyl structure including such cross-linking, deterioration in the chromaticity of the organic EL device is expected to be inhibited.

In the organic EL device according to each of the first and second exemplary embodiments, the cross-linking also preferably includes a double bond.

In the organic EL device according to each of the first and second exemplary embodiments, the cross-linking also preferably includes no double bond.

Also preferably, the first benzene ring and the second benzene ring in the biphenyl structure are further linked to each other by the cross-linking at two sites other than the single bond.

In the organic EL device according to each of the first and second exemplary embodiments, also preferably, the first benzene ring and the second benzene ring in the biphenyl structure are further linked to each other by the cross-linking at two sites other than the single bond, and the cross-linking includes no double bond. When the first host material has the biphenyl structure including such cross-linking, deterioration in the chromaticity of the organic EL device is expected to be inhibited.

For instance, assuming that the first benzene ring and the second benzene ring in the biphenyl structure represented by a formula (BP1) below are further linked to each other by cross-linking at at least one site other than the single bond, the biphenyl structure is exemplified by linking structures (fused rings) represented by formulae (BP11) to (BP15) below.

[Formula 40]

(BP1)

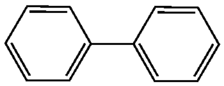

(BP11)

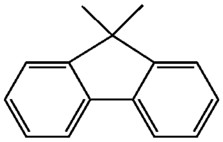

(BP12)

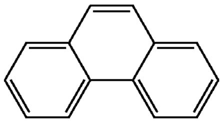

(BP13)

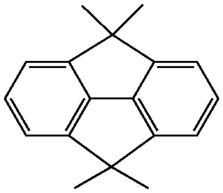

(BP14)

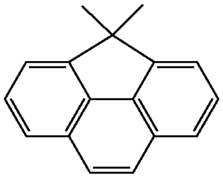

(BP15)

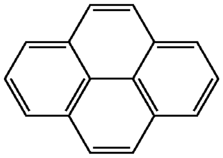

The formula (BP11) represents a linking structure in which the first benzene ring and the second benzene ring are linked to each other at one site other than the single bond by cross-linking including no double bond.

The formula (BP12) represents a linking structure in which the first benzene ring and the second benzene ring are linked to each other at one site other than the single bond by cross-linking including a double bond.

The formula (BP13) represents a linking structure in which the first benzene ring and the second benzene ring are linked to each other at two sites other than the single bond by cross-linking including no double bond.

The formula (BP14) represents a linking structure in which the first benzene ring and the second benzene ring are linked to each other by cross-linking including no double bond at one of two sites other than the single bond, and the first benzene ring and the second benzene ring are linked to each other by cross-linking including a double bond at the other of the two sites other than the single bond.

The formula (BP15) represents a linking structure in which the first benzene ring and the second benzene ring are linked to each other at two sites other than the single bond by cross-linking including a double bond.

In the first compound and the second compound, the groups specified to be "substituted or unsubstituted" are each preferably an "unsubstituted" group.

Method of Producing First Compound

The first compound can be produced by a known method. The first compound can also be produced based on a known method through a known alternative reaction using a known material(s) tailored for the target compound.

Specific Examples of First Compound

Specific examples of the first compound usable in the organic EL device according to the first exemplary embodiment include the following compounds. It should however be noted that the invention is not limited to the specific examples of the first compound.

[Formula 41]

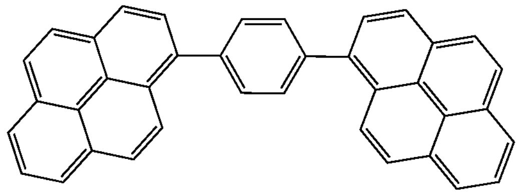

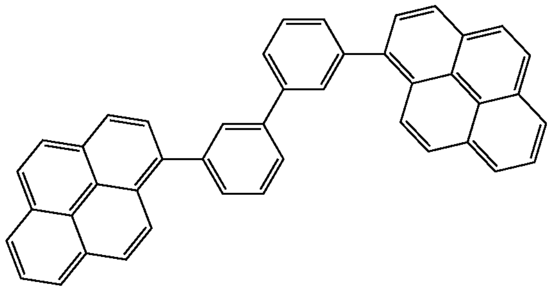

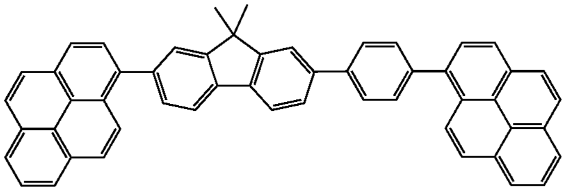

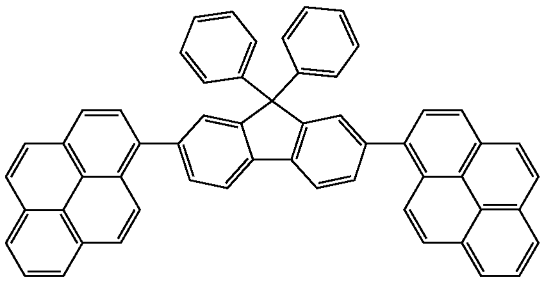

-continued

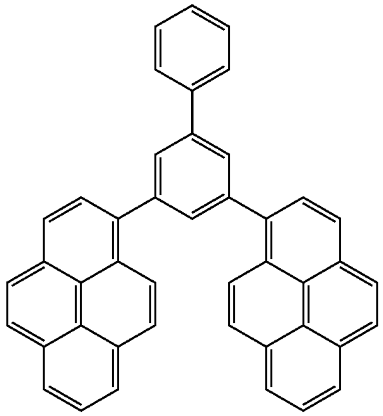

Specific examples of the first compound usable in the organic EL device according to the second exemplary embodiment include the following compounds. It should however be noted that the invention is not limited to the specific examples of the first compound.

[Formula 42]

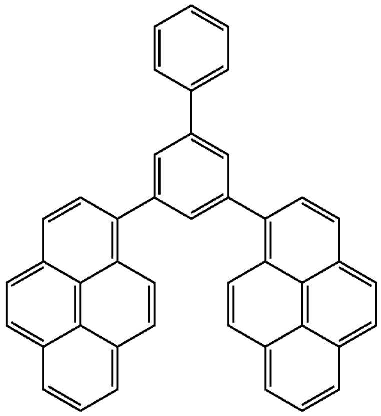

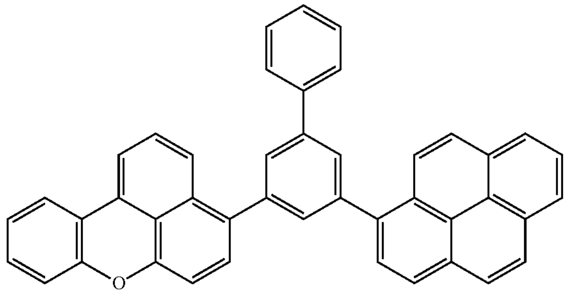

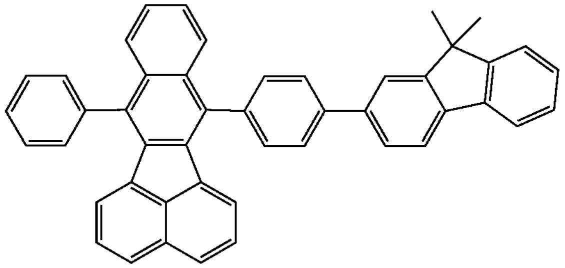

-continued

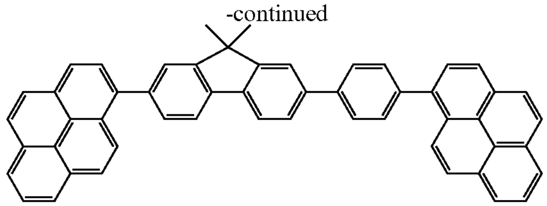

Second Compound

In the organic EL device according to each of the first and second exemplary embodiments, the second host material is preferably a compound with a fused aromatic ring, a compound with a fused heteroaromatic ring, or a compound with a fused aromatic ring and a fused heteroaromatic ring. The fused aromatic ring is preferably a compound having one or more skeletons selected from the group consisting of an anthracene skeleton, a pyrene skeleton, a fluoranthene skeleton, a phenanthrene skeleton, a naphthalene skeleton, a fluorene skeleton, a chrysene skeleton, a triphenylene skeleton, a tetracene skeleton, a benzanthracene skeleton, and a benzocrysene skeleton. The fused heteroaromatic ring is preferably a compound having one or more skeletons selected from the group consisting of a dibenzofuran skeleton, a dibenzothiophene skeleton, a xanthene skeleton, and a benzoxanthene skeleton.

In particular, the second host material is preferably a compound that causes TTF more efficiently than the first host material, preferably a compound having an anthracene skeleton, more preferably a compound represented by the formula (2) below.

[Formula 43]

(2)

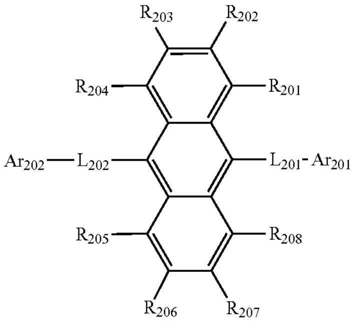

In the formula (2):

$R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$L_{201}$ and $L_{202}$ are each independently a single bond, a substituted or unsubstituted arylene group having 6 to 50 ring carbon atoms, or a substituted or unsubstituted divalent heterocyclic group having 5 to 50 ring atoms; and $Ar_{201}$ and $Ar_{202}$ are each independently a substituted or unsubstituted aryl group having 6 to 50 ring carbon atoms, or a substituted or unsubstituted heterocyclic group having 5 to 50 ring atoms.

In the second compound according to each of the first and second exemplary embodiments, $R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

In the organic EL device according to each of the first and second exemplary embodiments, preferably, $R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a substituted or unsubstituted aralkyl group having 7 to 50 carbon atoms, a group represented by $-C(=O)R_{801}$, a group represented by $-COOR_{802}$, a halogen atom, a cyano group, or a nitro group;

$L_{201}$ and $L_{202}$ are each independently a single bond, a substituted or unsubstituted arylene group having 6 to 50 ring carbon atoms, or a substituted or unsubstituted divalent heterocyclic group having 5 to 50 ring atoms; and $Ar_{201}$ and $Ar_{202}$ are each independently a substituted or unsubstituted aryl group having 6 to 50 ring carbon atoms, or a substituted or unsubstituted heterocyclic group having 5 to 50 ring atoms.

In the organic EL device according to each of the first and second exemplary embodiments, preferably, $L_{201}$ and $L_{202}$ are each independently a single bond, or a substituted or unsubstituted arylene group having 6 to 50 ring carbon atoms; and $Ar_{201}$ and $Ar_{202}$ are each independently a substituted or unsubstituted aryl group having 6 to 50 ring carbon atoms.

In the organic EL device according to each of the first and second exemplary embodiments, preferably, $Ar_{201}$ and $Ar_{202}$ are each independently a phenyl group, naphthyl group, phenanthryl group, biphenyl group, terphenyl group, diphenylfluorenyl group, dimethylfluorenyl group, benzodiphenylfluorenyl group, benzodimethylfluorenyl group, dibenzofuranyl group, dibenzothienyl group, naphthobenzofuranyl group, or naphthobenzothienyl group.

In the organic EL device according to each of the first and second exemplary embodiments, the second compound represented by the formula (2) is preferably a compound represented by a formula (201), a formula (202), a formula (203), a formula (204), a formula (205), a formula (206), a formula (207), a formula (208), or a formula (209) below.

[Formula 44]

(201)

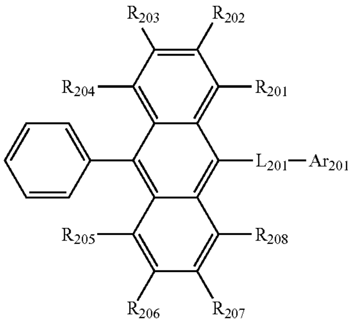

[Formula 45]

(202)

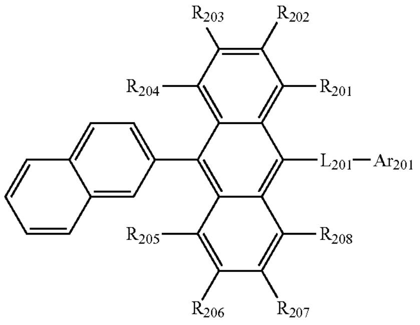

[Formula 46]

(203)

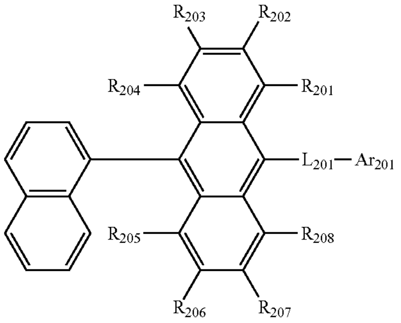

-continued

[Formula 47]

(204)

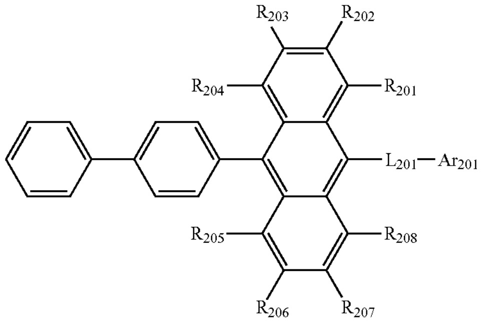

[Formula 48]

(205)

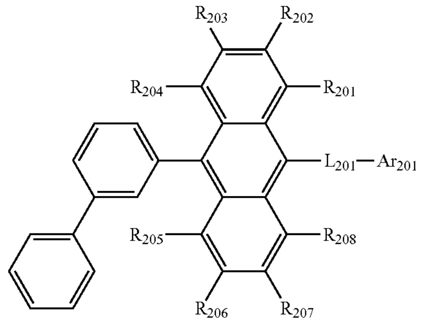

[Formula 49]

(206)

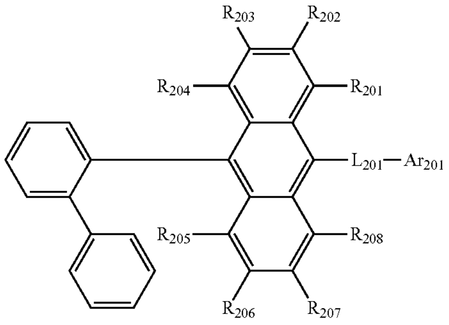

[Formula 50]

(207)

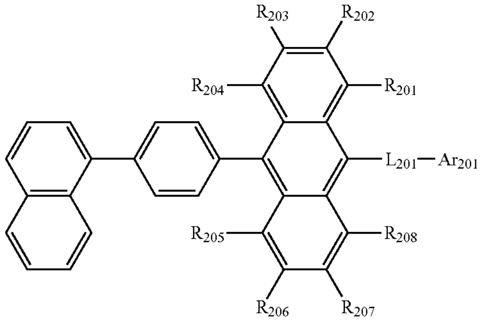

-continued

[Formula 51]

(208)

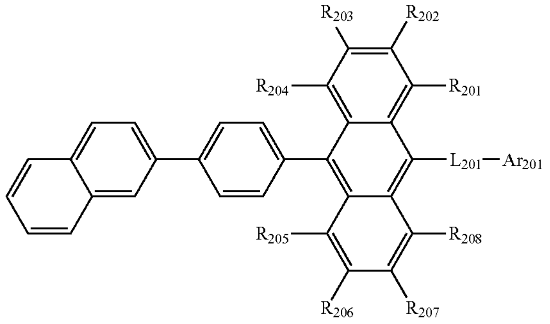

[Formula 52]

(209)

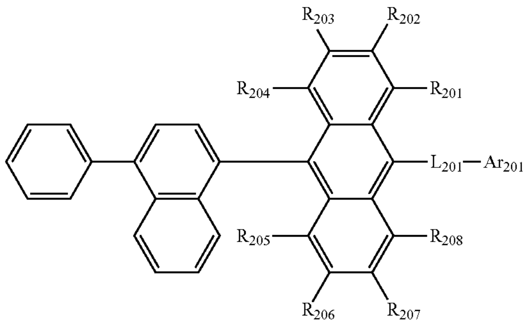

In the formulae (201) to (209):

$L_{201}$ and $Ar_{201}$ represent the same as $L_{201}$ and $Ar_{201}$ in the formula (2); and $R_{201}$ to $R_{208}$ each independently represent the same as $R_{201}$ to $R_{208}$ in the formula (2).

In the formulae (201) to (209), $R_{202}$ and $R_{203}$ are each independently preferably $-L_{203}-Ar_{203}$, more preferably either $R_{202}$ or $R_{203}$ is $-L_{203}-Ar_{203}$.

$L_{203}$ represents the same as $L_{201}$ in the formula (2), and $Ar_{203}$ is the same as $Ar_{201}$ in the formula (2).

$L_{203}$ and $L_{201}$ are mutually the same or different, and $Ar_{203}$ and $Ar_{201}$ are mutually the same or different.

When $R_{202}$ and $R_{203}$ are each $-L_{203}-Ar_{203}$, the two $L_{203}$ are mutually the same or different, and the two $Ar_{203}$ are mutually the same or different.

In the organic EL device according to each of the first and second exemplary embodiments, when the second host material is a second compound represented by the formula (2), $R_{201}$ to $R_{208}$ that are substituents of an anthracene skeleton in the second compound represented by the formula (2) are preferably hydrogen atoms in terms of preventing inhibition of intermolecular interaction and inhibiting decrease in electron mobility. However, $R_{201}$ to $R_{208}$ may be a substituted or unsubstituted aryl group having 6 to 50 ring carbon atoms or a substituted or unsubstituted heterocyclic group having 5 to 50 ring atoms.

Assuming that $R_{201}$ to $R_{208}$ each are a bulky substituent such as an alkyl group and a cycloalkyl group, intermolecular interaction may be inhibited to decrease the electron mobility of the second compound relative to that of the first host material, so that the relationship of $\mu e(H2) > \mu e(H1)$ shown by the numerical formula (Numerical Formula 4) may not be satisfied. When the second compound is used as the second host material in the second emitting layer, it can be expected that satisfying the relationship of μe(H2)>μe (H1) inhibits a decrease in a recombination ability between holes and electrons in the first emitting layer and a decrease in luminous efficiency. It should be noted that substituents, namely, a haloalkyl group, alkenyl group, alkynyl group, group represented by —Si($R_{901}$)($R_{902}$)($R_{903}$), group represented by —O—($R_{904}$), group represented by —S—($R_{905}$), group represented by —N($R_{906}$)($R_{907}$), aralkyl group, group represented by —C(═O)$R_{801}$, group represented by —COO$R_{802}$, halogen atom, cyano group, and nitro group are likely to be bulky, and an alkyl group and cycloalkyl group are likely to be further bulky.

In the second compound represented by the formula (2), $R_{201}$ to $R_{208}$, which are the substituents on the anthracene skeleton, are each preferably not a bulky substituent and preferably not an alkyl group and cycloalkyl group. More preferably, $R_{201}$ to $R_{208}$ are each not an alkyl group, cycloalkyl group, haloalkyl group, alkenyl group, alkynyl group, group represented by —Si($R_{901}$)($R_{902}$)($R_{903}$), group represented by —O—($R_{904}$), group represented by —S—($R_{905}$), group represented by —N($R_{906}$)($R_{907}$), aralkyl group, group represented by —C(═O)$R_{801}$, group represented by —COO$R_{802}$, halogen atom, cyano group, and nitro group.

In the organic EL device according to each of the first and second exemplary embodiments, in the second compound represented by the formula (2), $R_{201}$ to $R_{208}$ are preferably each independently a hydrogen atom, a substituted or unsubstituted alkyl group having 1 to 50 carbon atoms, a substituted or unsubstituted cycloalkyl group having 3 to 50 ring carbon atoms, or a group represented by —Si($R_{901}$)($R_{902}$)($R_{903}$).

In the organic EL device according to each of the first and second exemplary embodiments, in the second compound represented by the formula (2), $R_{201}$ to $R_{208}$ are each preferably a hydrogen atom.

In the second compound, examples of the substituent for the "substituted or unsubstituted" group on $R_{201}$ to $R_{208}$ also preferably do not include the above-described substituent that is likely to be bulky, especially a substituted or unsubstituted alkyl group and a substituted or unsubstituted cycloalkyl group. When examples of the substituent for the "substituted or unsubstituted" group on $R_{201}$ to $R_{208}$ do not include a substituted or unsubstituted alkyl group and a substituted or unsubstituted cycloalkyl group, inhibition of intermolecular interaction to be caused by presence of a bulky substituent such as an alkyl group and a cycloalkyl group can be prevented, thereby preventing a decrease in the electron mobility. Moreover, when the second compound described above is used as the second host material in the second emitting layer, a decrease in a recombination ability between holes and electrons in the first emitting layer and a decrease in the luminous efficiency can be inhibited.

Further preferably, $R_{201}$ to $R_{208}$ that are the substituents on the anthracene skeleton are not bulky substituents and $R_{201}$ to $R_{208}$ as substituents are unsubstituted. Assuming that $R_{201}$ to $R_{208}$ that are the substituents on the anthracene skeleton are not bulky substituents and substituents are bonded to $R_{201}$ to $R_{208}$ that are not bulky substituents, the substituents bonded to $R_{201}$ to $R_{208}$ are preferably not bulky substituents; and the substituents bonded to $R_{201}$ to $R_{208}$ serving as substituents are preferably not an alkyl group and cycloalkyl group, more preferably not an alkyl group, cycloalkyl group, haloalkyl group, alkenyl group, alkynyl group, group represented by —Si($R_{901}$)($R_{902}$)($R_{903}$), group represented by —O—($R_{904}$), group represented by —S—($R_{905}$), group represented by —N($R_{906}$)($R_{907}$), aralkyl group, group represented by —C(═O)$R_{801}$, group represented by —COO$R_{802}$, halogen atom, cyano group, and nitro group.

In the second compound, the groups specified to be "substituted or unsubstituted" are each preferably an "unsubstituted" group.

Method of Producing Second Compound

The second compound can be produced by a known method. The second compound can also be produced based on a known method through a known alternative reaction using a known material(s) tailored for the target compound.

Specific Examples of Second Compound

Specific examples of the second compound include the following compounds. It should however be noted that the invention is not limited to the specific examples of the second compound.

[Formula 53]

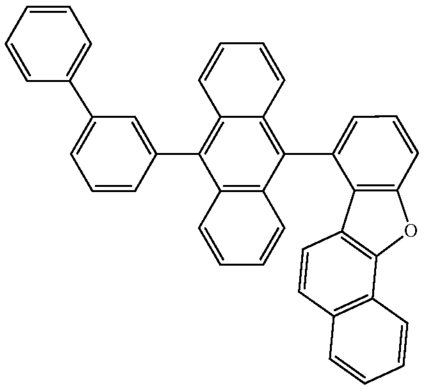

First Luminescent Compound, Second Luminescent Compound and Third Luminescent Compound In the organic EL device according to each of the first and second exemplary embodiments, the first luminescent compound, the second luminescent compound and the third luminescent compound are preferably each independently a compound with a fused aromatic ring, a compound with a heterocyclic ring, or a compound with a fused aromatic ring and a fused heteroaromatic ring. The heterocyclic ring preferably has a boron atom. The heterocyclic ring is preferably a heteroaromatic ring. The first luminescent compound, the second luminescent compound and the third luminescent compound are preferably each independently a compound with a heteroaromatic ring having a pyrene derivative, a styrylamine derivative, a chrysene derivative, a fluoranthene derivative, a fluorene derivative, a diamine derivatives, a triarylamine derivative, a carbazole derivative or a boron atom.

Examples of the first luminescent compound, the second luminescent compound, and the third luminescent compound are, for instance, a third compound and a fourth compound below.

The third compound and the fourth compound are each independently at least one compound selected from the group consisting of a compound represented by a formula (3), a compound represented by a formula (4), a compound represented by a formula (6), a compound represented by a formula (7), a compound represented by a formula (8), a compound represented by a formula (9), and a compound represented by the formula (10) below.

Compound Represented by Formula (3)

The compound represented by the formula (3) will be described below.

[Formula 54]

(3)

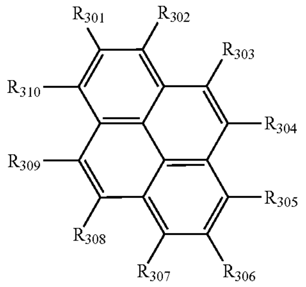

In the formula (3):

at least one combination of adjacent two or more of $R_{301}$ to $R_{310}$ are mutually bonded to form a substituted or unsubstituted monocyclic ring, mutually bonded to form a substituted or unsubstituted fused ring, or not mutually bonded;

at least one of $R_{301}$ to $R_{310}$ is a monovalent group represented by a formula (31) below; and $R_{301}$ to $R_{310}$ forming neither the monocyclic ring nor the fused ring and not being the monovalent group represented by the formula (31) are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

[Formula 55]

(31)

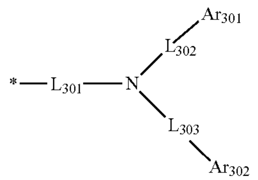

In the formula (31):

$Ar_{301}$ and $Ar_{302}$ are each independently a substituted or unsubstituted aryl group having 6 to 50 ring carbon atoms, or a substituted or unsubstituted heterocyclic group having 5 to 50 ring atoms;

$L_{301}$ to $L_{303}$ are each independently a single bond, a substituted or unsubstituted arylene group having 6 to 30 ring carbon atoms, or a substituted or unsubstituted divalent heterocyclic group having 5 to 30 ring atoms; and

* represents a bonding position to a pyrene ring in the formula (3).

In the third and fourth compounds, $R_{901}$, $R_{902}$, $R_{903}$, $R_{904}$, $R_{905}$, $R_{906}$, and $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, or a substituted or unsubstituted aryl group having 6 to 50 ring carbon atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different.

In the formula (3), two of $R_{301}$ to $R_{310}$ are each preferably a group represented by the formula (31).

In an exemplary embodiment, the compound represented by the formula (3) is a compound represented by a formula (33) below.

[Formula 56]

(33)

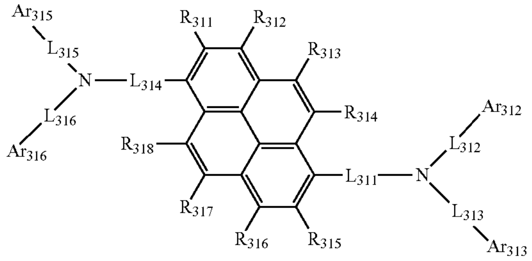

In the formula (33):

$R_{311}$ to $R_{318}$ each independently represent the same as $R_{301}$ to $R_{310}$ in the formula (3) that are each not a monovalent group represented by the formula (31);

$L_{311}$ to $L_{316}$ are each independently a single bond, a substituted or unsubstituted arylene group having 6 to 30 ring carbon atoms, or a substituted or unsubstituted divalent heterocyclic group having 5 to 30 ring atoms; and $Ar_{312}$, $Ar_{313}$, $Ar_{315}$, and $Ar_{316}$ are each independently a substituted or unsubstituted aryl group having 6 to 50 ring carbon atoms, or a substituted or unsubstituted heterocyclic group having 5 to 50 ring atoms.

In the formula (31), $L_{301}$ is preferably a single bond, and $L_{302}$ and $L_{303}$ are each preferably a single bond.

In the formula (33), $L_{311}$ and $L_{314}$ are each preferably a single bond, and $L_{312}$, $L_{313}$, $L_{315}$ and $L_{316}$ are each preferably a single bond.

In the formula (31), at least one of $Ar_{301}$ or $Ar_{302}$ is preferably a group represented by a formula (36) below.

In the formula (33), at least one of $Ar_{312}$ or $Ar_{313}$ is preferably a group represented by a formula (36) below.

In the formula (33), at least one of $Ar_{315}$ or $Ar_{316}$ is preferably a group represented by a formula (36) below.

[Formula 57]

(36)

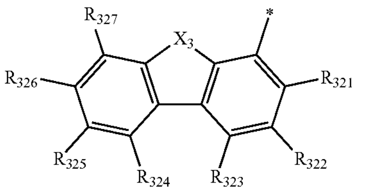

In the formula (36):

$X_3$ represents an oxygen atom or a sulfur atom;

at least one combination of adjacent two or more of $R_{321}$ to $R_{327}$ are mutually bonded to form a substituted or unsubstituted monocyclic ring, mutually bonded to form a substituted or unsubstituted fused ring, or not mutually bonded;

$R_{321}$ to $R_{327}$ forming neither the monocyclic ring nor the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms; and

* represents a bonding position to $L_{302}$, $L_{303}$, $L_{312}$, $L_{313}$, $L_{315}$ or $L_{316}$.

$X_3$ is preferably an oxygen atom.

At least one of $R_{321}$ to $R_{327}$ is preferably a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

In the formula (31), preferably, $Ar_{301}$ is a group represented by the formula (36) and $Ar_{302}$ is a substituted or unsubstituted aryl group having 6 to 50 ring carbon atoms.

In the formula (33), $Ar_{312}$ is preferably a group represented by the formula (36), and $Ar_{313}$ is preferably a substituted or unsubstituted aryl group having 6 to 50 ring carbon atoms.

In the formula (33), preferably, $Ar_{315}$ is a group represented by the formula (36) and $Ar_{316}$ is a substituted or unsubstituted aryl group having 6 to 50 ring carbon atoms.

Compound Represented by Formula (4)

The compound represented by the formula (4) will be described below.

[Formula 58]

(4)

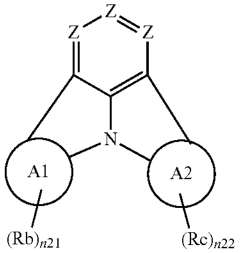

In the formula (4):

Z are each independently CRa or a nitrogen atom;

A1 ring and A2 ring are each independently a substituted or unsubstituted aromatic hydrocarbon ring having 6 to 50 ring carbon atoms, or a substituted or unsubstituted heterocycle having 5 to 50 ring atoms;

when a plurality of Ra are present, at least one combination of adjacent two or more of the plurality of Ra are mutually bonded to form a substituted or unsubstituted monocyclic ring, mutually bonded to form a substituted or unsubstituted fused ring, or not mutually bonded;

n21 and n22 are each independently 0, 1, 2, 3 or 4;

when a plurality of Rb are present, at least one combination of adjacent two or more of the plurality of Rb are mutually bonded to form a substituted or unsubstituted monocyclic ring, mutually bonded to form a substituted or unsubstituted fused ring, or not mutually bonded;

when a plurality of Rc are present, at least one combination of adjacent two or more of the plurality of Rc are mutually bonded to form a substituted or unsubstituted monocyclic ring, mutually bonded to form a substituted or unsubstituted fused ring, or not mutually bonded; and Ra, Rb, and Rc forming neither the monocyclic ring nor the fused ring are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms.

The "aromatic hydrocarbon ring" for the A1 ring and A2 ring has the same structure as a compound formed by introducing a hydrogen atom to the "aryl group" described above.

Ring atoms of the "aromatic hydrocarbon ring" for the A1 ring and A2 ring include two carbon atoms on a fused bicyclic structure at the center of the formula (4).

Specific examples of the "substituted or unsubstituted aromatic hydrocarbon ring having 6 to 50 ring carbon atoms" include a compound formed by introducing a hydrogen atom to the "aryl group" described in the specific example group G1.

The "heterocycle" for the A1 ring and A2 ring has the same structure as a compound formed by introducing a hydrogen atom to the "heterocyclic group" described above.

Ring atoms of the "heterocycle" for the A1 ring and A2 ring include two carbon atoms on a fused bicyclic structure at the center of the formula (4).

Specific examples of the "substituted or unsubstituted heterocycle having 5 to 50 ring atoms" include a compound formed by introducing a hydrogen atom to the "heterocyclic group" described in the specific example group G2.

Rb is bonded to any one of carbon atoms forming the aromatic hydrocarbon ring as the A1 ring or any one of atoms forming the heterocycle as the A1 ring.

Rc is bonded to any one of carbon atoms forming the aromatic hydrocarbon ring as the A2 ring or any one of atoms forming the heterocycle as the A2 ring.

At least one of Ra, Rb, or Rc is preferably a group represented by a formula (4a) below. More preferably, at least two of Ra, Rb, or Rc are each a group represented by the formula (4a).

[Formula 59]

(4a)

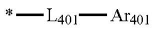

In the formula (4a):

$L_{401}$ is a single bond, a substituted or unsubstituted arylene group having 6 to 30 ring carbon atoms, or a substituted or unsubstituted divalent heterocyclic group having 5 to 30 ring atoms; and $Ar_{401}$ is a substituted or unsubstituted aryl group having 6 to 50 ring carbon atoms, a substituted or unsubstituted heterocyclic group having 5 to 50 ring atoms, or a group represented by a formula (4b) below.

[Formula 60]

(4b)

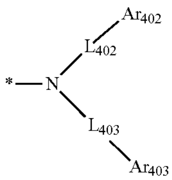

In the formula (4b):

$L_{402}$ and $L_{403}$ are each independently a single bond, a substituted or unsubstituted arylene group having 6 to 30 ring carbon atoms, or a substituted or unsubstituted divalent heterocyclic group having 5 to 30 ring atoms;

a combination of $Ar_{402}$ and $Ar_{403}$ are mutually bonded to form a substituted or unsubstituted monocyclic ring, mutually bonded to form a substituted or unsubstituted fused ring, or not mutually bonded; and $Ar_{402}$ and $Ar_{403}$ forming neither the monocyclic ring nor the fused ring are each independently a substituted or unsubstituted aryl group having 6 to 50 ring carbon atoms, or a substituted or unsubstituted heterocyclic group having 5 to 50 ring atoms.

In an exemplary embodiment, the compound represented by the formula (4) is represented by a formula (42) below.

[Formula 61]

(42)

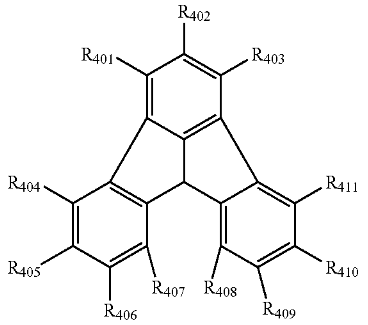

In the formula (42):

at least one combination of adjacent two or more of $R_{401}$ to $R_{411}$ are mutually bonded to form a substituted or unsubstituted monocyclic ring, mutually bonded to form a substituted or unsubstituted fused ring, or not mutually bonded; and $R_{401}$ to $R_{411}$ forming neither the monocyclic ring nor the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms.

At least one of $R_{401}$ to $R_{411}$ is preferably a group represented by the formula (4a). More preferably, at least two of $R_{401}$ to $R_{411}$ are each a group represented by the formula (4a).

$R_{404}$ and $R_{411}$ are each preferably a group represented by the formula (4a).

In an exemplary embodiment, the compound represented by the formula (4) is a compound formed by bonding a structure represented by a formula (4-1) or a formula (4-2) below to the A1 ring.

Further, in an exemplary embodiment, the compound represented by the formula (42) is a compound formed by bonding the structure represented by the formula (4-1) or the formula (4-2) below to a ring bonded to $R_{404}$ to $R_{407}$.

[Formula 62]

(4-1)

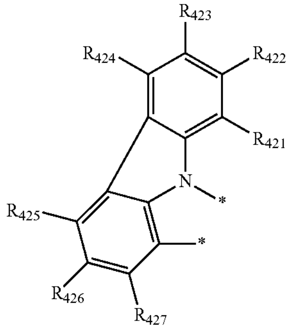

-continued (4-2)

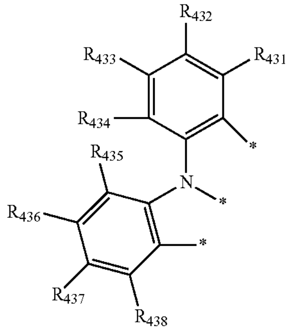

In the formula (4-1), two * are each independently bonded to a ring-forming carbon atom of the aromatic hydrocarbon ring or a ring atom of the heterocycle as the A1 ring in the formula (4) or bonded to one of $R_{404}$ to $R_{407}$ in the formula (42);

in the formula (4-2), three * are each independently bonded to a ring-forming carbon atom of the aromatic hydrocarbon ring or a ring atom of the heterocycle as the A1 ring in the formula (4) or bonded to one of $R_{404}$ to $R_{407}$ in the formula (42);

at least one combination of adjacent two or more of $R_{421}$ to $R_{427}$ are mutually bonded to form a substituted or unsubstituted monocyclic ring, mutually bonded to form a substituted or unsubstituted fused ring, or not mutually bonded;

at least one combination of adjacent two or more of $R_{431}$ to $R_{438}$ are mutually bonded to form a substituted or unsubstituted monocyclic ring, mutually bonded to form a substituted or unsubstituted fused ring, or not mutually bonded; and $R_{421}$ to $R_{427}$ and $R_{431}$ to $R_{438}$ forming neither the monocyclic ring nor the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

In an exemplary embodiment, the compound represented by the formula (4) is a compound represented by a formula (41-3), a formula (41-4) or a formula (41-5) below.

[Formula 63]

(41-3)

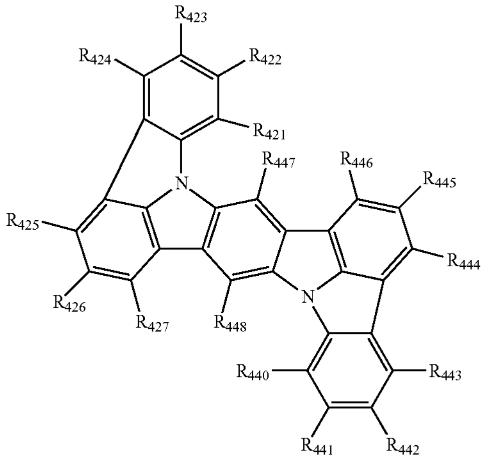

[Formula 64]

(41-4)

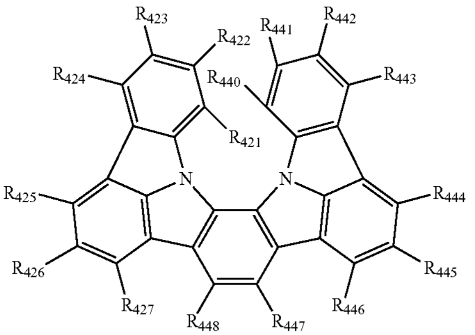

[Formula 65]

(41-5)

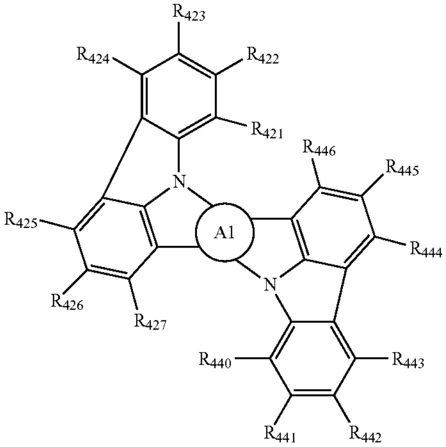

In the formulae (41-3), (41-4), and (41-5):

A1 ring is defined as in the formula (4);

$R_{421}$ to $R_{427}$ each independently represent the same as $R_{421}$ to $R_{427}$ in the formula (4-1); and $R_{440}$ to $R_{448}$ each independently represent the same as $R_{401}$ to $R_{411}$ in the formula (42).

In an exemplary embodiment, a substituted or unsubstituted aromatic hydrocarbon ring having 6 to 50 ring carbon atoms as the A1 ring in the formula (41-5) is a substituted or unsubstituted naphthalene ring, or a substituted or unsubstituted fluorene ring.

In an exemplary embodiment, a substituted or unsubstituted heterocycle having 5 to 50 ring atoms as the A1 ring in the formula (41-5) is a substituted or unsubstituted dibenzofuran ring, a substituted or unsubstituted carbazole ring, or a substituted or unsubstituted dibenzothiophene ring.

Compound Represented by Formula (6)

The compound represented by the formula (6) will be described below.

[Formula 66]

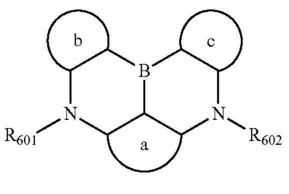

(6)

In the formula (6):

a ring a, a ring b and a ring c are each independently a substituted or unsubstituted aromatic hydrocarbon ring having 6 to 50 ring carbon atoms, or a substituted or unsubstituted heterocycle having 5 to 50 ring atoms;

$R_{601}$ and $R_{602}$ are each independently bonded to the ring a, ring b or ring c to form a substituted or unsubstituted heterocycle, or not bonded thereto to form no substituted or unsubstituted heterocycle; and $R_{601}$ and $R_{602}$ not forming the substituted or unsubstituted heterocycle are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

The ring a, ring b and ring c are each a ring (a substituted or unsubstituted aromatic hydrocarbon ring having 6 to 50 ring carbon atoms, or a substituted or unsubstituted heterocycle having 5 to 50 ring atoms) fused with a fused bicyclic structure formed of a boron atom and two nitrogen atoms at the center of the formula (6).

The "aromatic hydrocarbon ring" for the rings a, b, and c has the same structure as a compound formed by introducing a hydrogen atom to the "aryl group" described above.

Ring atoms of the "aromatic hydrocarbon ring" for the ring a include three carbon atoms on the fused bicyclic structure at the center of the formula (6).

Ring atoms of the "aromatic hydrocarbon ring" for the rings b and c include two carbon atoms on the fused bicyclic structure at the center of the formula (6).

Specific examples of the "substituted or unsubstituted aromatic hydrocarbon ring having 6 to 50 ring carbon atoms" include a compound formed by introducing a hydrogen atom to the "aryl group" described in the specific example group G1.

The "heterocycle" for the rings a, b, and c has the same structure as a compound formed by introducing a hydrogen atom to the "heterocyclic group" described above.

Ring atoms of the "heterocycle" for the ring a include three carbon atoms on the fused bicyclic structure at the center of the formula (6). Ring atoms of the "heterocycle" for the rings b and c include two carbon atoms on the fused bicyclic structure at the center of the formula (6). Specific examples of the "substituted or unsubstituted heterocycle having 5 to 50 ring atoms" include a compound formed by introducing a hydrogen atom to the "heterocyclic group" described in the specific example group G2.

$R_{601}$ and $R_{602}$ may be each independently bonded with the ring a, ring b, or ring c to form a substituted or unsubstituted heterocycle. The "heterocycle" in this arrangement includes a nitrogen atom on the fused bicyclic structure at the center of the formula (6). The heterocycle in the above arrangement optionally includes a hetero atom other than the nitrogen atom. $R_{601}$ and $R_{602}$ being bonded with the ring a, ring b, or ring c specifically means that atoms forming $R_{601}$ and $R_{602}$ are bonded with atoms forming the ring a, ring b, or ring c. For instance, $R_{601}$ may be bonded with the ring a to form a bicyclic (or tri-or-more cyclic) fused nitrogen-containing heterocycle, in which the ring including $R_{601}$ and the ring a are fused. Specific examples of the nitrogen-containing heterocycle include a compound corresponding to the nitrogen-containing bi(or-more)cyclic fused heterocyclic group in the specific example group G2.

The same applies to $R_{601}$ bonded with the ring b, $R_{602}$ bonded with the ring a, and $R_{602}$ bonded with the ring c.

In an exemplary embodiment, the ring a, ring b and ring c in the formula (6) are each independently a substituted or unsubstituted aromatic hydrocarbon ring having 6 to 50 ring carbon atoms.

In an exemplary embodiment, the ring a, ring b and ring c in the formula (6) are each independently a substituted or unsubstituted benzene ring or a substituted or unsubstituted naphthalene ring.

In an exemplary embodiment, $R_{601}$ and $R_{602}$ in the formula (6) are each independently a substituted or unsubstituted aryl group having 6 to 50 ring carbon atoms, or a substituted or unsubstituted heterocyclic group having 5 to 50 ring atoms; preferably a substituted or unsubstituted aryl group having 6 to 50 ring carbon atoms.

In an exemplary embodiment, the compound represented by the formula (6) is a compound represented by a formula (62) below.

[Formula 67]

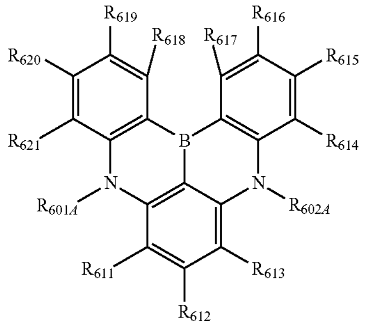

(62)

In the formula (62):

$R_{601A}$ is bonded with at least one of $R_{611}$ or $R_{621}$ to form a substituted or unsubstituted heterocycle, or not bonded therewith to form no substituted or unsubstituted heterocycle;

$R_{602A}$ is bonded with at least one of $R_{613}$ or $R_{614}$ to form a substituted or unsubstituted heterocycle, or not bonded therewith to form no substituted or unsubstituted heterocycle;

$R_{601A}$ and $R_{602A}$ not forming the substituted or unsubstituted heterocycle are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

at least one combination of adjacent two or more of $R_{611}$ to $R_{621}$ are mutually bonded to form a substituted or unsubstituted monocyclic ring, mutually bonded to form a substituted or unsubstituted fused ring, or not mutually bonded; and $R_{611}$ to $R_{621}$ not forming the substituted or unsubstituted heterocycle, not forming the monocyclic ring, and not forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms.

$R_{601A}$ and $R_{602A}$ in the formula (62) are groups corresponding to $R_{601}$ and $R_{602}$ in the formula (6), respectively.

For instance, $R_{601A}$ and $R_{611}$ are optionally bonded with each other to form a bicyclic (or tri-or-more cyclic) fused nitrogen-containing heterocycle, in which the ring including $R_{601A}$ and $R_{611}$ and a benzene ring corresponding to the ring a are fused. Specific examples of the nitrogen-containing heterocycle include a compound corresponding to the nitrogen-containing bi(or-more)cyclic fused heterocyclic group in the specific example group G2. The same applies to $R_{601A}$ bonded with $R_{621}$, $R_{602A}$ bonded with $R_{613}$, and $R_{602A}$ bonded with $R_{614}$.

At least one combination of adjacent two or more of $R_{611}$ to $R_{621}$ may be mutually bonded to form a substituted or unsubstituted monocyclic ring, or mutually bonded to form a substituted or unsubstituted fused ring.

For instance, $R_{611}$ and $R_{612}$ are optionally mutually bonded to form a structure in which a benzene ring, indole ring, pyrrole ring, benzofuran ring, benzothiophene ring or the like is fused to the six-membered ring bonded with $R_{611}$ and $R_{612}$, the resultant fused ring forming a naphthalene ring, carbazole ring, indole ring, dibenzofuran ring, or dibenzothiophene ring, respectively.

In an exemplary embodiment, $R_{611}$ to $R_{621}$ not contributing to ring formation are each independently a hydrogen atom, a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms.

In an exemplary embodiment, $R_{611}$ to $R_{621}$ not contributing to ring formation are each independently a hydrogen atom, a substituted or unsubstituted aryl group having 6 to 50 ring carbon atoms, or a substituted or unsubstituted heterocyclic group having 5 to 50 ring atoms.

In an exemplary embodiment, $R_{611}$ to $R_{621}$ not contributing to ring formation are each independently a hydrogen atom, or a substituted or unsubstituted alkyl group having 1 to 50 carbon atoms.

In an exemplary embodiment, $R_{611}$ to $R_{621}$ not contributing to ring formation are each independently a hydrogen atom, or a substituted or unsubstituted alkyl group having 1 to 50 carbon atoms; and at least one of $R_{611}$ to $R_{621}$ is a substituted or unsubstituted alkyl group having 1 to 50 carbon atoms.

Compound Represented by Formula (7)

The compound represented by the formula (7) will be described below.

[Formula 68]

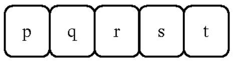

(7)

[Formula 69]

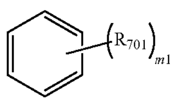

(72)

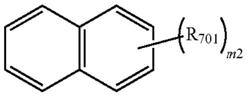

(73)

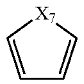

(74)

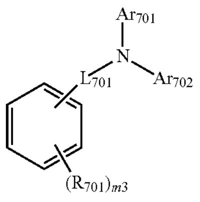

(75)

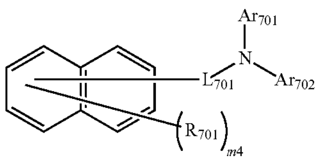

(76)

In the formula (7):

a ring r is a ring represented by the formula (72) or the formula (73), the ring r being fused with adjacent ring(s) at any position(s);

a ring q and a ring s are each independently a ring represented by the formula (74) and fused with adjacent ring(s) at any position(s);

a ring p and a ring t are each independently a structure represented by the formula (75) or the formula (76) and fused with adjacent ring(s) at any position(s);

$X_7$ is an oxygen atom, a sulfur atom, or $NR_{702}$;

when a plurality of $R_{701}$ are present, adjacent ones of the plurality of $R_{701}$ are mutually bonded to form a substituted or unsubstituted monocyclic ring, mutually bonded to form a substituted or unsubstituted fused ring, or not mutually bonded;

$R_{701}$ forming neither the monocyclic ring nor the fused ring and $R_{702}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$Ar_{701}$ and $Ar_{702}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

$L_{701}$ is a substituted or unsubstituted alkylene group having 1 to 50 carbon atoms, a substituted or unsubstituted alkenylene group having 2 to 50 carbon atoms, a substituted or unsubstituted alkynylene group having 2 to 50 carbon atoms, a substituted or unsubstituted cycloalkylene group having 3 to 50 ring carbon atoms, a substituted or unsubstituted arylene group having 6 to 50 ring carbon atoms, or a substituted or unsubstituted divalent heterocyclic group having 5 to 50 ring atoms;

m1 is 0, 1, or 2;

m2 is 0, 1, 2, 3, or 4;

m3 are each independently 0, 1, 2, or 3;

m4 are each independently 0, 1, 2, 3, 4, or 5;

when a plurality of $R_{701}$ are present, the plurality of $R_{701}$ are mutually the same or different;

when a plurality of $X_7$ are present, the plurality of $X_7$ are mutually the same or different;

when a plurality of $R_{702}$ are present, the plurality of $R_{702}$ are mutually the same or different;

when a plurality of $Ar_{701}$ are present, the plurality of $Ar_{701}$ are mutually the same or different;

when a plurality of $Ar_{702}$ are present, the plurality of $Ar_{702}$ are mutually the same or different; and when a plurality of $L_{701}$ are present, the plurality of $L_{701}$ are mutually the same or different.

In the formula (7), each of the ring p, ring q, ring r, ring s, and ring t is fused with an adjacent ring(s) sharing two carbon atoms. The fused position and orientation are not limited but may be defined as required.

In an exemplary embodiment, in the formula (72) or the formula (73) representing the ring r, m1=0 or m2=0 is satisfied.

Compound Represented by Formula (8)

The compound represented by the formula (8) will be described below.

[Formula 70]

(8)

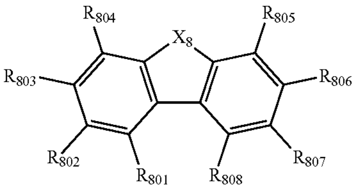

In the formula (8):

at least one combination of $R_{801}$ and $R_{802}$, $R_{802}$ and $R_{803}$, or $R_{803}$ and $R_{804}$ are mutually bonded to form a divalent group represented by a formula (82) below; and at least one combination of $R_{805}$ and $R_{806}$, $R_{806}$ and $R_{807}$, or $R_{807}$ and $R_{808}$ are mutually bonded to form a divalent group represented by a formula (83) below.

[Formula 71]

(82)

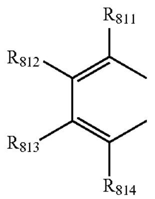

(83)

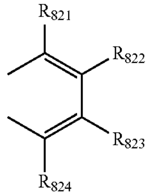

At least one of $R_{801}$ to $R_{804}$ not forming the divalent group represented by the formula (82) or $R_{811}$ to $R_{814}$ is a monovalent group represented by a formula (84) below;

at least one of $R_{805}$ to $R_{808}$ not forming the divalent group represented by the formula (83) or $R_{821}$ to $R_{824}$ is a monovalent group represented by the formula (84) below;

$X_8$ is an oxygen atom, a sulfur atom, or $NR_{809}$; and $R_{801}$ to $R_{808}$ not forming the divalent group represented by the formula (82) and (83) and not being the monovalent group represented by the formula (84), $R_{811}$ to $R_{814}$ and $R_{821}$ to $R_{824}$ not being the monovalent group represented by the formula (84), and $R_{809}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

[Formula 72]

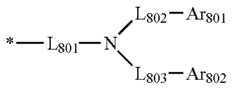

(84)

In the formula (84):

$Ar_{801}$ and $Ar_{802}$ are each independently a substituted or unsubstituted aryl group having 6 to 50 ring carbon atoms, or a substituted or unsubstituted heterocyclic group having 5 to 50 ring atoms;

$L_{801}$ to $L_{803}$ are each independently a single bond, a substituted or unsubstituted arylene group having 6 to 30 ring carbon atoms, a substituted or unsubstituted divalent heterocyclic group having 5 to 30 ring atoms, or a divalent linking group formed by bonding two, three or four groups selected from the group consisting of a substituted or unsubstituted arylene group having 6 to 30 ring carbon atoms and a substituted or unsubstituted divalent heterocyclic group having 5 to 30 ring atoms; and in the formula (84), * represents a bonding position to a cyclic structure represented by the formula (8) or a bonding position to a group represented by the formula (82) or (83).

In the formula (8), the positions for the divalent group represented by the formula (82) and the divalent group represented by the formula (83) to be formed are not specifically limited but the divalent groups may be formed at any possible positions on $R_{801}$ to $R_{808}$.

Compound Represented by Formula (9)

The compound represented by the formula (9) will be described below.

[Formula 73]

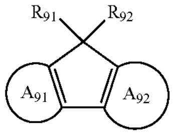

(9)

In the formula (9):

$A_{91}$ ring and $A_{92}$ ring are each independently a substituted or unsubstituted aromatic hydrocarbon ring having 6 to 50 ring carbon atoms, or a substituted or unsubstituted heterocycle having 5 to 50 ring atoms; and at least one of $A_{91}$ ring or $A_{92}$ ring is bonded with * in a structure represented by a formula (92) below.

[Formula 74]

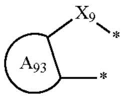

(92)

In the formula (92):

$A_{93}$ ring is a substituted or unsubstituted aromatic hydrocarbon ring having 6 to 50 ring carbon atoms, or a substituted or unsubstituted heterocycle having 5 to 50 ring atoms;

$X_9$ is $NR_{93}$, $C(R_{94})(R_{95})$, $Si(R_{96})(R_{97})$, $Ge(R_{98})(R_{99})$, an oxygen atom, a sulfur atom, or a selenium atom;

$R_{91}$ and $R_{92}$ are mutually bonded to form a substituted or unsubstituted monocyclic ring, mutually bonded to form a substituted or unsubstituted fused ring, or not mutually bonded; and $R_{91}$ and $R_{92}$ forming neither the monocyclic ring nor the fused ring, and $R_{93}$ to $R_{99}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms.

At least one of $A_{91}$ ring or $A_{92}$ ring is bonded to * in a structure represented by the formula (92). In other words, the ring-forming carbon atoms of the aromatic hydrocarbon ring or the ring atoms of the heterocycle of $A_{91}$ ring in an exemplary embodiment are bonded to * in a structure represented by the formula (92). Further, the ring-forming carbon atoms of the aromatic hydrocarbon ring or the ring atoms of the heterocycle of $A_{92}$ ring in an exemplary embodiment are bonded to * in a structure represented by the formula (92).

In an exemplary embodiment, a group represented by a formula (93) below is bonded to one or both of $A_{91}$ ring and $A_{92}$ ring.

[Formula 75]

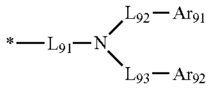

(93)

In the formula (93):

$Ar_{91}$ and $Ar_{92}$ are each independently a substituted or unsubstituted aryl group having 6 to 50 ring carbon atoms, or a substituted or unsubstituted heterocyclic group having 5 to 50 ring atoms;

$L_{91}$ to $L_{93}$ are each independently a single bond, a substituted or unsubstituted arylene group having 6 to 30 ring carbon atoms, a substituted or unsubstituted divalent heterocyclic group having 5 to 30 ring atoms, or a divalent linking group formed by bonding two, three or four groups selected from the group consisting of a substituted or unsubstituted arylene group having 6 to 30 ring carbon atoms and a substituted or unsubstituted divalent heterocyclic group having 5 to 30 ring atoms; and in the formula (93), * represents a bonding position to either $A_{91}$ ring or $A_{92}$ ring.

In an exemplary embodiment, in addition to $A_{91}$ ring, the ring-forming carbon atoms of the aromatic hydrocarbon ring or the ring atoms of the heterocycle of $A_{92}$ ring are bonded to * in a structure represented by the formula (92). In this case, the structures represented by the formula (92) may be mutually the same or different.

In an exemplary embodiment, $R_{91}$ and $R_{92}$ are each independently a substituted or unsubstituted aryl group having 6 to 50 ring carbon atoms.

In an exemplary embodiment, $R_{91}$ and $R_{92}$ are mutually bonded to form a fluorene structure.

In an exemplary embodiment, $A_{91}$ ring and $A_{92}$ ring are each independently a substituted or unsubstituted aromatic hydrocarbon ring having 6 to 50 ring carbon atoms, example of which is a substituted or unsubstituted benzene ring.

In an exemplary embodiment, $A_{93}$ ring is a substituted or unsubstituted aromatic hydrocarbon ring having 6 to 50 ring carbon atoms, example of which is a substituted or unsubstituted benzene ring.

In an exemplary embodiment, $X_9$ is an oxygen atom or a sulfur atom.

Compound Represented by Formula (10)

The compound represented by the formula (10) will be described below.

[Formula 76]

(10)

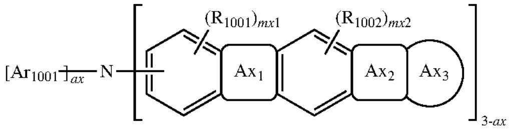

[Formula 77]

(10a)

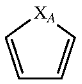

(10b)

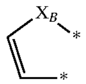

In the formula (10):

$Ax_1$ ring is a ring represented by the formula (10a) that is fused with adjacent ring(s) at any position(s);

$Ax_2$ ring is a ring represented by the formula (10b) that is fused with adjacent ring(s) at any position(s);

two * in the formula (10b) are bonded to $Ax_3$ ring at any position(s);

$X_A$ and $X_B$ are each independently $C(R_{1003})(R_{1004})$, $Si(R_{1005})(R_{1006})$, an oxygen atom or a sulfur atom;

$Ax_3$ ring is a substituted or unsubstituted aromatic hydrocarbon ring having 6 to 50 ring carbon atoms, or a substituted or unsubstituted heterocycle having 5 to 50 ring atoms;

$Ar_{1001}$ is a substituted or unsubstituted aryl group having 6 to 50 ring carbon atoms, or a substituted or unsubstituted heterocyclic group having 5 to 50 ring atoms;

$R_{1001}$ to $R_{1006}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms;

mx1 is 3, and mx2 is 2;

a plurality of $R_{1001}$ are mutually the same or different;

a plurality of $R_{1002}$ are mutually the same or different;

ax is 0, 1, or 2;

when ax is 0 or 1, the structures enclosed by brackets indicated by "3-ax" are mutually the same or different; and when ax is 2, a plurality of $Ar_{1001}$ are mutually the same or different.

In an exemplary embodiment, $Ar_{1001}$ is a substituted or unsubstituted aryl group having 6 to 50 ring carbon atoms.

In an exemplary embodiment, $Ax_3$ ring is a substituted or unsubstituted aromatic hydrocarbon ring having 6 to 50 ring carbon atoms, example of which is a substituted or unsubstituted benzene ring, a substituted or unsubstituted naphthalene ring, or a substituted or unsubstituted anthracene ring.

In an exemplary embodiment, $R_{1003}$ and $R_{1004}$ are each independently a substituted or unsubstituted alkyl group having 1 to 50 carbon atoms.

In an exemplary embodiment, ax is 1.

Third Exemplary Embodiment

Method of Producing Organic Electroluminescence Device

A method of producing an organic electroluminescence device according to a third exemplary embodiment (hereinafter also referred to as the producing method of the third exemplary embodiment) is a method of producing an organic electroluminescence device including an anode, a cathode, and a first emitting layer and a second emitting layer that are disposed between the anode and the cathode.

The method of producing the organic EL device according to the third exemplary embodiment includes: forming the first emitting layer containing a first host material and a first luminescent compound; and forming the second emitting layer containing a second host material and a second luminescent compound.

The first host material and the second host material are mutually different.

The first luminescent compound and the second luminescent compound are mutually the same or different.

The first host material and the second host material used in forming the first emitting layer and the second emitting layer, respectively, are selected from materials satisfying numerical formulae (Numerical Formula 1) and (Numerical Formula 6).

$$T_1(H1) > T_1(H2) \quad \text{(Numerical Formula 1)}$$

$$D_1 \geqq 3.0 \times 10^{-9}(\text{cm}^2/s) \quad \text{(Numerical Formula 6)}$$

In the numerical formula (Numerical Formula 1) and the numerical formula (Numerical Formula 6):

$T_1(H1)$ is a triplet energy of the first host material $T_1(H1)$, $T_1(H2)$ is a triplet energy of the second host material $T_1(H2)$, and $D_1$ is a diffusion coefficient of the triplet energy of the first host material $T_1(H1)$ calculated according to a diffusion equation.

In the producing method of the third exemplary embodiment, the diffusion coefficient $D_1$ of the triplet energy of the first host material $T_1(H1)$ is determined by: preparing a diffusion rate analysis layer including a first analysis layer and a second analysis layer that are layered, the first analysis layer containing the first host material and a first phosphorescent complex, the second analysis layer containing the first host material and a second phosphorescent complex; making an excitation light enter the first analysis layer to be transmitted from the second analysis layer to obtain a transmitted light; measuring a transient PL spectrum of the transmitted light; and calculating the diffusion coefficient $D_1$ based on the measured transient PL spectrum, a triplet energy of the first host material $T_1(H1)$ and a triplet energy of the first phosphorescent complex $T_1(C1)$ satisfy a numerical formula (Numerical Formula X) below, and the triplet energy of the first host material $T_1(H1)$ and a triplet energy of the second phosphorescent complex $T_1(C2)$ satisfy a numerical formula (Numerical Formula Y) below.

$$T_1(C1) > T_1(H1) \quad \text{(Numerical Formula X)}$$

$$T_1(H1) > T_1(C2) \quad \text{(Numerical Formula Y)}$$

In the producing method of the third exemplary embodiment, the first luminescent compound preferably has a maximum peak wavelength of 500 nm or less.

The first luminescent compound is preferably a fluorescent compound that emits fluorescence having a maximum peak wavelength of 500 nm or less.

In the producing method of the third exemplary embodiment, the second luminescent compound preferably has a maximum peak wavelength of 500 nm or less.

The second luminescent compound is preferably a fluorescent compound that emits fluorescence having a maximum peak wavelength of 500 nm or less.

A producing method of the third exemplary embodiment includes: forming the first emitting layer containing the first host material with the diffusion coefficient $D_1$ of the triplet energy $T_1(H1)$ being $3.0\times10^{-9}$ ($cm^2/s$) or more and the first luminescent compound; and forming the second emitting layer containing the second host material satisfying the numerical formula (Numerical Formula 1) and the second luminescent compound.

By the producing method of the third exemplary embodiment, for instance, the organic EL device described in the first exemplary embodiment is produced. Therefore, according to the producing method of the third exemplary embodiment, the organic EL device with improved luminous efficiency is produced.

The first host material, the first luminescent compound, the second host material, and the second luminescent compound that may be used in the producing method of the third exemplary embodiment and preferred ranges thereof are the same as the first host material, the first luminescent compound, the second host material, and the second luminescent compound and preferred ranges thereof described in the first exemplary embodiment.

The diffusion coefficient $D_1$ of the triplet energy of the first host material $T_1(H1)$ is calculated by the same method as that described in the first exemplary embodiment. Preferred ranges of the diffusion coefficient $D_1$ are also the same as those in the first exemplary embodiment.

The first phosphorescent complex contained in the first analysis layer and the second phosphorescent complex contained in the second analysis layer are preferably selected according to the triplet energy of the first host material $T_1(H1)$.

For instance, when $T_1(H1)\geq2.0$ eV is satisfied, the first phosphorescent complex is preferably $Ir(ppy)_3$ and the second phosphorescent complex is preferably $Ir(piq)_2(acac)$.

When 2.0 eV$>T_1(H1)\geq1.9$ eV is satisfied, $Ir(ppy)_3$ may be used as the first phosphorescent complex and PtOEP may be used as the second phosphorescent complex.

Forming First Emitting Layer and Forming Second Emitting Layer.

A method of forming the first emitting layer and the second emitting layer may be the method described in the section "Layer Formation Method(s)" of the first exemplary embodiment.

The forming the first emitting layer is preferably forming the first emitting layer by co-depositing the first host material and the first luminescent compound that emits light having a maximum peak wavelength of 500 nm or less.

The forming the second emitting layer is preferably forming the second emitting layer by co-depositing the second host material and the second luminescent compound that emits light having a maximum peak wavelength of 500 nm or less.

The producing method of the third exemplary embodiment may be a producing method that includes forming the first emitting layer between the anode and the cathode and forming the second emitting layer between the first emitting layer and the cathode, or a producing method that includes forming the second emitting layer between the anode and the cathode and forming the first emitting layer between the second emitting layer and the cathode.

The producing method of the third exemplary embodiment may include forming one or more additional organic layers and may include forming the third emitting layer described in the first exemplary embodiment.

Examples of the organic layers include at least one layer selected from the group consisting of a hole injecting layer, a hole transporting layer, an emitting layer, an electron injecting layer, an electron transporting layer, a hole blocking layer, and an electron blocking layer.

A method of forming those layers may be the method described in the section "Layer Formation Method(s)" of the first exemplary embodiment. Also in other than that described above in the producing method of the third exemplary embodiment, the arrangement described in the first exemplary embodiment may be used.

Fourth Exemplary Embodiment

Method of Producing Organic Electroluminescence Device

A method of producing an organic electroluminescence device according to a fourth exemplary embodiment (hereinafter also referred to as the producing method of the fourth exemplary embodiment) is a producing method of an organic electroluminescence device including an anode, a cathode, and a first emitting layer and a second emitting layer that are disposed between the anode and the cathode.

The producing method of the fourth exemplary embodiment includes: forming the first emitting layer containing a first host material and a first luminescent compound; and forming the second emitting layer containing a second host material and a second luminescent compound.

The first host material and the second host material are mutually different.

The first luminescent compound and the second luminescent compound are mutually the same or different.

The first host material and the second host material used in forming the first emitting layer and the second emitting layer, respectively, are selected from materials satisfying numerical formulae (Numerical Formula 1) and (Numerical Formula 10).

$$T_1(H1) > T_1(H2) \quad \text{(Numerical Formula 1)}$$

$$V_1 \leq -11 \text{ (mV/nm)} \quad \text{(Numerical Formula 10)}$$

In the numerical formula (Numerical Formula 1) and the numerical formula (Numerical Formula 10):

$T_1$(H1) is a triplet energy of the first host material $T_1$(H1);

$T_1$(H2) is a triplet energy of the second host material $T_1$(H2); and $V_1$ is a surface potential of the first host material.

In the producing method of the fourth exemplary embodiment, the first luminescent compound preferably has a maximum peak wavelength of 500 nm or less.

The first luminescent compound is preferably a fluorescent compound that emits fluorescence having a maximum peak wavelength of 500 nm or less.

In the producing method of the fourth exemplary embodiment, the second luminescent compound preferably has a maximum peak wavelength of 500 nm or less.

The second luminescent compound is preferably a fluorescent compound that emits fluorescence having a maximum peak wavelength of 500 nm or less.

The producing method of the fourth exemplary embodiment includes: forming the first emitting layer containing the first host material that has a surface potential $V_1$ of −11 (mV/nm) or less and satisfies the numerical formula (Numerical Formula 1) and the first luminescent compound; and forming the second emitting layer containing the second host material satisfying the numerical formula (Numerical Formula 1) and the second luminescent compound.

By the producing method of the fourth exemplary embodiment, for instance, the organic EL device described in the second exemplary embodiment is manufactured. Therefore, according to the producing method of the fourth exemplary embodiment, the organic EL device with improved luminous efficiency is manufactured.

The first host material, the first luminescent compound, the second host material, and the second luminescent compound that may be used in the producing method of the fourth exemplary embodiment and preferred ranges thereof are the same as the first host material, the first luminescent compound, the second host material, and the second luminescent compound and preferred ranges thereof described in the second exemplary embodiment.

The surface potential of the first host material $V_1$ is calculated by the same method as that described in the second exemplary embodiment. Preferred ranges of the surface potential of the first host material $V_1$ are also the same as those in the second exemplary embodiment.

Forming First Emitting Layer and Forming Second Emitting Layer.

A method of forming the first emitting layer and the second emitting layer may be the method described in the section "Layer Formation Method(s)" of the second exemplary embodiment.

The forming the first emitting layer is preferably forming the first emitting layer by co-depositing the first host material and the first luminescent compound (preferably, the first luminescent compound that emits light having a maximum peak wavelength of 500 nm or less).

The forming the second emitting layer is preferably forming the second emitting layer by co-depositing the second host material and the second luminescent compound (preferably, the second luminescent compounds that emits light having a maximum peak wavelength of 500 nm or less).

The producing method of the fourth exemplary embodiment may be a producing method that includes forming the first emitting layer between the anode and the cathode and forming the second emitting layer between the first emitting layer and the cathode, or a producing method that includes forming the second emitting layer between the anode and the cathode and forming the first emitting layer between the second emitting layer and the cathode.

The producing method of the fourth exemplary embodiment is preferably a producing method that includes forming the first emitting layer between the anode and the cathode and forming the second emitting layer between the first emitting layer and the cathode.

The producing method of the fourth exemplary embodiment may include forming one or more additional organic layers and may include forming the third emitting layer described in the second exemplary embodiment.

Examples of the organic layers include at least one layer selected from the group consisting of a hole injecting layer, a hole transporting layer, an emitting layer, an electron injecting layer, an electron transporting layer, a hole blocking layer, and an electron blocking layer.

A method of forming those layers may be the method described in the section "Layer Formation Method(s)" of the second exemplary embodiment. Also in other than that described above in the producing method of the fourth exemplary embodiment, the arrangement described in the second exemplary embodiment may be used.

Fifth Exemplary Embodiment

Electronic Device

An electronic device according to a fifth exemplary embodiment is installed with any one of the organic EL devices according to the above exemplary embodiments. Examples of the electronic device include a display device and a light-emitting unit. Examples of the display device include a display component (e.g., an organic EL panel module), TV, mobile phone, tablet and personal computer. Examples of the light-emitting unit include an illuminator and a vehicle light.

Modification of Embodiment(s)

The scope of the invention is not limited by the above-described exemplary embodiments but includes any modification and improvement as long as such modification and improvement are compatible with the invention.

For instance, the number of emitting layers is not limited to two, and more than two emitting layers may be layered. When the organic EL device includes more than two emitting layers, it is only necessary that at least two of the emitting layers should satisfy the requirements mentioned in the above exemplary embodiments. For instance, the rest of the emitting layers may be a fluorescent emitting layer or a phosphorescent emitting layer with use of emission caused by electron transfer from the triplet excited state directly to the ground state.

When the organic EL device includes a plurality of emitting layers, these emitting layers may be mutually adjacently provided, or may form a so-called tandem organic EL device, in which a plurality of emitting units are layered via an intermediate layer.

Further, for instance, a blocking layer is optionally provided adjacent to a side of the emitting layer close to the cathode. The blocking layer provided in direct contact with the side of the emitting layer close to the cathode preferably blocks at least one of holes or excitons.

For instance, when the blocking layer is provided in contact with the side of the emitting layer close to the cathode, the blocking layer permits transport of electrons, and blocks holes from reaching a layer provided closer to the cathode (e.g., the electron transporting layer) beyond the blocking layer. When the organic EL device includes the electron transporting layer, the blocking layer is preferably interposed between the emitting layer and the electron transporting layer.

Alternatively, the blocking layer may be provided adjacent to the emitting layer so that the excitation energy does not leak out from the emitting layer toward neighboring layer(s). The blocking layer blocks excitons generated in the emitting layer from being transferred to a layer(s) (e.g., the electron transporting layer and the hole transporting layer) closer to the electrode(s) beyond the blocking layer.

The emitting layer is preferably bonded with the blocking layer.

Specific structure, shape and the like of the components in the invention may be designed in any manner as long as an object of the invention can be achieved.

EXAMPLES

The invention will be described in further detail with reference to Examples. The scope of the invention is by no means limited to Examples.

Compounds

The first host material used to produce organic EL devices in Examples 1 to 5 is shown below.

[Formula 78]

BH1-A

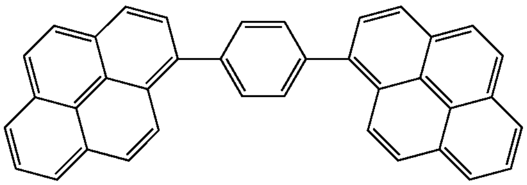

BH1-B

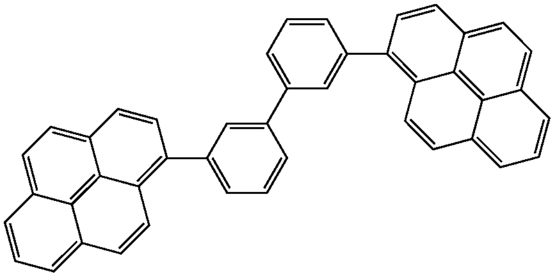

-continued

[Formula 79]

BH1-C

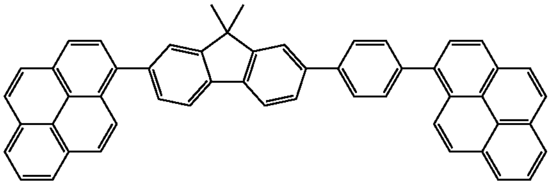

BH1-D

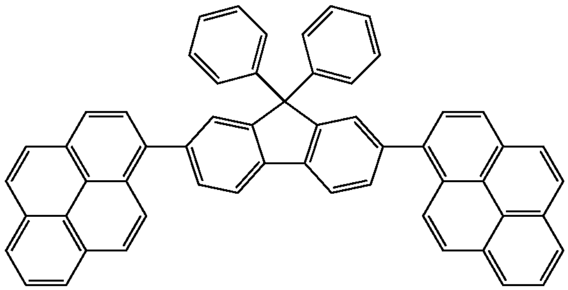

BH1-E

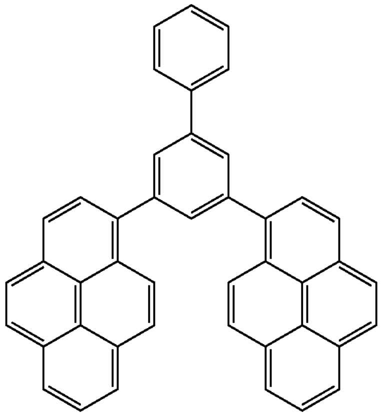

A comparative compound used to produce an organic EL device in Comparative Example 1 is shown below.

[Formula 80]

Ref-1

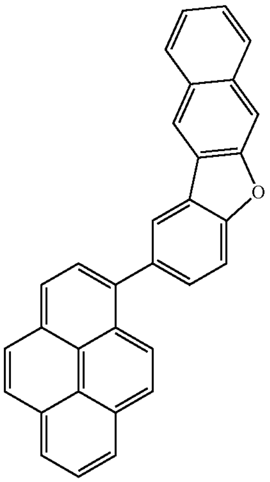

Structures of other compounds used to produce organic EL devices in Examples 1 to 5 and Comparative Example 1 are shown below.

[Formula 81]

HA1

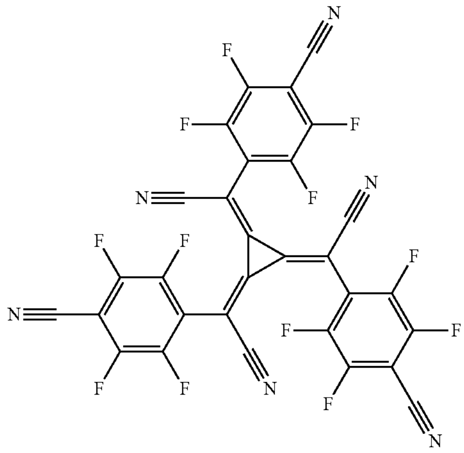

HT1

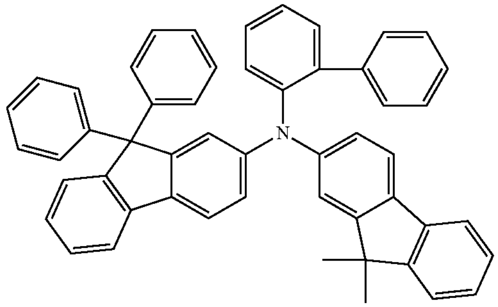

HT3

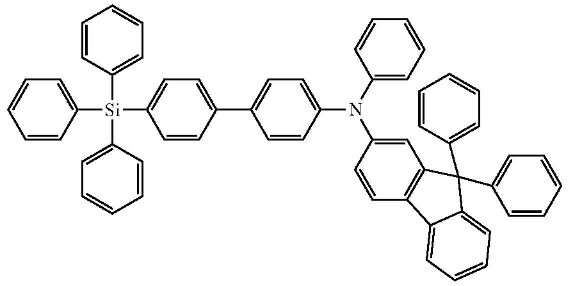

[Formula 82]

BH2

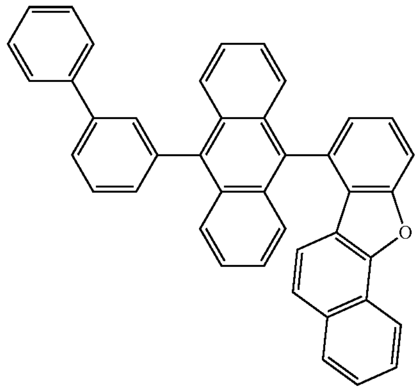

-continued

BD

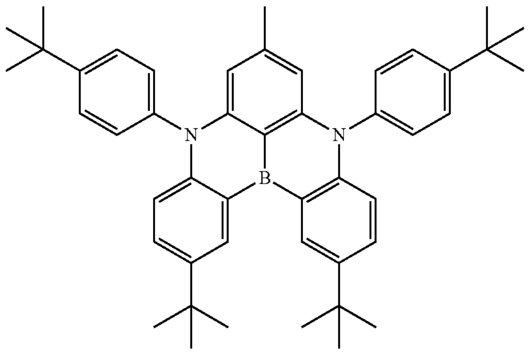

[Formula 83]

ET1

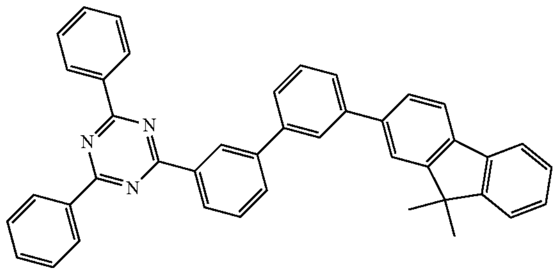

ET2

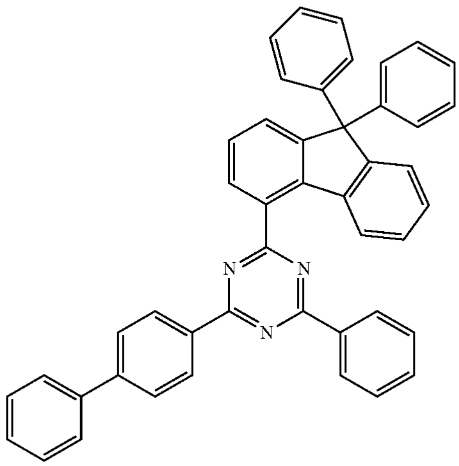

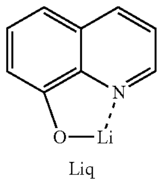

Liq

Production 1 of Organic EL Devices

Organic EL devices were produced and evaluated as follows.

Example 1

A glass substrate (size: 25 mm×75 mm×1.1 mm thick, produced by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. The film thickness of the ITO transparent electrode was 130 nm.

After the glass substrate having the transparent electrode line was cleaned, the glass substrate was mounted on a substrate holder of a vacuum deposition apparatus. Firstly, a compound HT1 and a compound HA1 were co-deposited on a surface of the glass substrate where the transparent electrode line was provided in a manner to cover the transparent electrode, thereby forming a 10-nm-thick hole injecting layer (HI). The ratios of the compound HT1 and the compound HA1 in the hole injecting layer were 90 mass % and 10 mass %, respectively.

After forming the hole injecting layer, a compound HT1 was vapor-deposited to form an 85-nm-thick first hole transporting layer (HT).

After forming the first hole transporting layer, a compound HT3 was vapor-deposited to form a 5-nm-thick second hole transporting layer (also referred to as an electron blocking layer) (EBL).

A compound BH1-A (first host material (BH)) and a compound BD (first luminescent compound (BD)) were co-deposited on the second hole transporting layer such that the ratio of the compound BD accounted for 2 mass %, thereby forming a 5-nm-thick first emitting layer.

A compound BH2 (second host material (BH)) and a compound BD (second luminescent compound (BD)) were co-deposited on the first emitting layer so that a ratio of the compound BD accounted for 2 mass %, thereby forming a 15-nm-thick second emitting layer.

A compound ET1 was vapor-deposited on the second emitting layer to form a 5-nm-thick first electron transporting layer (occasionally also referred to as a hole blocking layer (HBL)).

A compound ET2 and a compound Liq were co-deposited on the first electron transporting layer to form a 25-nm-thick second electron transporting layer (ET). The ratios of the compound ET2 and the compound Liq in the second electron transporting layer were 50 mass % and 50 mass %, respectively. Liq is an abbreviation of (8-quinolinolato) lithium ((8-Quinolinolato)lithium).

A compound Liq was vapor-deposited on the second electron transporting layer to form a 1-nm-thick electron injecting layer.

Metal Al was vapor-deposited on the electron injecting layer to form an 80-nm-thick cathode.

A device arrangement of the organic EL device in Example 1 is roughly shown as follows.

ITO(130)/HT1:HA1(10,90%:10%)/HT1(85)/HT3(5)/BH1-A:BD(5,98%:2%)/BH2:BD(15,98%:2%)/ET1(5)/ET2:Liq(25,50%:50%)/Liq(1)/Al(80)

Numerals in parentheses represent a film thickness (unit: nm).

The numerals (90%:10%) represented by percentage in the same parenthesis indicate ratios (mass %) of the compound HT1 and the compound HA1 in the hole injecting layer. The numerals (98%:2%) represented by percentage in the same parenthesis indicate ratios (mass %) of the host material (compound BH1-A or BH2) and the luminescent compound (compound BD) in the first emitting layer or the second emitting layer. The numerals (50%:50%) represented by percentage in the same parenthesis indicate ratios (mass %) of the compound ET2 and the compound Liq in the second electron transporting layer.

Examples 2 to 5 and Comparative Example 1

The organic EL devices in Examples 2 to 5 and Comparative Example 1 were each produced in the same manner as in Example 1 except that the compound BH1-A (first host material) in the first emitting layer in Example 1 was replaced by compounds indicated in Table 3.

Diffusion Coefficient $D_1$ of Triplet Energy of First Host Material $T_1(H1)$

The first host material of Example 1 was used to produce a transient PL data measurement sample including a diffusion rate analysis layer, the diffusion rate analysis layer being given by layering a first analysis layer and a second analysis layer, by the method described above. The transient PL data measurement sample was used to calculate a diffusion coefficient $D_1$ of the triplet energy of the first host material $T_1(H1)$. Table 3 shows the results.

The first phosphorescent complex used was $Ir(ppy)_3$ and the second phosphorescent complex used was $Ir(piq)_2(acac)$.

In the numerical formula (Numerical Formula 10B), the absorbance coefficient A of 1.0E5 and To=1.0E17 (/$cm^3$) were used.

In the numerical formula (Numerical Formula 101), $I(\tau)$ of $Ir(piq)_2(acac)$ was set to $I(\tau)=\exp(-\tau/\tau PH)$ and $\tau PH$=3.5E-7(s) was used.

The arrangement of the transient PL data measurement sample of Example 1 is roughly shown below.

Transmitted-light side/glass (0.7 mm)/BH1-A: $Ir(piq)_2(acac)$ (20 nm, 95%:5%)/BH1-A: $Ir(ppy)_3$ (100 nm, 80%:20%)/sealing glass (0.6 mm)/incident-light side Numerals in parentheses indicate film thickness. The numerals (95%:5%) represented by percentage in the same parentheses indicate the ratios (mass %) of the compound BH1-A and $Ir(piq)_2(acac)$. The numerals (80%:20%) represented by percentage in the same parentheses indicate the ratios (mass %) of the compound BH1-A and $Ir(ppy)_3$.

Transient PL data measurement samples in Examples 2 to 5 and Comparative Example 1 were each produced in the same manner as in Example 1 except that the compound BH1-A (first host material) used in Example 1 was replaced by compounds indicated in Table 3.

TABLE 3

| | First host material | Diffusion coefficient $D_1$ [$cm^2$/s] |
|---|---|---|
| Example 1 | BH1-A | 4.0E−08 |
| Example 2 | BH1-B | 5.0E−09 |
| Example 3 | BH1-C | 1.0E−08 |
| Example 4 | BH1-D | 2.0E−08 |
| Example 5 | BH1-E | 3.0E−08 |
| Comparative Example 1 | Ref-1 | 1.0E−09 |

Evaluation of Organic EL Devices

Figure 6:
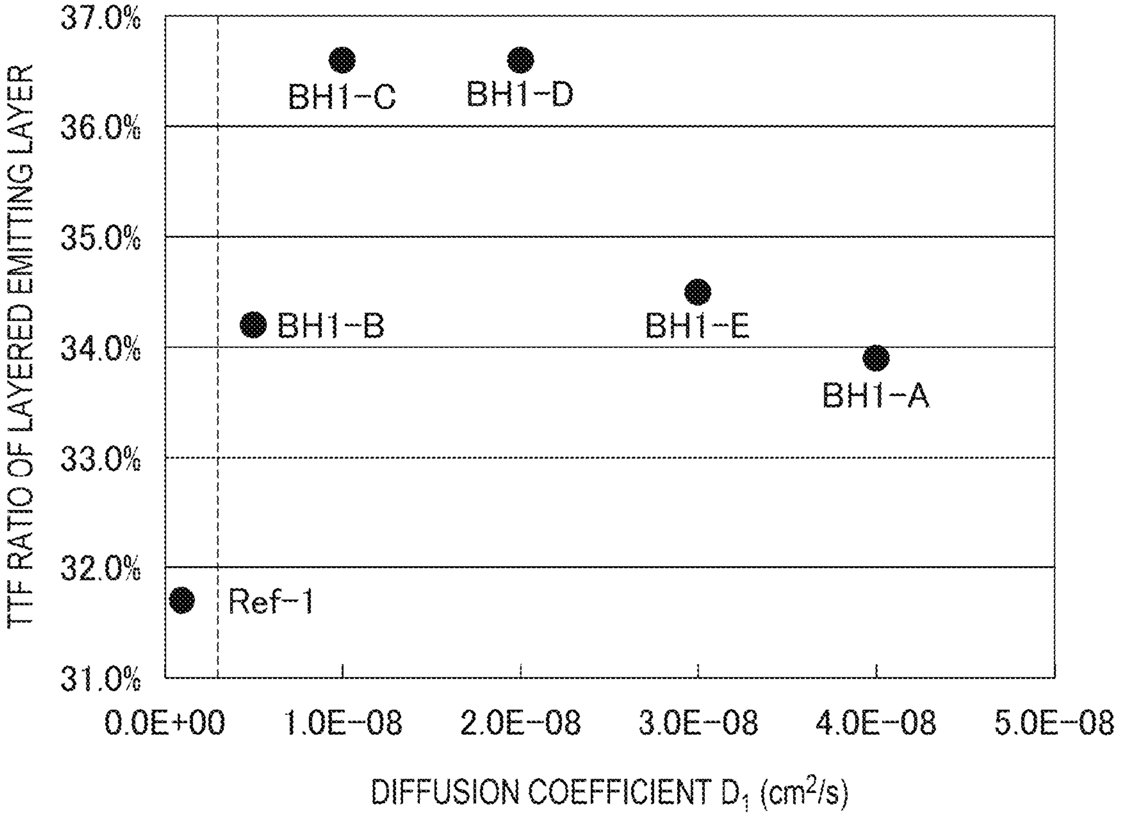
FIG. 6 is a diagram illustrating relationships between a diffusion coefficient $D_1$ of a triplet energy of a first host material $T_1$(H1) according to each of Examples and Comparative Examples and a TTF ratio of each of layered devices.

The produced organic EL devices were evaluated as follows. Table 4 and FIG. 6 show the results.

TTF Ratio

TTF ratio was measured by the method described above. The measurement conditions are specifically as follows.

The organic EL devices produced in Examples were each energized at room temperature (25 degrees C.), and pulse voltage was removed at the time of about $3\times10^{-8}$ seconds.

The voltage removal time was set as the origin and reciprocal numbers of the square root of luminous intensity before the elapse of $1.5\times10^{-5}$ seconds after the voltage removal were plotted to generate a diagram, from which TTF ratio was determined.

External Quantum Efficiency EQE

Voltage was applied to the organic EL devices such that a current density was 10 mA/$cm^2$, where spectral radiance spectrum was measured by a spectroradiometer CS-2000 (produced by Konica Minolta, Inc.). The external quantum efficiency EQE (unit: %) was calculated based on the obtained spectral radiance spectra, assuming that the spectra was provided under a Lambertian radiation.

TABLE 4

| | First emitting layer | | | | | | | | Film | Second emitting layer | | | | | | Evaluation of device | |
|---|---|---|---|---|---|---|---|---|---|---|---|---|---|---|---|---|---|
| | First host material | | | | First emitting compound | | | | thick- | Second host material | | | | Second emitting com- | Film thick- | | TTF ratio of layered |
| | Name | $S_1$ [eV] | $T_1$ [eV] | HOMO [eV] | Name | $S_1$ [eV] | $T_1$ [eV] | HOMO [eV] | ness [nm ] | Name | $S_1$ [eV] | $T_1$ [eV] | HOMO [eV] | pound Name | ness [nm] | EQE [%] | device [%] |
| Example 1 | BH1-A | 3.36 | 2.08 | −5.81 | BD | 2.71 | 2.64 | −5.49 | 5 | BH2 | 3.01 | 1.82 | −5.98 | BD | 15 | 9.4 | 33.9 |
| Example 2 | BH1-B | 3.34 | 2.10 | −5.94 | BD | 2.71 | 2.64 | −5.49 | 5 | BH2 | 3.01 | 1.82 | −5.98 | BD | 15 | 9.2 | 34.2 |
| Example 3 | BH1-C | 3.12 | 2.10 | −5.92 | BD | 2.71 | 2.64 | −5.49 | 5 | BH2 | 3.01 | 1.82 | −5.98 | BD | 15 | 10.7 | 36.6 |
| Example 4 | BH1-D | 3.09 | 2.10 | −5.95 | BD | 2.71 | 2.64 | −5.49 | 5 | BH2 | 3.01 | 1.82 | −5.98 | BD | 15 | 11.1 | 36.6 |
| Example 5 | BH1-E | 3.31 | 2.09 | −5.85 | BD | 2.71 | 2.64 | −5.49 | 5 | BH2 | 3.01 | 1.82 | −5.98 | BD | 15 | 10.1 | 34.5 |
| Comparative Example 1 | Ref-1 | 3.34 | 2.10 | −5.87 | BD | 2.71 | 2.64 | −5.49 | 5 | BH2 | 3.01 | 1.82 | −5.98 | BD | 15 | 9.1 | 31.7 |

As shown in Table 4 and FIG. 6, the organic EL devices of Examples 1 to 5, because of containing the first host material that satisfied the numerical formula (Numerical Formula 1) and had a diffusion coefficient $D_1$ of the triplet energy $T_1$(H1) being $3.0\times10^{-9}$ ($cm^2/s$) or more, had a higher TTF ratio and a higher external quantum efficiency EQE than the organic EL device of Comparative Example 1.

Compounds

First host materials used to produce organic EL devices in Examples 1A to 4A are shown below. A compound BH-A1 is the same as the compound BH1-E. A compound BH1-D1 is the same as the compound BH1-C.

[Formula 84]

BH1-A1

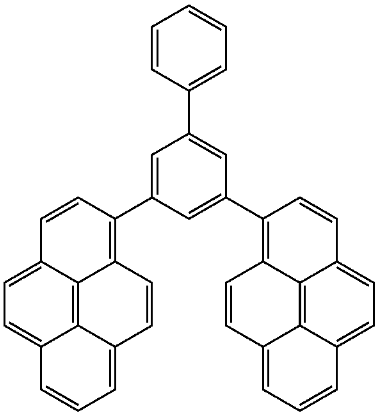

BH1-B1

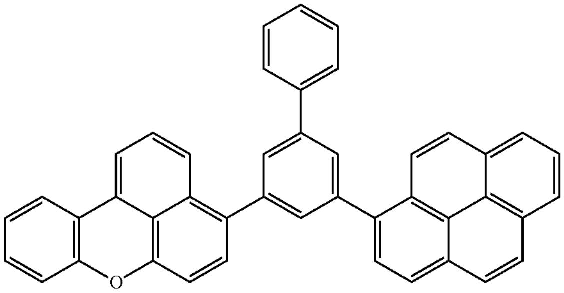

-continued

[Formula 85]

BH1-C1

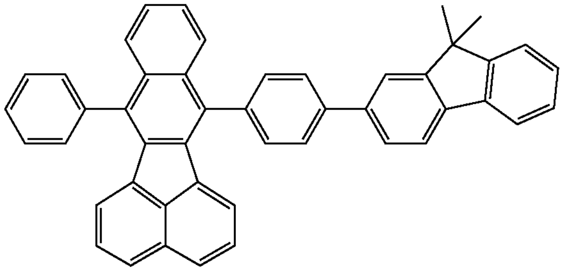

BH1-D1

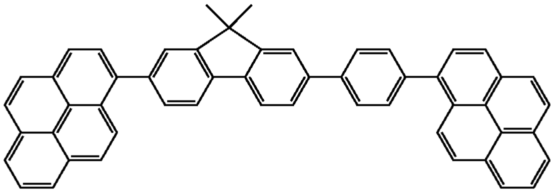

A structure of a comparative compound used to produce an organic EL device in Comparative Example 1A is shown below.

[Formula 86]

Ref-1

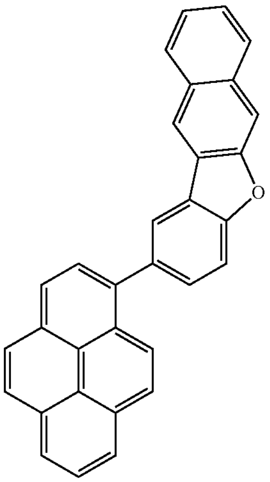

Structures of other compounds used to produce organic EL devices in Examples 1A to 4A and Comparative Example 1A are shown below.

[Formula 87]

HA1

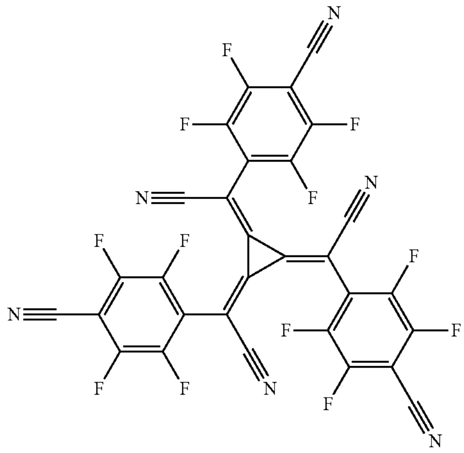

HT1

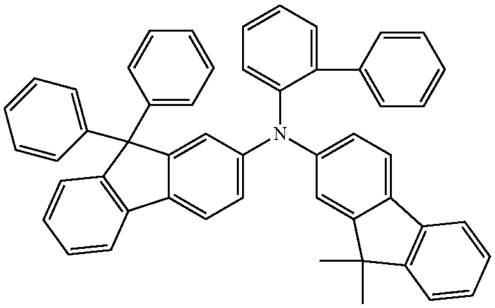

HT3

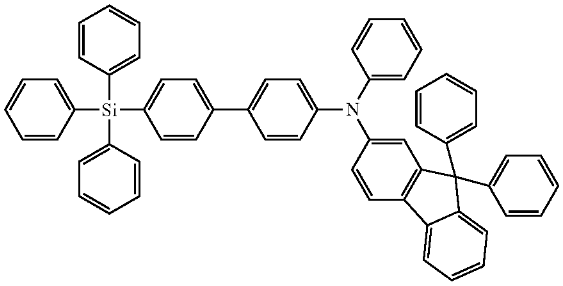

[Formula 88]

BH2

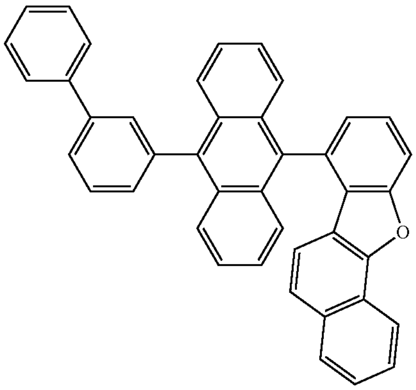

-continued

BD

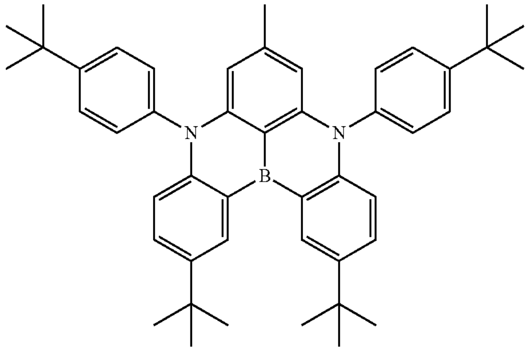

[Formula 89]

ET1

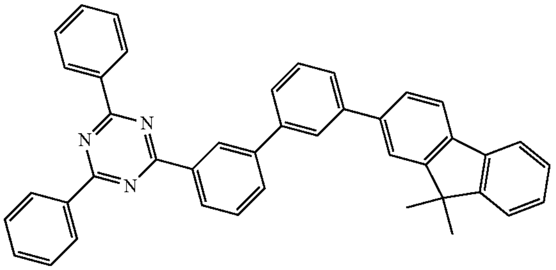

ET2

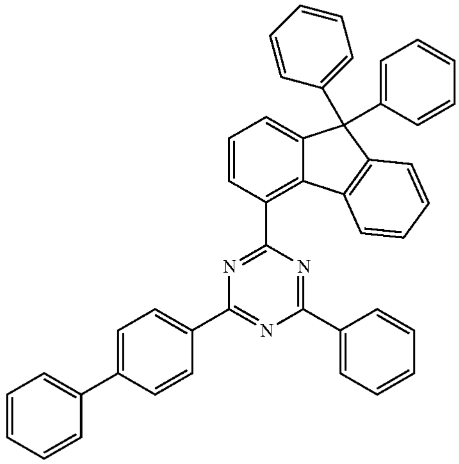

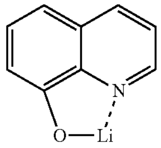

Liq

Production 2 of Organic EL Devices

Organic EL devices were produced and evaluated as follows.

Example 1A

A glass substrate (size: 25 mm×75 mm×1.1 mm thick, produced by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. The film thickness of the ITO transparent electrode was 130 nm.

After the glass substrate having the transparent electrode line was cleaned, the glass substrate was mounted on a substrate holder of a vacuum deposition apparatus. Firstly, a compound HT1 and a compound HA1 were co-deposited on a surface of the glass substrate where the transparent electrode line was provided in a manner to cover the transparent electrode, thereby forming a 10-nm-thick hole injecting layer (HI). The ratios of the compound HT1 and the compound HA1 in the hole injecting layer were 90 mass % and 10 mass %, respectively.

After forming the hole injecting layer, a compound HT1 was vapor-deposited to form an 85-nm-thick first hole transporting layer (HT).

After forming the first hole transporting layer, a compound HT3 was vapor-deposited to form a 5-nm-thick second hole transporting layer (also referred to as an electron blocking layer) (EBL).

A compound BH1-A1 (first host material (BH)) and a compound BD (first luminescent compound (BD)) were co-deposited on the second hole transporting layer such that the ratio of the compound BD accounted for 2 mass %, thereby forming a 5-nm-thick first emitting layer.

A compound BH2 (second host material (BH)) and a compound BD (second luminescent compound (BD)) were co-deposited on the first emitting layer so that a ratio of the compound BD accounted for 2 mass %, thereby forming a 15-nm-thick second emitting layer.

A compound ET1 was vapor-deposited on the second emitting layer to form a 5-nm-thick first electron transporting layer (occasionally also referred to as a hole blocking layer (HBL)).

A compound ET2 and a compound Liq were co-deposited on the first electron transporting layer to form a 25-nm-thick second electron transporting layer (ET). The ratios of the compound ET2 and the compound Liq in the second electron transporting layer were 50 mass % and 50 mass %, respectively. Liq is an abbreviation of (8-quinolinolato) lithium ((8-Quinolinolato)lithium).

A compound Liq was vapor-deposited on the second electron transporting layer to form a 1-nm-thick electron injecting layer.

Metal Al was vapor-deposited on the electron injecting layer to form an 80-nm-thick cathode.

A device arrangement of the organic EL device in Example 1A is roughly shown as follows.

ITO(130)/HT1:HA1(10,90%:10%)/HT1(85)/HT3(5)/BH1-A1:BD(5,98%:2%)/BH2:BD(15,98%:2%)/ET1(5)/ET2:Liq(25,50%:50%)/Liq(1)/Al(80)

Numerals in parentheses represent film thickness (unit: nm).

The numerals (90%:10%) represented by percentage in the same parenthesis indicate ratios (mass %) of the compound HT1 and the compound HA1 in the hole injecting layer. The numerals (98%:2%) represented by percentage in the same parenthesis indicate ratios (mass %) of the host material (compound BH1-A1 or BH2) and the luminescent compound (compound BD) in the first emitting layer or the second emitting layer. The numerals (50%:50%) represented by percentage in the same parenthesis indicate ratios (mass %) of the compound ET2 and the compound Liq in the second electron transporting layer.

Examples 2A to 4A and Comparative Example 1A

Organic EL devices in Examples 2A to 4A and Comparative Example 1A were each produced in the same manner as in Example 1A except that the compound BH1-A1 (first host material) in the first emitting layer in Example 1A was replaced by a compound indicated in Table 5.

Surface Potential of First Host Material $V_1$

The first host material of Example 1A (compound BH1-A1) was used to produce surface potential measurement samples 1 and 2 by the method described above.

The arrangements of the surface potential measurement samples 1 and 2 of Example 1A are roughly shown below.

Sample 1: glass substrate (0.7 mm)/ITO (130 nm)/compound BH1-A1 (20 nm)

Sample 2: glass substrate (0.7 mm)/ITO (130 nm)/compound BH1-A1 (60 nm)

Numerals in parentheses indicate film thickness.

Using the produced samples 1 and 2, a work function W(d1) (mV) of the first host material layer of the sample 1 and a work function W(d2) (mV) of the first host material layer of the sample 2 were measured by the method described above (method following the procedures for UHVKP020 produced by KP Technology Ltd) to obtain values of the W(d1) and W(d2).

A surface potential of the first host material (compound BH1-A1) $V_1$ (mV/nm) in Example 1A was calculated by using the numerical formula (Numerical Formula 100). Table 5 shows the results.

The measurement conditions are as follows.

Conditions: Equipment: UHVKP020 manufactured by KP Technology Ltd.

Measurement area: 10 mm in diameter

Surface potential measurement samples 1 and 2 of Examples 2A to 4A and Comparative Example 1A were each produced by the same method as in Example 1A except that the compound BH1-A1 (first host material) used in Example 1A was replaced by compounds indicated in Table 5. The produced surface potential measurement samples 1 and 2 were used to calculate surface potentials of the first host materials $V_1$ (mV/nm) of Examples 2A to 4A and Comparative Example 1A in the same manner as in Example 1A. Table 5 shows the results.

TABLE 5

| | First host material | Surface potential $V_1$ [mV/nm] |
|---|---|---|
| Example 1A | BH1-A1 | −12 |
| Example 2A | BH1-B1 | −15 |
| Example 3A | BH1-C1 | −16 |
| Example 4A | BH1-D1 | −25 |
| Comparative Example 1A | Ref-1 | −10 |

Evaluation of Organic EL Devices

Figure 9:
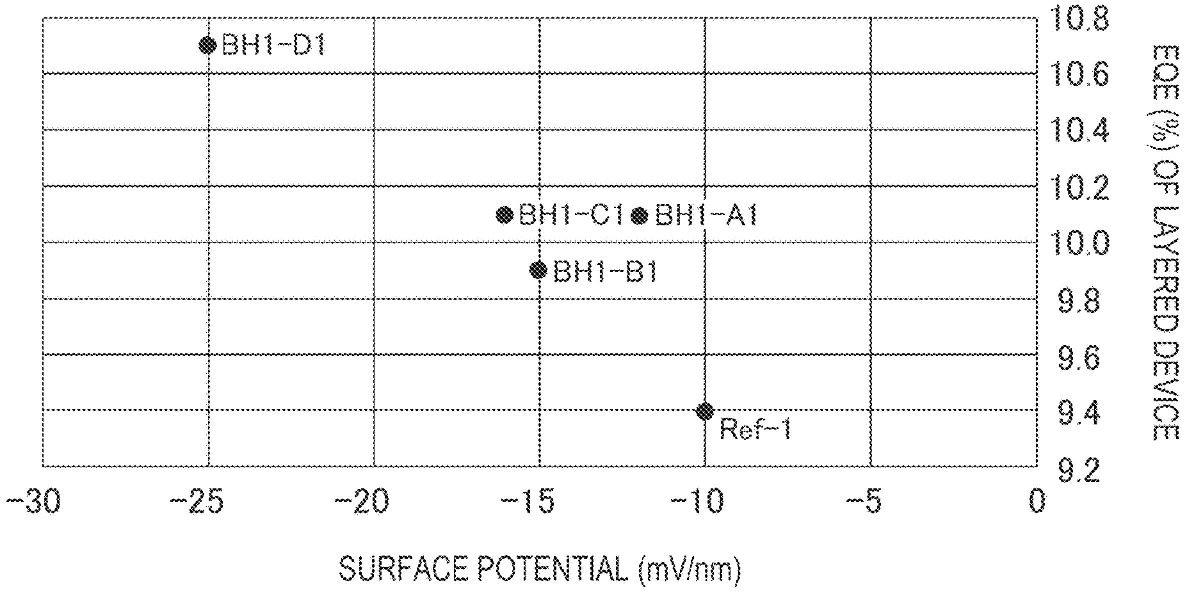
FIG. 9 is a diagram illustrating relationships between a surface potential of a first host material $V_1$ and EQE of each layered device in Examples and Comparative Examples.

The produced organic EL devices were evaluated as follows. Table 6 and FIG. 9 show the results.

External Quantum Efficiency EQE

Voltage was applied to the organic EL devices such that a current density was 10 mA/cm$^2$, where spectral radiance spectrum was measured by a spectroradiometer CS-2000 (produced by Konica Minolta, Inc.). The external quantum efficiency EQE (unit: %) was calculated based on the obtained spectral radiance spectra, assuming that the spectra was provided under a Lambertian radiation.

TABLE 6

| | First emitting layer | | | | | | | | Film | Second emitting layer | | | | | | Eval-uation of |
|---|---|---|---|---|---|---|---|---|---|---|---|---|---|---|---|---|
| | First host material | | | | First emitting compound | | | | thick- | Second host material | | | | Second emitting com- | Film thick- | device |
| | Name | $S_1$ [eV] | $T_1$ [eV] | HOMO [eV] | Name | $S_1$ [eV | $T_1$ [eV] | HOMO [eV] | ness [nm] | Name | $S_1$ [eV] | $T_1$ [eV] | HOMO [eV] | pound Name | ness [nm] | EQE [%] |
| Example 1A | BH1-A1 | 3.31 | 2.09 | −5.85 | BD | 2.71 | 2.64 | −5.49 | 5 | BH2 | 3.01 | 1.82 | −5.98 | BD | 15 | 10.1 |
| Example 2A | BH1-B1 | 3.15 | 2.09 | −5.70 | BD | 2.71 | 2.64 | −5.49 | 5 | BH2 | 3.01 | 1.82 | −5.98 | BD | 15 | 9.9 |
| Example 3A | BH1-C1 | 2.94 | 2.20 | −6.07 | BD | 2.71 | 2.64 | −5.49 | 5 | BH2 | 3.01 | 1.82 | −5.98 | BD | 15 | 10.1 |
| Example 4A | BH1-D1 | 3.12 | 2.10 | −5.92 | BD | 2.71 | 2.64 | −5.49 | 5 | BH2 | 3.01 | 1.82 | −5.98 | BD | 15 | 10.7 |
| Comparative Example1A | Ref-1 | 3.34 | 2.10 | −5.87 | BD | 2.71 | 2.64 | −5.49 | 5 | BH2 | 3.01 | 1.82 | −5.98 | BD | 15 | 9.4 |

As shown in Table 6 and FIG. 9, the organic EL devices of Examples 1A to 4A, because of containing the first host material that satisfied the numerical formula (Numerical Formula 1) and had a surface potential $V_1$ of −11 (mV/nm) or less, showed a higher external quantum efficiency EQE than the organic EL device of Comparative Example 1A.

Evaluation Method of Compounds

The compounds in Tables 3 to 6 were evaluated as follows.

Triplet Energy $T_1$

A measurement target compound was dissolved in EPA (diethylether:isopentane:ethanol=5:5:2 in volume ratio) at a concentration of 10 μmol/L, and the obtained solution was put in a quartz cell to provide a measurement sample. A phosphorescence spectrum (ordinate axis: phosphorescent luminous intensity, abscissa axis: wavelength) of the measurement sample was measured at a low temperature (77K). A tangent was drawn to the rise of the phosphorescence spectrum close to the short-wavelength region. An energy amount was calculated by a conversion equation (F1) below on a basis of a wavelength value $\lambda_{edge}$ [nm] at an intersection of the tangent and the abscissa axis. The calculated energy amount was defined as triplet energy $T_1$. It should be noted that the triplet energy $T_1$ may have an error of about plus or minus 0.02 eV depending on measurement conditions.

$$T_1\,[\text{eV}] = 1239.85/\lambda_{edge} \qquad \text{Conversion Equation (F1)}$$

The tangent to the rise of the phosphorescence spectrum close to the short-wavelength region is drawn as follows. While moving on a curve of the phosphorescence spectrum from the short-wavelength region to the local maximum value closest to the short-wavelength region among the local maximum values of the phosphorescence spectrum, a tangent is checked at each point on the curve toward the long-wavelength of the phosphorescence spectrum. An inclination of the tangent is increased along the rise of the curve (i.e., a value of the ordinate axis is increased). A tangent drawn at a point of the local maximum inclination (i.e., a tangent at an inflection point) is defined as the tangent to the rise of the phosphorescence spectrum close to the short-wavelength region.

A local maximum point where a peak intensity is 15% or less of the maximum peak intensity of the spectrum is not counted as the above-mentioned local maximum peak intensity closest to the short-wavelength region. The tangent drawn at a point that is closest to the local maximum peak intensity closest to the short-wavelength region and where the inclination of the curve is the local maximum is defined as a tangent to the rise of the phosphorescence spectrum close to the short-wavelength region.

For phosphorescence measurement, a spectrophotofluorometer body F-4500 produced by Hitachi High-Technologies Corporation was used.

Singlet Energy $S_1$

A toluene solution of a measurement target compound at a concentration of 10 μmol/L was prepared and put in a quartz cell. An absorption spectrum (ordinate axis: absorption intensity, abscissa axis: wavelength) of the thus-obtained sample was measured at a normal temperature (300K). A tangent was drawn to the fall of the absorption spectrum close to the long-wavelength region, and a wavelength value $\lambda_{edge}$ (nm) at an intersection of the tangent and the abscissa axis was assigned to a conversion equation (F2) below to calculate singlet energy.

$$S_1\,[\text{eV}] = 1239.85/\lambda_{edge} \qquad \text{Conversion Equation (F2)}$$

A spectrophotometer (U3310 produced by Hitachi, Ltd.) was used for measuring absorption spectrum.

The tangent to the fall of the absorption spectrum close to the long-wavelength region is drawn as follows. While moving on a curve of the absorption spectrum from the local maximum value closest to the long-wavelength region, among the local maximum values of the absorption spectrum, in a long-wavelength direction, a tangent at each point on the curve is checked. An inclination of the tangent is decreased and increased in a repeated manner as the curve falls (i.e., a value of the ordinate axis is decreased). A tangent drawn at a point where the inclination of the curve is the local minimum closest to the long-wavelength region (except when absorbance is 0.1 or less) is defined as the tangent to the fall of the absorption spectrum close to the long-wavelength region.

The local maximum absorbance of 0.2 or less is not counted as the above-mentioned local maximum absorbance closest to the long-wavelength region.

Energy Level of Highest Occupied Molecular Orbital HOMO

An energy level of a highest occupied molecular orbital HOMO was measured under atmosphere using a photoelectron spectroscope ("AC-3" produced by RIKEN KEIKI Co., Ltd.). Specifically, the material was irradiated with light and the amount of electrons generated by charge separation was measured to measure the energy level of the highest occupied molecular orbital HOMO of the compound.

Measurement of Maximum Fluorescence Peak Wavelength (FL-peak)

The compound BD was dissolved in toluene at a concentration of $4.9\times10^{-6}$ mol/L to prepare a toluene solution of the compound BD. Using a fluorescence spectrometer (spectrophotofluorometer F-7000 produced by Hitachi High-Tech Science Corporation), the toluene solution of the compound BD was excited at 390 nm, where a maximum fluorescence peak wavelength was measured.

The maximum fluorescence peak wavelength of the compound BD was 455 nm.

Van Der Waals Radius of Compound

The "van der Waals radius of the compound" was calculated by the method described above.

The van der Waals radius of the compound BH1-A was calculated to be 1.08 nm. The van der Waals radius of the compound BH1-B was calculated to be 1.27 nm. The van der Waals radius of the compound BH1-C was calculated to be 1.50 nm. The van der Waals radius of the compound BH1-D was calculated to be 1.24 nm. The van der Waals radius of the compound BH1-E was calculated to be 1.09 nm. The van der Waals radius of the compound Ref-1 was calculated to be 1.08 nm. The van der Waals radius of the compound BH1-A1 was calculated to be 1.09 nm. The van der Waals radius of the compound BH1-B1 was calculated to be 1.18 nm. The van der Waals radius of the compound BH1-C1 was calculated to be 1.30 nm. The van der Waals radius of the compound BH1-D1 was calculated to be 1.50 nm.

The invention claimed is:

1. An organic electroluminescence device comprising:
an anode;
a cathode; and
an emitting layer disposed between the anode and the cathode, wherein
the emitting layer comprises a first emitting layer and a second emitting layer,
the first emitting layer comprises a first host material and a first luminescent compound,
the second emitting layer comprises a second host material and a second luminescent compound,
the first host material and the second host material are mutually different,
the first luminescent compound and the second luminescent compound are mutually the same or different,
a triplet energy of the first host material $T_1$(H1) and a triplet energy of the second host material $T_1$(H2) satisfy a relationship of a numerical formula (Numerical Formula 1) below, and
a diffusion coefficient $D_1$ of the triplet energy of the first host material $T_1$(H1) calculated according to a diffusion equation is $3.0\times10^{-9}$ ($cm^2$/s) or more, $$T_1(H1) > T_1(H2). \quad \text{(Numerical Formula 1)}$$

2. The organic electroluminescence device according to claim 1, wherein
the diffusion coefficient $D_1$ of the triplet energy of the first host material $T_1$(H1) is determined by: preparing a diffusion rate analysis layer comprising a first analysis layer and a second analysis layer that are layered, the first analysis layer comprising the first host material and a first phosphorescent complex, the second analysis layer comprising the first host material and a second phosphorescent complex; making an excitation light enter the first analysis layer to be transmitted from the second analysis layer to obtain a transmitted light; measuring a transient PL spectrum of the transmitted light; and calculating the diffusion coefficient $D_1$ based on the measured transient PL spectrum according to a diffusion equation,
the triplet energy of the first host material $T_1$(H1) and a triplet energy of the first phosphorescent complex $T_1$(C1) satisfy a numerical formula (Numerical Formula X) below, and
the triplet energy of the first host material $T_1$(H1) and a triplet energy of the second phosphorescent complex $T_1$(C2) satisfy a numerical formula (Numerical Formula Y) below, $$T_1(C1) > T_1(H1), \quad \text{(Numerical Formula X)}$$

$$T_1(H1) > T_1(C2). \quad \text{(Numerical Formula Y)}$$

3. The organic electroluminescence device according to claim 2, wherein
the first phosphorescent complex is $Ir(ppy)_3$, and
the second phosphorescent complex is $Ir(piq)_2(acac)$.

4. The organic electroluminescence device according to claim 1, wherein the first luminescent compound has a maximum peak wavelength of 500 nm or less.

5. The organic electroluminescence device according to claim 1, wherein the second luminescent compound has a maximum peak wavelength of 500 nm or less.

6. The organic electroluminescence device according to claim 1, wherein an absolute value of an energy level of a highest occupied molecular orbital of the first host material HOMO(H1) and an absolute value of an energy level of a highest occupied molecular orbital of the first luminescent compound HOMO(D1) satisfy a relationship of a numerical formula (Numerical Formula 2) below, $$|HOMO(H1)| - |HOMO(D1)| \geq 0.2 \text{ eV}. \quad \text{(Numerical Formula 2)}$$

7. The organic electroluminescence device according to claim 1, wherein a triplet energy of the first luminescent compound $T_1$(D1) and the triplet energy of the second host material $T_1$(H2) satisfy a relationship of a numerical formula (Numerical Formula 3) below, $$T_1(D1) > T_1(H2). \quad \text{(Numerical Formula 3)}$$

8. The organic electroluminescence device according to claim 1, wherein an electron mobility of the second host material μe(H2) and an electron mobility of the first host material μe(H1) satisfy a numerical formula (Numerical Formula 4) below, $$\mu e(H2) > \mu e(H1). \quad \text{(Numerical Formula 4)}$$

9. The organic electroluminescence device according to claim 1, wherein a singlet energy of the first host material $S_1$(H1) and a singlet energy of the second host material $S_1$(H2) satisfy a relationship of a numerical formula (Numerical Formula 5) below, $$S_1(H1) > S_1(H2). \quad \text{(Numerical Formula 5)}$$

10. The organic electroluminescence device according to claim 1, wherein a van der Waals radius of the first host material calculated by molecular orbital calculation is 1.08 nm or more.

11. The organic electroluminescence device according to claim 1, wherein a film thickness of the first emitting layer is in a range from 2 nm to 20 nm.

12. An electronic device comprising the organic electroluminescence device according to claim 1.

13. An organic electroluminescence device comprising:

an anode;

a cathode; and an emitting layer disposed between the anode and the cathode, wherein the emitting layer comprises a first emitting layer and a second emitting layer, the first emitting layer comprises a first host material and a first luminescent compound, the second emitting layer comprises a second host material and a second luminescent compound, the first host material and the second host material are mutually different, the first luminescent compound and the second luminescent compound are mutually the same or different, a triplet energy of the first host material $T_1$(H1) and a triplet energy of the second host material $T_1$(H2) satisfy a relationship of a numerical formula (Numerical Formula 1) below, and the first host material has a surface potential $V_1$ of −11 (mV/nm) or less, $$T_1(H1) > T_1(H2). \quad \text{(Numerical Formula 1)}$$

14. The organic electroluminescence device according to claim 13, wherein the first emitting layer is disposed between the anode and the cathode, and the second emitting layer is disposed between the first emitting layer and the cathode.

15. The organic electroluminescence device according to claim 13, wherein the first luminescent compound has a maximum peak wavelength of 500 nm or less.

16. The organic electroluminescence device according to claim 13, wherein the second luminescent compound has a maximum peak wavelength of 500 nm or less.

17. The organic electroluminescence device according to claim 13, wherein an absolute value of an energy level of a highest occupied molecular orbital of the first host material HOMO(H1) and an absolute value of an energy level of a highest occupied molecular orbital of the first luminescent compound HOMO(D1) satisfy a relationship of a numerical formula (Numerical Formula 2) below, $$|HOMO(H1)| - |HOMO(D1)| \geq 0.2\ \text{eV}. \quad \text{(Numerical Formula 2)}$$

18. The organic electroluminescence device according to claim 13, wherein a triplet energy of the first luminescent compound $T_1$(D1) and the triplet energy of the second host material $T_1$(H2) satisfy a relationship of a numerical formula (Numerical Formula 3) below, $$T_1(D1) > T_1(H2). \quad \text{(Numerical Formula 3)}$$

19. The organic electroluminescence device according to claim 13, wherein an electron mobility of the second host material μe(H2) and an electron mobility of the first host material μe(H1) satisfy a numerical formula (Numerical Formula 4) below, $$\mu e(H2) > \mu e(H1). \quad \text{(Numerical Formula 4)}$$

20. The organic electroluminescence device according to claim 13, wherein a singlet energy of the first host material $S_1$(H1) and a singlet energy of the second host material $S_1$(H2) satisfy a relationship of a numerical formula (Numerical Formula 5) below, $$S_1(H1) > S_1(H2). \quad \text{(Numerical Formula 5)}$$

21. The organic electroluminescence device according to claim 13, wherein a van der Waals radius of the first host material calculated by molecular orbital calculation is 1.08 nm or more.

22. The organic electroluminescence device according to claim 13, wherein a film thickness of the first emitting layer is in a range from 2 nm to 20 nm.

23. An electronic device comprising the organic electroluminescence device according to claim 13.

24. A method of producing an organic electroluminescence device comprising an anode, a cathode, and a first emitting layer and a second emitting layer that are disposed between the anode and the cathode, the method comprising:

forming the first emitting layer comprising a first host material and a first luminescent compound; and forming the second emitting layer comprising a second host material and a second luminescent compound, wherein the first host material and the second host material are mutually different, the first luminescent compound and the second luminescent compound are mutually the same or different, the first host material and the second host material used in forming the first emitting layer and the second emitting layer are selected from materials satisfying numerical formulae (Numerical Formula 1) and (Numerical Formula 6) below, $$T_1(H1) > T_1(H2), \quad \text{(Numerical Formula 1)}$$

$$D_1 \geq 3.0 \times 10^{-9} (\text{cm}^2/\text{s}), \quad \text{(Numerical Formula 6)}$$

where: $T_1$(H1) is a triplet energy of the first host material $T_1$(H1);

$T_1$(H2) is a triplet energy of the second host material $T_1$(H2); and $D_1$ is a diffusion coefficient of the triplet energy of the first host material $T_1(H1)$ calculated according to a diffusion equation.

25. The method of producing an organic electroluminescence device according to claim 24, wherein the first luminescent compound has a maximum peak wavelength of 500 nm or less.

26. The method of producing an organic electroluminescence device according to claim 24, wherein the second luminescent compound has a maximum peak wavelength of 500 nm or less.

27. A method of producing an organic electroluminescence device comprising an anode, a cathode, and a first emitting layer and a second emitting layer that are disposed between the anode and the cathode, the method comprising:

forming the first emitting layer comprising a first host material and a first luminescent compound; and forming the second emitting layer comprising a second host material and a second luminescent compound, wherein the first host material and the second host material are mutually different, the first luminescent compound and the second luminescent compound are mutually the same or different, and the first host material and the second host material used in forming the first emitting layer and the second emitting layer are selected from materials satisfying numerical formulae (Numerical Formula 1) and (Numerical Formula 10) below, $$T_1(H1) > T_1(H2), \quad \text{(Numerical Formula 1)}$$

$$V_1 \leq -11(\text{mV/nm}), \quad \text{(Numerical Formula 10)}$$

where: $T_1(H1)$ is a triplet energy of the first host material $T_1(H1)$;

$T_1(H2)$ is a triplet energy of the second host material $T_1(H2)$; and $V_1$ is a surface potential of the first host material.

* * * * *